United States Patent
Diao et al.

(10) Patent No.: US 11,968,862 B2
(45) Date of Patent: Apr. 23, 2024

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yongfu Diao, Beijing (CN); Chenyu Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 674 days.

(21) Appl. No.: 17/255,979

(22) PCT Filed: Nov. 27, 2020

(86) PCT No.: PCT/CN2020/132389
§ 371 (c)(1),
(2) Date: Dec. 23, 2020

(87) PCT Pub. No.: WO2021/104481
PCT Pub. Date: Jun. 3, 2021

(65) Prior Publication Data
US 2021/0366393 A1    Nov. 25, 2021

(30) Foreign Application Priority Data

Nov. 29, 2019  (WO) ................ PCT/CN2019/121948

(51) Int. Cl.
*H10K 59/131*    (2023.01)
*G09G 3/3233*    (2016.01)
(Continued)

(52) U.S. Cl.
CPC ......... *H10K 59/131* (2023.02); *G09G 3/3233* (2013.01); *H10K 59/1213* (2023.02);
(Continued)

(58) Field of Classification Search
None
See application file for complete search history.

(56) References Cited

U.S. PATENT DOCUMENTS

| 5,953,088 A | 9/1999 | Hanazawa et al. |
| 2010/0155715 A1 | 6/2010 | Yun et al. |

(Continued)

FOREIGN PATENT DOCUMENTS

| CN | 105321957 A | 2/2016 |
| CN | 106847170 A | 6/2017 |

(Continued)

OTHER PUBLICATIONS

Intellectual Property India, Examination Report Issued in Application No. 202147052241, dated Jul. 6, 2022, 5 pages.

(Continued)

*Primary Examiner* — Jay C Chang
(74) *Attorney, Agent, or Firm* — McCoy Russell LLP

(57) ABSTRACT

A display substrate and a display device are provided. The display substrate includes a base and subpixels. The subpixel includes: a data line pattern; a power source signal line pattern including a portion extending in the first direction; and a subpixel driving circuitry. The subpixel driving circuitry includes two switching transistors, a driving transistor, and a storage capacitor. First and second electrode plates of the storage capacitor are coupled to a gate electrode of the driving transistor and the power source signal line pattern respectively. Second electrodes of the two switching transistors are coupled to a first electrode of the driving transistor. An orthogonal projection of the second electrode of at (Continued)

least one of the switching transistors onto the base at least partially overlaps an orthogonal projection of the power source signal line pattern onto the base, and at least partially overlaps an orthogonal projection of the second electrode plate of the storage capacitor onto the base.

27 Claims, 25 Drawing Sheets

(51) Int. Cl.
*H10K 59/121* (2023.01)
*H10K 59/123* (2023.01)
*H10K 59/126* (2023.01)

(52) U.S. Cl.
CPC ....... *H10K 59/1216* (2023.02); *H10K 59/123* (2023.02); *H10K 59/126* (2023.02); *G09G 2300/0426* (2013.01); *G09G 2300/0842* (2013.01); *G09G 2300/0861* (2013.01)

(56) References Cited

U.S. PATENT DOCUMENTS

| | | |
|---|---|---|
| 2013/0222270 A1 | 8/2013 | Winkler et al. |
| 2016/0343865 A1 | 11/2016 | Fang et al. |
| 2017/0154944 A1 | 6/2017 | Kim et al. |
| 2017/0365213 A1 | 12/2017 | Rieutort-Louis et al. |
| 2018/0061908 A1 | 3/2018 | Shim et al. |
| 2018/0102400 A1 | 4/2018 | Choi et al. |
| 2018/0249046 A1 | 8/2018 | Son et al. |
| 2020/0013337 A1* | 1/2020 | Cho ................. H10K 71/80 |
| 2021/0143241 A1* | 5/2021 | Kim ................. H10K 59/131 |
| 2021/0320130 A1 | 10/2021 | Xian et al. |

FOREIGN PATENT DOCUMENTS

| | | |
|---|---|---|
| CN | 107799556 A | 3/2018 |
| CN | 107919378 A | 4/2018 |
| CN | 104882450 B | 5/2018 |
| CN | 108154842 A | 6/2018 |
| CN | 109659350 A | 4/2019 |
| CN | 109856874 A | 6/2019 |
| CN | 110114885 A | 8/2019 |
| CN | 110190073 A | 8/2019 |
| CN | 110211975 A | 9/2019 |
| CN | 110335564 A | 10/2019 |
| KR | 20160001821 A | 1/2016 |
| RU | 2010127053 A | 3/2012 |

OTHER PUBLICATIONS

European Patent Office, Extended European Search Report Issued in Application No. 20824416.0, dated Aug. 18, 2022, Germany, 7 pages.
ISA China National Intellectual Property Administration, International Search Report and Written Opinion Issued in Application No. PCT/CN2019/121948, dated Jul. 29, 2020, WIPO, 12 pages.
ISA China National Intellectual Property Administration, International Search Report and Written Opinion Issued in Application No. PCT/CN2020/132389, dated Mar. 3, 2021, WIPO, 14 pages.
Rospatent Federal Service for Intellectual Property, Office Action Issued in Application No. 2021119144, dated Feb. 28, 2022, 18 pages.
United States Patent and Trademark Office, Final Office Action Issued in U.S. Appl. No. 17/040,846, filed Mar. 18, 2022, 13 pages.
United States Patent and Trademark Office, Office Action Issued in U.S. Appl. No. 17/040,846, dated Nov. 29, 2021, 33 pages.

\* cited by examiner

DISPLAY SUBSTRATE AND DISPLAY DEVICE

CROSS-REFERENCE TO RELATED APPLICATION

The present application is a U.S. National Phase of International Application No. PCT/CN2020/132389 filed on Nov. 27, 2020. International Application No. PC T/CN2020/132389 claims priority to PCT Application No. PCT/CN2019/121948 filed on Nov. 29, 2019. The entire contents of each of the above-listed applications are hereby incorporated by reference for all purposes.

TECHNICAL FIELD

The present disclosure relates to the field of display technology, in particular to a display substrate and a display device.

BACKGROUND

Organic Light-Emitting Diode (OLED) display products have been widely applied to various fields due to such advantages as high brightness, low power consumption, rapid response, high resolution, excellent flexibility and high luminous efficiency.

Along with the expansion of the application of the OLED display products, the display quality of the OLED display products is high demanded. There are various factors affecting the display quality of the display products, and as one of the important factors, crosstalk generated due to a pixel circuitry in the display product has attracted more and more attention.

SUMMARY

An object of the present disclosure is to provide a display substrate and a display device.

In one aspect, the present disclosure provides in some embodiments a display substrate, including a base and a plurality of subpixels arranged on the base in an array form, wherein the subpixel includes: a data line pattern extending in a first direction; a first shielding member, wherein at least a part of the first shielding member extends in the first direction; and a driving transistor, a first transistor coupled to a gate electrode of the driving transistor, and a second shielding member coupled to the first shielding member. The first transistor is of a double-gate structure, the first transistor includes a fourth semiconductor pattern, a fifth semiconductor pattern and a sixth conductor pattern, the sixth conductor pattern is coupled to the fourth semiconductor pattern and the fifth semiconductor pattern, and a second electrode of the driving transistor is coupled to the fourth semiconductor pattern or the fifth semiconductor pattern; an orthogonal projection of the second shielding member onto the base at least partially overlaps an orthogonal projection of the sixth conductor pattern onto the base; at least a part of the first shielding member is located between a second electrode of the driving transistor and a data line pattern of an adjacent subpixel.

Optionally, the second shielding member is arranged closer to the base than the first shielding member.

Optionally, an overlapping area between an orthogonal projection of the first shielding member onto the base and an orthogonal projection of the second electrode of the driving transistor onto the base is E1, a portion of the orthogonal projection of the second electrode of the driving transistor onto the base does not overlap the orthogonal projection of the first shielding member onto the base, an area of the portion of the orthogonal projection of the second electrode of the driving transistor onto the base not overlapping the orthogonal projection of the first shielding member onto the base is E2, and E1<E2.

Optionally, in a second direction, a minimum straight-line distance between the orthogonal projection of the second electrode of the driving transistor onto the base and the orthogonal projection of the first shielding member onto the base is L1, a minimum straight-line distance between the orthogonal projection of the second electrode of the driving transistor onto the base and an orthogonal projection of the data line pattern of the adjacent subpixel onto the base is L2, and L1≤L2.

Optionally, a length of a channel of the driving transistor is L3, and L1≤L2≤L3.

Optionally, a minimum straight-line distance between the second electrode of the driving transistor and the data line pattern of the adjacent subpixel is L4, a minimum straight-line distance between the second electrode of the driving transistor and the first shielding member is L5, and L5<L4.

Optionally, the subpixel further includes a connection line, the gate electrode of the driving transistor is coupled to a second electrode of the first transistor through the connection line; the orthogonal projection of the second shielding member onto the base is located between an orthogonal projection of an end of the connection line coupled to the second electrode of the first transistor onto the base and the orthogonal projection of the data line pattern of the adjacent subpixel onto the base Optionally, in the first direction, a length of the first shielding member is greater than a length of the connection line.

Optionally, a length of a portion of the second electrode of the driving transistor not overlapping the first shielding member in the first direction is L6, a length of the first shielding member in the first direction is L7, and L6≤L7.

Optionally, a gap is provided between the orthogonal projection of the first shielding member onto the base and the orthogonal projection of the second electrode of the driving transistor onto the base.

Optionally, the subpixel further includes a fourth transistor, a first electrode of the fourth transistor is coupled to the data line pattern, and a second electrode of the fourth transistor is coupled to a first electrode of the driving transistor; the orthogonal projection of the second shielding member onto the base does not overlap an orthogonal projection of a fourth transistor of the adjacent subpixel onto the base.

Optionally, the first shielding member and the second shielding member are configured to receive a first fixed-potential signal.

Optionally, the subpixel further includes a storage capacitor, the storage capacitor includes a first electrode plate and a second electrode plate, the first electrode plate is coupled to the gate electrode of the driving transistor, the second electrode plate is configured to receive a second fixed-potential signal; a gap is provided between an orthogonal projection of the second electrode plate onto the base and the orthogonal projection of the first shielding member onto the base; the orthogonal projection of the second electrode of the driving transistor onto the base includes a portion within the gap.

Optionally, the first fixed-potential signal is the same as the second fixed-potential signal.

Optionally, the second electrode of the driving transistor is arranged closer to the base than the first shielding member and the second shielding member.

Optionally, an active layer of the first transistor is arranged at a same layer as, and formed integrally with, an active layer of the driving transistor.

Optionally, a minimum straight-line distance between the first shielding member and the second electrode of the driving transistor is greater than a minimum straight-line distance between the second shielding member and the sixth conductor pattern.

Optionally, the subpixel further includes: a resetting signal line pattern and an initialization signal line pattern, wherein each of the resetting signal line pattern and the initialization signal line pattern extends in a second direction intersecting the first direction; a second transistor, wherein a gate electrode of the second transistor is coupled to the resetting signal line pattern, a first electrode of the second transistor is coupled to the initialization signal line pattern, and a second electrode of the second transistor is coupled to the gate electrode of the driving transistor.

Optionally, an orthogonal projection of a contact portion of the second shielding member in contact with the first shielding member onto the base does not overlap an orthogonal projection of an active layer of the second transistor onto the base; a distance between the contact portion and the sixth conductor pattern is smaller than a distance between the contact portion and the second electrode of the driving transistor; a distance between the orthogonal projection of the contact portion onto the base and the orthogonal projection of the sixth conductor pattern onto the base is smaller than a distance between the orthogonal projection of the contact portion onto the base and the orthogonal projection of the data line pattern onto the base.

Optionally, the subpixel further includes: a light-emission control signal line pattern and a power source signal line pattern, wherein the light-emission control signal line pattern extends in the second direction, the power source signal line pattern includes a portion extending in the first direction; a fifth transistor, wherein a gate electrode of the fifth transistor is coupled to the light-emission control signal line pattern, a first electrode of the fifth transistor is coupled to the power source signal line pattern, and a second electrode of the fifth transistor is coupled to the first electrode of the driving transistor.

Optionally, the subpixel further includes a light-emitting element and a sixth transistor, a gate electrode of the sixth transistor is coupled to the light-emission control signal line pattern, a first electrode of the sixth transistor is coupled to the second electrode of the driving transistor, and a second electrode of the sixth transistor is coupled to the light-emitting element.

In another aspect, the present disclosure provides in some embodiments a display substrate, including a base and a plurality of subpixels arranged on the base in an array form, wherein the subpixel includes: a data line pattern extending in a first direction; a first shielding member, wherein at least a part of the first shielding member extends in the first direction; and a driving transistor, a first transistor coupled to a gate electrode of the driving transistor, and a second shielding member coupled to the first shielding member. The first transistor is of a double-gate structure, the first transistor includes a fourth semiconductor pattern, a fifth semiconductor pattern and a sixth conductor pattern, the sixth conductor pattern is coupled to the fourth semiconductor pattern and the fifth semiconductor pattern, and a second electrode of the driving transistor is coupled to the fourth semiconductor pattern or the fifth semiconductor pattern; a straight-line distance between a contact portion of the second shielding member in contact with the first shielding member and the sixth conductor pattern is smaller than a straight-line distance between the contact portion and the second electrode of the driving transistor; and a distance between an orthogonal projection of the contact portion of the second shielding member in contact with the first shielding member onto the base and an orthogonal projection of the sixth conductor pattern onto the base is smaller than a distance between the orthogonal projection of the contact portion onto the base and an orthogonal projection of the data line pattern onto the base.

Optionally, the second shielding member is arranged closer to the base than the first shielding member.

Optionally, an overlapping area between an orthogonal projection of the first shielding member onto the base and an orthogonal projection of the second electrode of the driving transistor onto the base is E1, a portion of the orthogonal projection of the second electrode of the driving transistor onto the base does not overlap the orthogonal projection of the first shielding member onto the base, an area of the portion of the orthogonal projection of the second electrode of the driving transistor onto the base not overlapping the orthogonal projection of the first shielding member onto the base is E2, and E1<E2.

Optionally, in a second direction, a minimum straight-line distance between the orthogonal projection of the second electrode of the driving transistor onto the base and the orthogonal projection of the first shielding member onto the base is L1, a minimum straight-line distance between the orthogonal projection of the second electrode of the driving transistor onto the base and an orthogonal projection of the data line pattern of an adjacent subpixel onto the base is L2, and L1≤L2.

Optionally, a length of a channel of the driving transistor in a second direction is L3, and L1≤L2≤L3.

Optionally, a minimum straight-line distance between the second electrode of the driving transistor and the data line pattern of the adjacent subpixel is L4, a minimum straight-line distance between the second electrode of the driving transistor and the first shielding member is L5, and L5<L4.

Optionally, the subpixel further includes a connection line, the gate electrode of the driving transistor is coupled to a second electrode of the first transistor through the connection line; the orthogonal projection of the second shielding member onto the base is located between an orthogonal projection of an end of the connection line coupled to the second electrode of the first transistor onto the base and the orthogonal projection of the data line pattern of the adjacent subpixel onto the base.

Optionally, in the first direction, a length of the first shielding member is greater than a length of the connection line.

Optionally, a length of a portion of the second electrode of the driving transistor not overlapping the first shielding member in the first direction is L6, a length of the first shielding member in the first direction is L7, and L6≤L7.

Optionally, a gap is provided between the orthogonal projection of the first shielding member onto the base and the orthogonal projection of the second electrode of the driving transistor onto the base.

Optionally, the subpixel further includes a fourth transistor, a first electrode of the fourth transistor is coupled to the data line pattern, and a second electrode of the fourth transistor is coupled to a first electrode of the driving transistor; the orthogonal projection of the second shielding member onto the base does not overlap an orthogonal projection of a fourth transistor of the adjacent subpixel onto the base.

Optionally, the first shielding member and the second shielding member are configured to receive a first fixed-potential signal.

Optionally, the subpixel further includes a storage capacitor, the storage capacitor includes a first electrode plate and a second electrode plate, the first electrode plate is coupled to the gate electrode of the driving transistor, the second electrode plate is configured to receive a second fixed-potential signal; a gap is provided between an orthogonal projection of the second electrode plate onto the base and the orthogonal projection of the first shielding member onto the base; the orthogonal projection of the second electrode of the driving transistor onto the base includes a portion within the gap.

Optionally, the first fixed-potential signal is the same as the second fixed-potential signal.

Optionally, the second electrode of the driving transistor is arranged closer to the base than the first shielding member and the second shielding member.

Optionally, an active layer of the first transistor is arranged at a same layer as, and formed integrally with, an active layer of the driving transistor.

Optionally, a minimum straight-line distance between the first shielding member and the second electrode of the driving transistor is greater than a minimum straight-line distance between the second shielding member and the sixth conductor pattern.

Optionally, the subpixel further includes: a resetting signal line pattern and an initialization signal line pattern, wherein each of the resetting signal line pattern and the initialization signal line pattern extends in a second direction intersecting the first direction; a second transistor, wherein a gate electrode of the second transistor is coupled to the resetting signal line pattern, a first electrode of the second transistor is coupled to the initialization signal line pattern, and a second electrode of the second transistor is coupled to the gate electrode of the driving transistor.

Optionally, an orthogonal projection of a contact portion of the second shielding member in contact with the first shielding member onto the base does not overlap an orthogonal projection of an active layer of the second transistor onto the base; a minimum straight-line distance between a portion of the first shielding member and the second shielding member is smaller than a minimum straight-line distance between the data line pattern of the adjacent subpixel and the second shielding member, the portion of the first shielding member extends in the first direction.

Optionally, the subpixel further includes: a light-emission control signal line pattern and a power source signal line pattern, wherein the light-emission control signal line pattern extends in the second direction, the power source signal line pattern includes a portion extending in the first direction; a fifth transistor, wherein a gate electrode of the fifth transistor is coupled to the light-emission control signal line pattern, a first electrode of the fifth transistor is coupled to the power source signal line pattern, and a second electrode of the fifth transistor is coupled to the first electrode of the driving transistor.

Optionally, the subpixel further includes a light-emitting element and a sixth transistor, a gate electrode of the sixth transistor is coupled to the light-emission control signal line pattern, a first electrode of the sixth transistor is coupled to the second electrode of the driving transistor, and a second electrode of the sixth transistor is coupled to the light-emitting element.

In yet another aspect, the present disclosure provides in some embodiments a display device including the above-mentioned display substrate.

BRIEF DESCRIPTION OF THE DRAWINGS

The following drawings are provided to facilitate the understanding of the present disclosure, and constitute a portion of the present disclosure. The exemplary embodiments and explanation thereof are for illustrative purposes only, but shall not be construed as limiting the present disclosure. In these drawings.

DETAILED DESCRIPTION

In order to further explain the display substrate and the display device provided by the embodiments of the present disclosure, the present disclosure will be described hereinafter in details in conjunction with the drawings.

In the related art, crosstalk is generated in an OLED display product for various resources, and principally, the crosstalk is generated for a driving transistor due to a data line pattern surrounding the driving transistor in a subpixel driving circuitry. More specifically, during the layout of the subpixel driving circuitry, various transistors having other functions may be arranged around the driving transistor in the subpixel driving circuitry, and these transistors each consist of a plurality of layers of conductive patterns. In addition, various signal line patterns for transmitting different signals are also arranged around the driving transistor. During the operation of the subpixel driving circuitry, any change in signals on the conductive patterns of the transistors and on the signal line patterns may easily lead to the crosstalk for the driving transistor, and thereby the operating performance of the driving transistor may be adversely affected.

Due to the above-mentioned problems, it is found through study that, the crosstalk that affects the operating performance of the driving transistor mainly includes the crosstalk generated due to the coupling between the data line pattern and a gate electrode of the driving transistor, and the crosstalk generated due to the coupling between the data line pattern and a first electrode of the driving transistor.

The inventor of the present disclosure further found that, a pattern at a fixed potential may be formed on the first electrode of the driving transistor, so as to shield through the pattern at the fixed potential the first electrode of the driving transistor and reduce an effect of the coupling between the data line pattern in proximity to the first electrode of the driving transistor and the first electrode of the driving transistor, thereby to alleviate the crosstalk generated by the data line pattern for the driving transistor and improve a display effect of the display product.

It should be appreciated that, a display substrate having a 7T1C (i.e., seven thin film transistors and one capacitor)-based subpixel driving circuitry is involved in one or more embodiments of the present disclosure. In another embodiment, the display substrate may include the other different subpixel driving circuitry, e.g., a subpixel driving circuitry including more than or less than seven thin film transistor and one or more capacitors.

Figure 1:
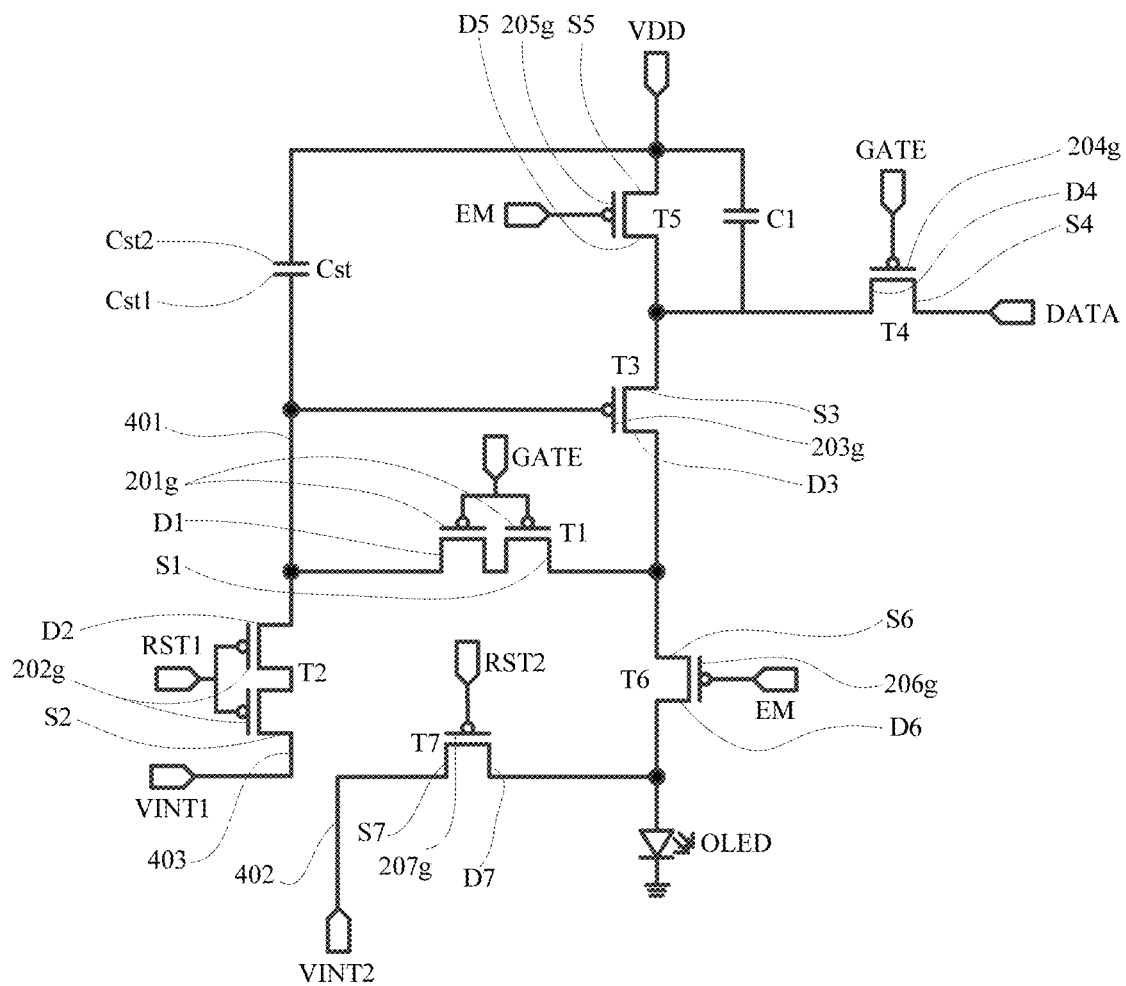
FIG. 1 is a schematic view showing a subpixel driving circuitry according to an embodiment of the present disclosure.

As shown in FIG. 1, the present disclosure provides in some embodiments a display substrate, which includes a plurality of subpixels. Each subpixel may include a gate line pattern GATE, a first resetting signal line pattern RST1, a first initialization signal line pattern VINT1, a data line pattern DATA, a light-emission control signal pattern EM, a power source signal line pattern VDD, a second resetting signal line pattern RST2 and a second initialization signal line pattern VINT2.

A subpixel driving circuitry of each subpixel may include a first transistor T1, a second transistor T2, a third transistor T3, a fourth transistor T4, a fifth transistor T5, a sixth transistor T6, a seventh transistor T7 and a storage capacitor Cst. In addition, as shown in FIG. 1, the subpixel driving circuitry may further include a first capacitor C1, which is a parasitic capacitor.

Taking one subpixel driving circuitry as an example, the transistors of the subpixel driving circuitry may be P-type transistors. The first transistor T1 may be of a double-gate structure, a gate electrode 201g of the first transistor T1 may be coupled to the gate line pattern GATE, a source electrode S1 of the first transistor T1 may be coupled a drain electrode D3 of the third transistor T3, and a drain electrode D1 of the first transistor T1 may be coupled to a gate electrode 203g of the third transistor T3.

The second transistor T2 may be of a double-gate structure, a gate electrode 202g of the second transistor T2 may be coupled to the first resetting signal line pattern RST1, a source electrode S2 of the second transistor T2 may be coupled to the first initialization signal line pattern VINT1, and a drain electrode D2 of the second transistor T2 may be coupled to the gate electrode 203g of the third transistor T3.

A gate electrode 204g of the fourth transistor T4 may be coupled to the gate line pattern GATE, a source electrode S4 of the fourth transistor T4 may be coupled to the data line pattern DATA, and a drain electrode D4 of the fourth transistor T4 may be coupled to a source electrode S3 of the third transistor T3.

A gate electrode 205g of the fifth transistor T5 may be coupled to the light-emission control signal line pattern EM, a source electrode S5 of the fifth transistor T5 may be coupled to the power source signal line pattern VDD, and a drain electrode D5 of the fifth transistor T5 may be coupled to the source electrode S3 of the third transistor T3.

A gate electrode 206g of the sixth transistor T6 may be coupled to the light-emission control signal line pattern EM, a source electrode S6 of the sixth transistor T6 may be coupled to the drain electrode D3 of the third transistor T3, and a drain electrode D6 of the sixth transistor T6 may be coupled to an anode of a light-emitting element OLED.

A gate electrode 207g of the seventh transistor T7 may be coupled to the second resetting signal line pattern RST2, a drain electrode D7 of the seventh transistor T7 may be coupled to the anode of the light-emitting element OLED, and a source electrode S7 of the seventh transistor T7 may be coupled to the second initialization signal line pattern VINT2.

A first electrode plate Cst1 of the storage capacitor Cst may be coupled to the gate electrode 203g of the third transistor T3, and a second electrode plate Cst2 of the storage capacitor Cst may be coupled to the power source signal line pattern VDD.

Figure 2:
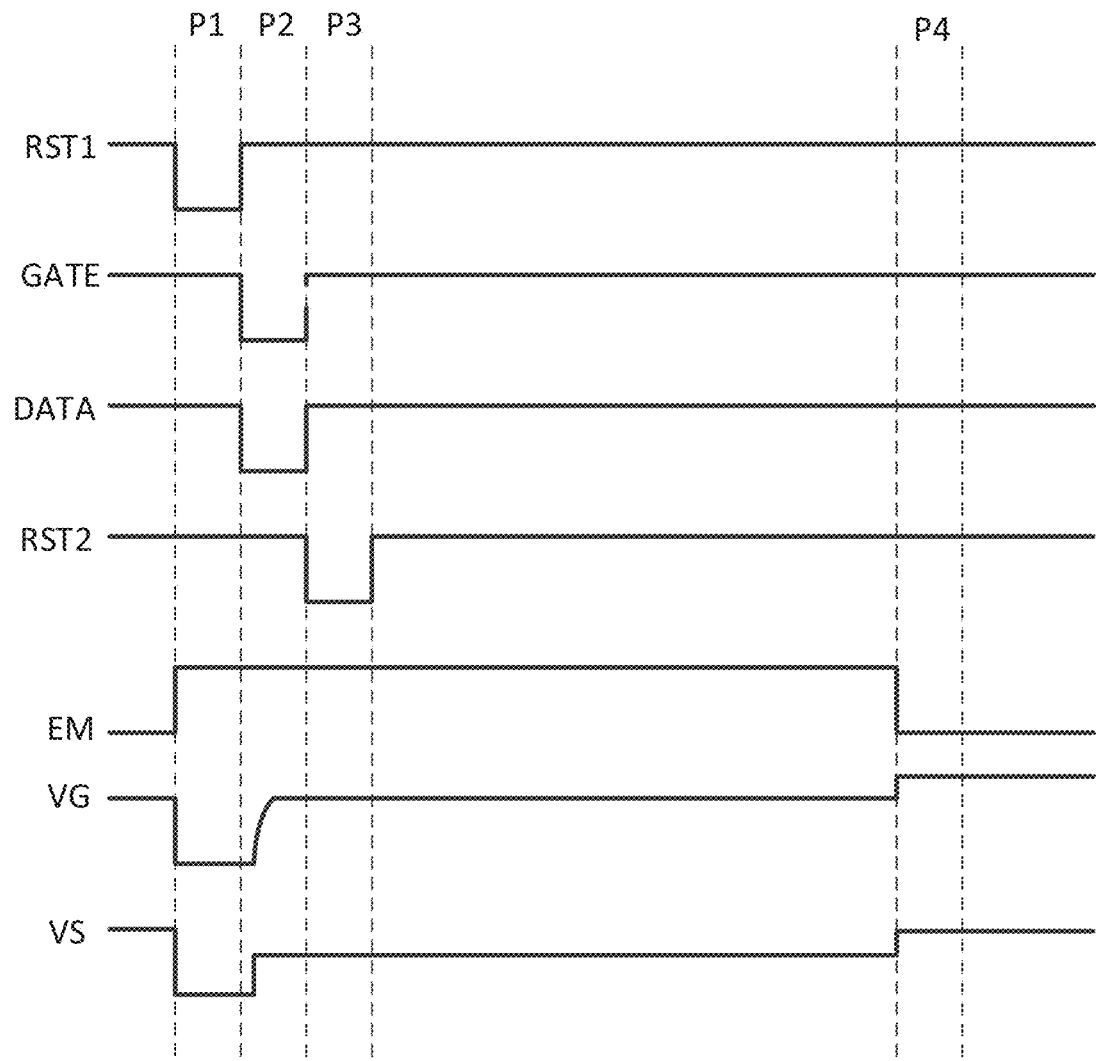
FIG. 2 is a sequence diagram of the subpixel driving circuitry according to an embodiment of the present disclosure.

As shown in FIG. 2, during the operation of the subpixel driving circuitry with the above-mentioned structure, each operating period may include a first resetting phase P1, a write-in compensation phase P2, a second resetting phase P3 and a light-emitting phase P4.

At the first resetting phase P1, a first resetting signal inputted by the first resetting signal line pattern RST1 may be at an active level, so as to turn on the second transistor T2. An initialization signal from the first initialization signal line pattern VINT1 may be inputted to the gate electrode 203g of the third transistor T3, so as to enable a gate-to-source voltage Vgs maintained on the third transistor T3 within a previous frame to be zero, thereby to reset the gate electrode 203g of the third transistor T3.

At the write-in compensation phase P2, the first resetting signal may be at an inactive level, so as to turn off the second transistor T2. A gate scanning signal inputted by the gate line pattern GATE may be at an active level, so as to turn on the first transistor T1 and the fourth transistor T4. A data signal may be written into the data line pattern DATA, and then transmitted to the source electrode S3 of the third transistor T3 via the fourth transistor T4. In addition, when the first transistor T1 and the fourth transistor T4 are turned on, the third transistor T3 may be of a diode structure, so the first transistor T1, the third transistor T3 and the fourth transistor T4 may cooperate to compensate for a threshold voltage of the third transistor T3. When a compensation time period is sufficiently long, a potential at the gate electrode 203g of the third transistor T3 may finally reach Vdata+Vth, where Vdata represents a voltage value of the data signal, and Vth represents the threshold voltage of the third transistor T3.

At the second resetting phase P3, the gate scanning signal may be at an inactive level, so as to turn off the first transistor T1 and the fourth transistor T4. A second resetting signal inputted by the first resetting signal line RST2 may be at an active level, so as to turn on the seventh transistor T7. An initialization signal from the second initialization signal line pattern VINT2 may be transmitted to the anode of the light-emitting element OLED, so as to control the light-emitting element OLED not to emit light.

At the light-emitting phase P4, a light-emission control signal written into the light-emission control signal line pattern EM may be at an active level, so as to turn on the fifth transistor T5 and the sixth transistor T6, thereby to transmit a power source signal from the power source signal line pattern VDD to the source electrode S3 of the third transistor T3. In addition, the gate electrode 203g of the third transistor T3 is maintained at Vdata+Vth, so the third transistor T3 may be turned on, and a gate-to-source voltage of the third transistor T3 may be Vdata+Vth-VDD, where VDD represents a voltage value of the power source signal. A leakage current generated in accordance with the gate-to-source voltage may flow to the anode of the corresponding light-emitting element OLED, so as to drive the corresponding light-emitting element OLED to emit light.

Figure 3:
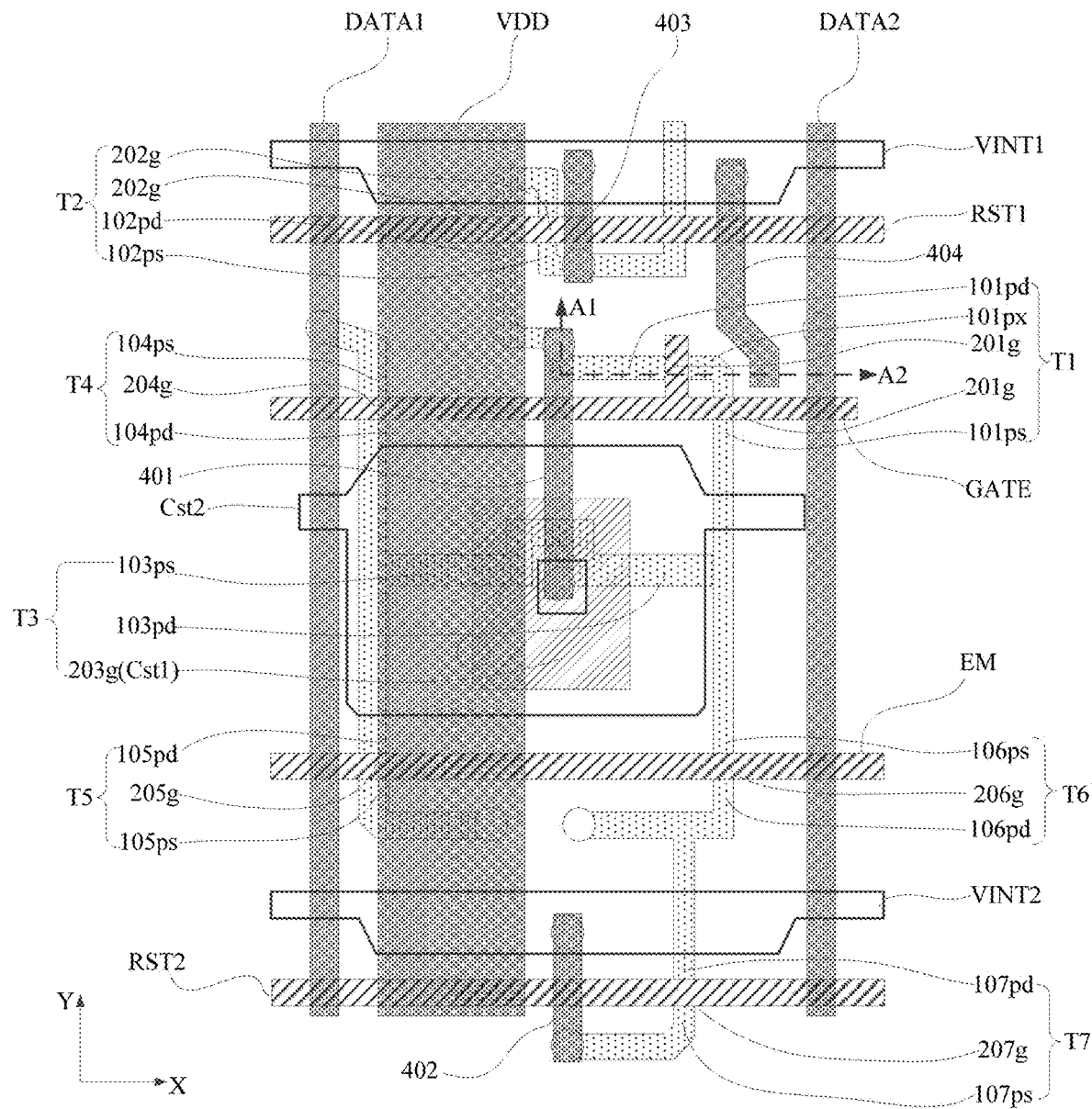
FIG. 3 is a schematic view showing a first layout of the subpixel driving circuitry in a display substrate according to an embodiment of the present disclosure.

As shown in FIG. 3, during the manufacture of the subpixel driving circuitry, the layout of film layers of the subpixel driving circuitry will be described as follows. An active film layer, a gate insulation layer, a first gate metal layer, a first interlayer insulation layer, a second gate metal layer, a second interlayer insulation layer, a first source/drain metal layer and a third interlayer insulation layer may be laminated one on another in that order in a direction away from a base.

Figure 4:
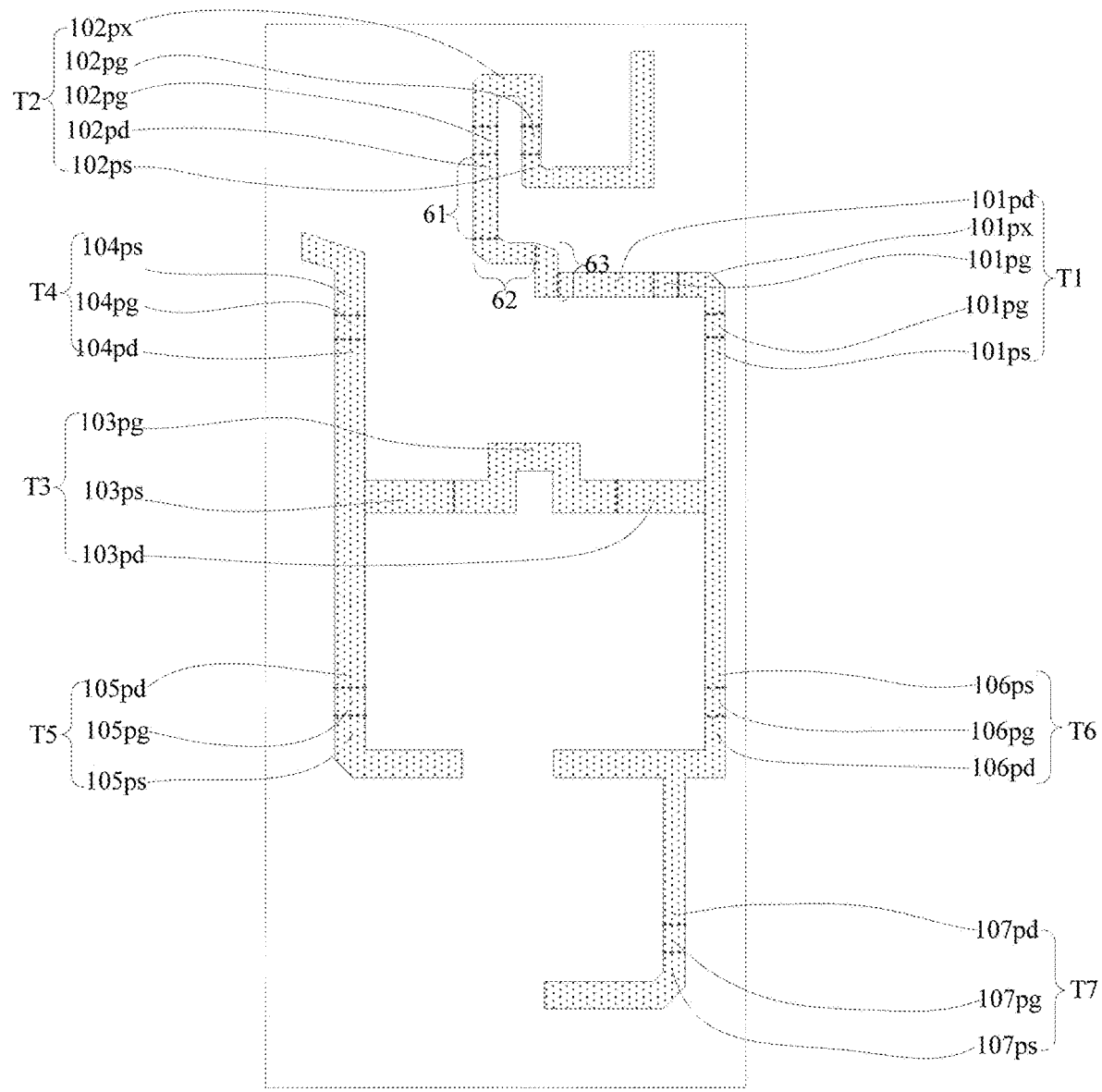
FIG. 4 is a schematic view showing a first layout of an active film layer according to an embodiment of the present disclosure.

As shown in FIG. 4, the active film layer may be used to form a channel region (e.g., 101pg to 107pg), a source electrode formation region (e.g., 101ps to 107ps) and a drain electrode formation region (e.g., 101pd to 107pd) of each transistor in the subpixel driving circuitry. Due to a doping effect, the active film layers corresponding to the source electrode formation region and the drain electrode formation region may have electric conductivity superior to the active film layer corresponding to the channel region. The active film layer may be made of amorphous silicon, polysilicon or an oxide semiconductor material. It should be appreciated that, the source electrode formation region and the drain electrode formation region may each be a region doped with n-type or p-type impurities.

In addition, it should be appreciated that, the active film layers corresponding to the source electrode formation region and the drain electrode formation region may directly serve as the corresponding source electrode and drain electrode; or the source electrode in contact with the source electrode formation region may be made of a metal material, and the drain electrode in contact with the drain electrode formation region may be made of a metal material.

Figure 5:
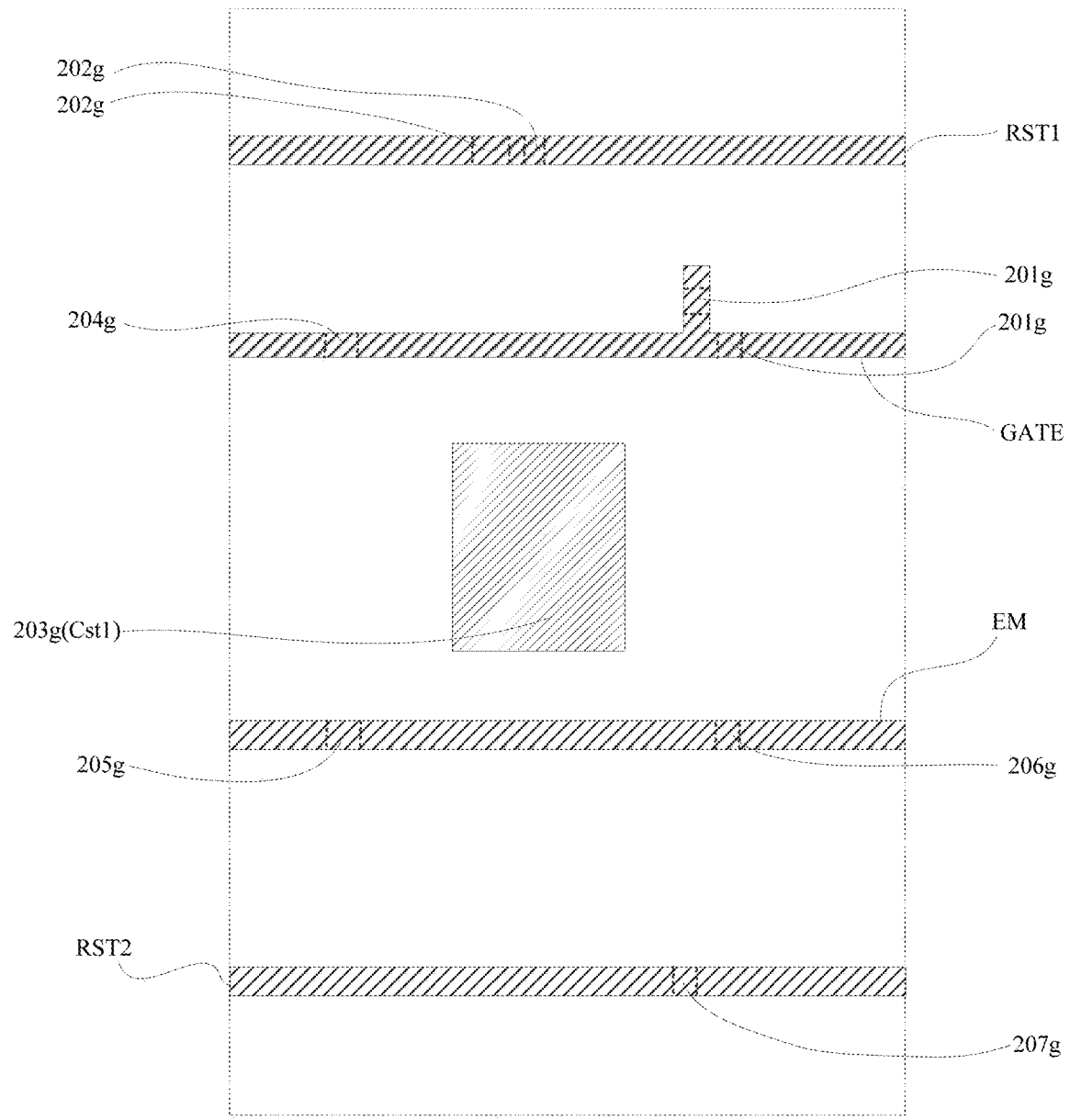
FIG. 5 is a schematic view showing a first layout of a first gate metal layer according to an embodiment of the present disclosure.

As shown in FIG. 5, the first gate metal layer may be used to form the gate electrodes (e.g., 201g to 207g) of the transistors in the subpixel driving circuitry, as well as the gate line pattern GATE, the light-emission control signal line pattern EM, the first resetting signal line pattern RST1 and the second resetting signal line pattern RST2 of the display substrate. The gate electrode 203g of the third transistor T3 in each subpixel driving circuitry may be reused as the first electrode plate Cst1 of the storage capacitor Cst in the subpixel driving circuitry.

Figure 6:
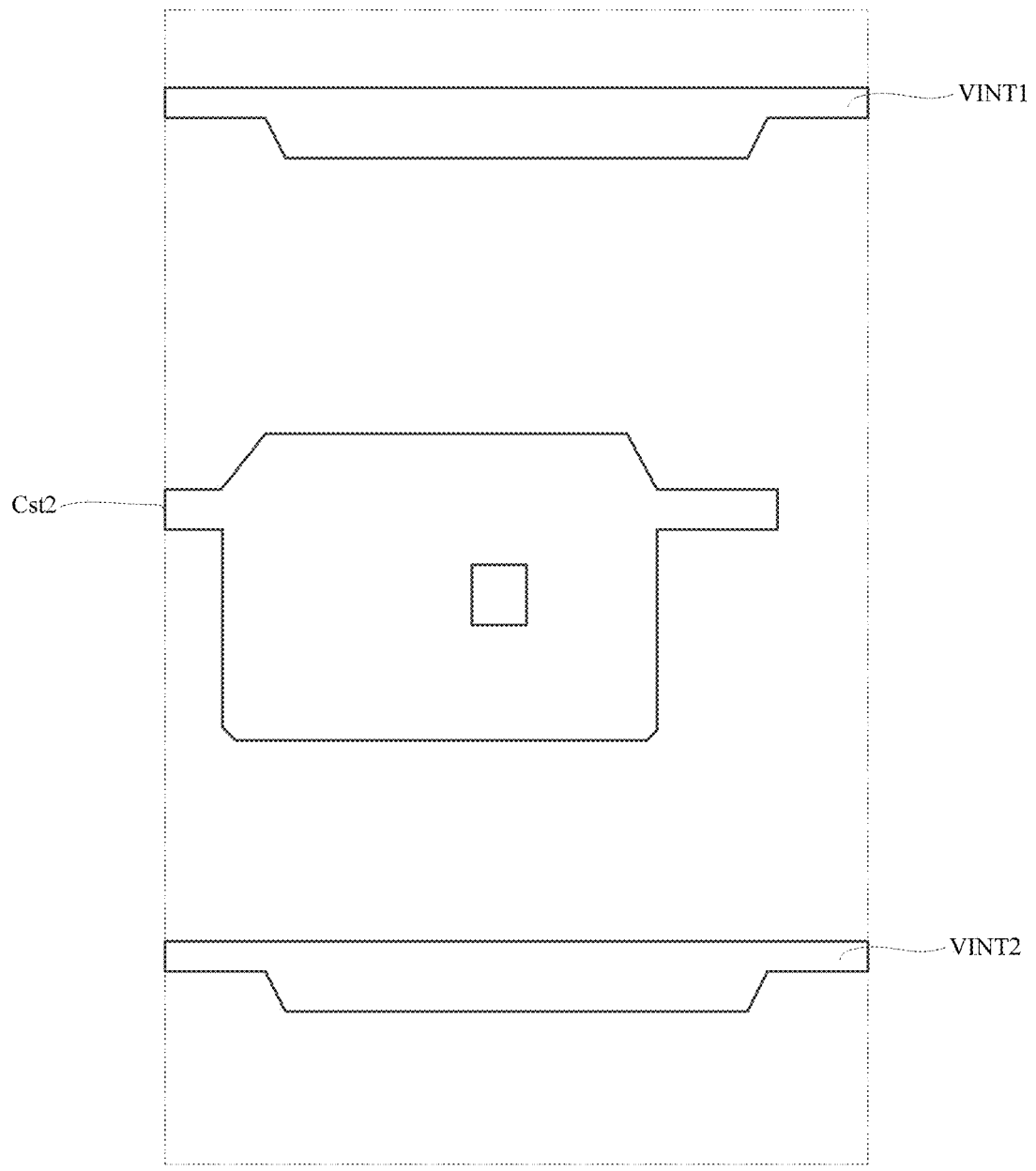
FIG. 6 is a schematic view showing a first layout of a second gate metal layer according to an embodiment of the present disclosure.

As shown in FIG. 6, the second gate metal layer may be used to form the second electrode plate Cst2 of the storage capacitor Cst, as well as the first initialization signal line pattern VINT1 and the second initialization signal line pattern VINT2 of the display substrate.

Figure 7:
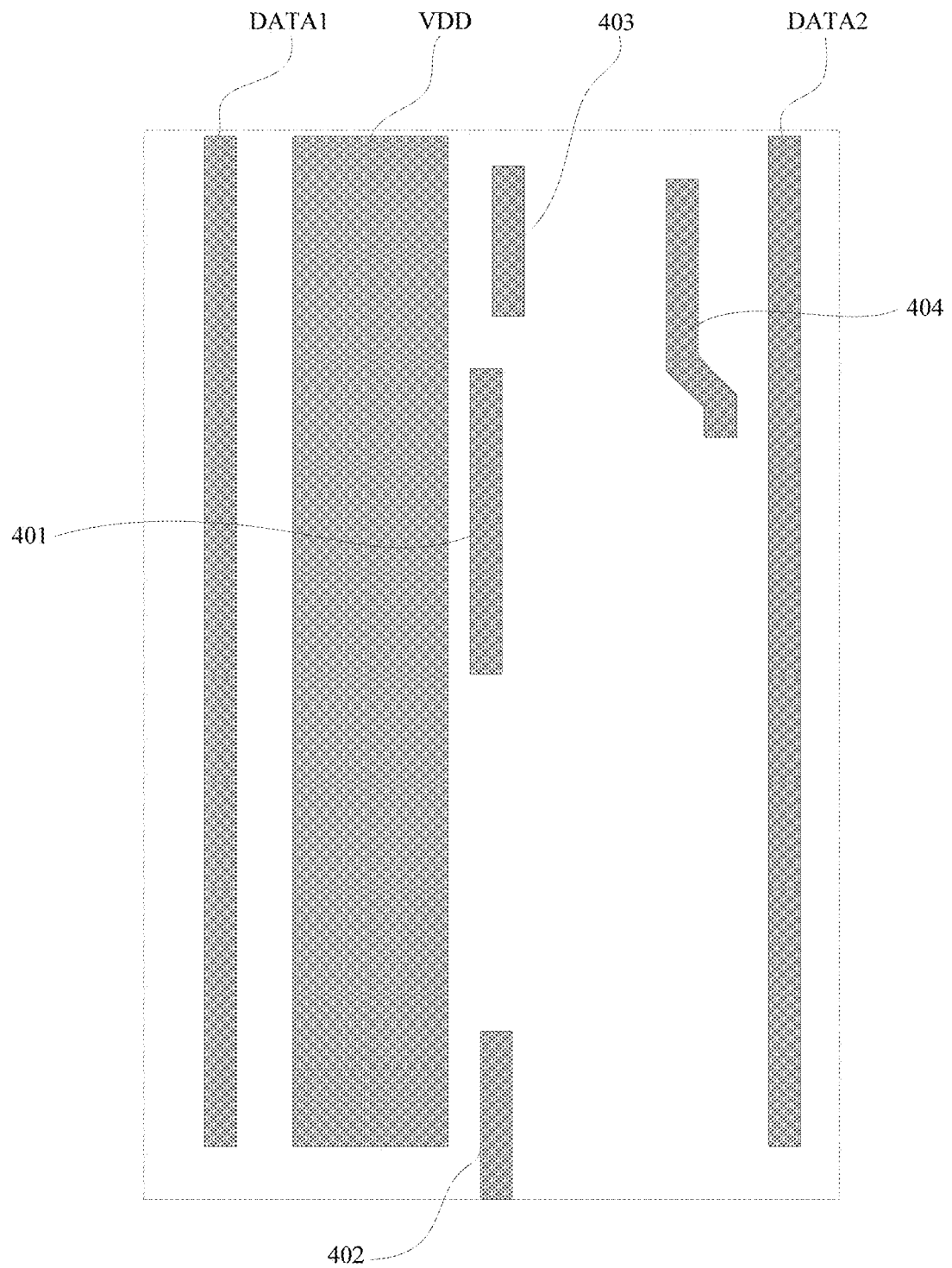
FIG. 7 is a schematic view showing a first layout of a source/drain metal layer according to an embodiment of the present disclosure.

As shown in FIGS. 1, 3 and 7, the first source/drain metal layer may be used to form the source electrodes (e.g., S1 to S7) and the drain electrodes (e.g., D1 to D7) of the transistors in the subpixel driving circuitry, as well as the data line pattern (e.g., DATA1 and DATA2) and the power source signal line pattern VDD of the display substrate.

More specifically, referring to FIGS. 3 and 7-10 again, the gate electrode 201g of the first transistor T1 may cover a first channel region 101pg, the source electrode S1 of the first transistor T1 may be located at a first source electrode formation region 101ps, and the drain electrode D1 of the first transistor T1 may be located at a first drain electrode formation region 101pd.

The gate electrode 202g of the second transistor T2 may cover a second channel region 102pg, the source electrode S2 of the second transistor T2 may be located at a second source electrode formation region 102ps, and the drain electrode D2 of the second transistor T2 may be located at a second drain electrode formation region 102pd.

The gate electrode 203g of the third transistor T3 may cover a third channel region 103pg, the source electrode S3 of the third transistor T3 may be located at a third source electrode formation region 103ps, and the drain electrode D3 of the third transistor T3 may be located at a third drain electrode formation region 103pd.

The gate electrode 204g of the fourth transistor T4 may cover a fourth channel region 104pg, the source electrode S4 of the fourth transistor T4 may be located at a fourth source electrode formation region 104ps, and the drain electrode D4 of the fourth transistor T4 may be located at a fourth drain electrode formation region 104pd.

The gate electrode 205g of the fifth transistor T5 may cover a fifth channel region 105pg, the source electrode S5 of the fifth transistor T5 may be located at a fifth source electrode formation region 105ps, and the drain electrode D5 of the fifth transistor T5 may be located at a fifth drain electrode formation region 105pd.

The gate electrode 206g of the sixth transistor T6 may cover a sixth channel region 106pg, the source electrode S6 of the sixth transistor T6 may be located at a sixth source electrode formation region 106ps, and the drain electrode D6 of the sixth transistor T6 may be located at a sixth drain electrode formation region 106pd.

The gate electrode 207g of the seventh transistor T7 may cover a seventh channel region 106pg, the source electrode S7 of the seventh transistor T7 may be located at a seventh source electrode formation region 107ps, and the drain electrode D7 of the seventh transistor T7 may be located at a seventh drain electrode formation region 107pd.

The gate electrode 203g of the third transistor T3 may be reused as the first electrode plate Cst1 of the storage capacitor Cst, and the second electrode plate Cst2 of the storage capacitor Cst may be coupled to the power source signal line pattern VDD.

It should be appreciated that, connection lines 401, 402 and 403 in FIG. 1 may be formed by the first source/drain metal layer, and the arrangement thereof is shown in FIGS. 3 and 7. The first capacitor C1 in FIG. 1 may be a parasitic capacitor. As shown in FIG. 3, an orthogonal projection of the second electrode plate Cst2 of the storage capacitor Cst onto the base may overlap an orthogonal projection of a portion of the corresponding fourth drain electrode formation region 104pd extending downward onto the base at an overlapping region, i.e., which is formed as the first capacitor C1, the corresponding fourth drain electrode formation region 104pd corresponds to the fourth transistor T4 and.

In addition, in the display substrate according to the embodiments of the present disclosure, the plurality of subpixels may be arranged in an array form, i.e., in a plurality of rows and columns Each row of subpixels may include a plurality of subpixels arranged in a second direction, and each column of subpixels may include a plurality of subpixels arranged in a first direction intersecting the second direction. The gate line pattern GATE, the first resetting signal line pattern RST1, the first initialization signal line pattern VINT1, the light-emission control signal line pattern EM, the second resetting signal line pattern RST2 and the second initialization signal line pattern VINT2 of the subpixel may each extend in the second direction, and the data line pattern DATA and the power source signal line pattern VDD of the subpixel may each extend in the first direction.

The gate line patterns GATE in a same row may be formed integrally as one gate line, the first resetting signal line patterns RST1 in a same row may be formed integrally as one first resetting signal line, the first initialization signal line patterns VINT1 in a same row may be formed integrally as one first initialization signal line, the light-emission control signal line patterns EM in a same row may be formed integrally as one light-emission control signal line, the second resetting signal line patterns RST2 in a same row may be formed integrally as one second resetting signal line, the second initialization signal line patterns VINT2 in a same row may be formed integrally as one second initialization signal line, the data line patterns DATA in a same column may be formed integrally as one data line, and the power source signal line patterns VDD in a same column may be formed integrally as one power source signal line.

In order to simplify a layout space of the subpixels, the second resetting signal line corresponding to the subpixels in one row may be reused as a first resetting signal line corresponding to the subpixels in a next row. Identically, the second initialization signal line corresponding to the subpixels in one row may be reused as the first initialization signal line corresponding to the subpixels in a next row.

As shown in FIG. 3, in some embodiments, taking the subpixel driving circuitry in one subpixel as an example, in the first direction (e.g., a direction Y), the gate electrode 204g of the fourth transistor T4, the gate electrode 201g of the first transistor T1 and the gate electrode 202g of the second transistor T2 may be located at a first side of the gate electrode of the driving transistor (i.e., the gate electrode 203g of the third transistor T3), and the gate electrode of the seventh transistor T7, the gate electrode 206g of the sixth transistor T6 and the gate electrode of the fifth transistor T5 may be located at a second side of the gate electrode of the driving transistor. For example, the first side and the second side of the gate electrode of the driving transistor may be two opposite sides of the gate electrode of the driving transistor in the first direction. Further, the first side of the gate electrode of the driving transistor may be an upper side of the gate electrode of the driving transistor, and the second side of the gate electrode of the driving transistor may be a lower side of the gate electrode of the driving transistor T3. For example, the lower side, e.g., a side of the display substrate for bonding an Integrated Circuit (IC) may be the lower side of the display substrate, and a side of the gate electrode of the driving transistor closer to the IC may be the lower side of the gate electrode of the driving transistor. The upper side may be a side opposite to the lower side, e.g., a side of the gate electrode of the driving transistor further away from the IC.

In some embodiments of the present disclosure, as shown in FIG. 3, in the second direction (e.g., a direction X), the gate electrode 204g of the fourth transistor T4 and the gate electrode 205g of the fifth transistor T5 may be located at a third side of the gate electrode of the driving transistor, and the gate electrode 201g of the first transistor T1 and the gate electrode 206g of the sixth transistor T6 may be located at a fourth side of the gate electrode of the driving transistor T1. For example, the third side and the fourth side of the gate electrode of the driving transistor may be two opposite sides of the gate electrode of the driving transistor in the second direction X. Further, the third side of the gate electrode of the driving transistor may be a left side of the gate electrode of the driving transistor, and the fourth side of the gate electrode of the driving transistor may be a right side of the gate electrode of the driving transistor. For example, with respect to the left side and the right side, in a same subpixel, the first data line pattern DATA1 may be located at the left side of the power source signal line pattern VDD, and the power source signal line pattern VDD may be located at a right side of the first data line pattern DATA1.

Figure 8:
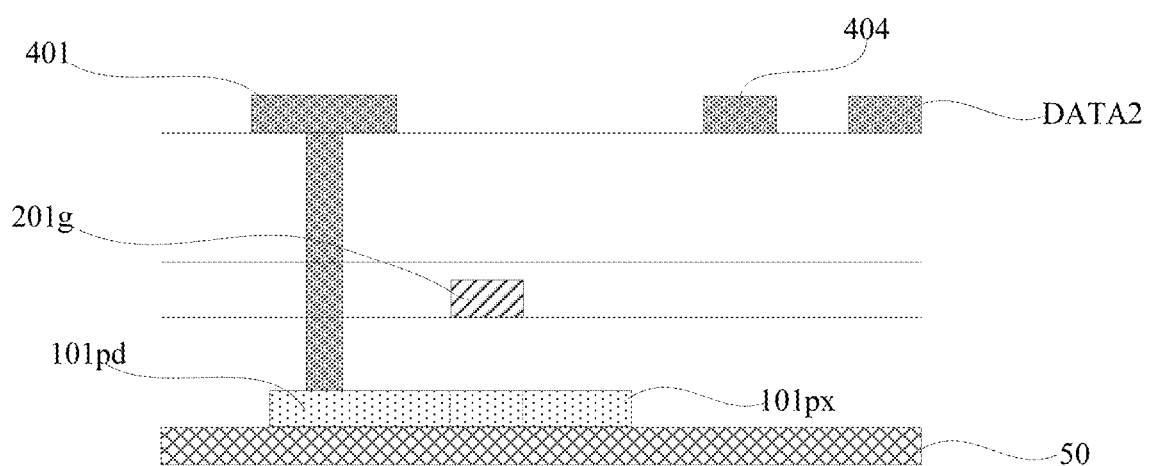
FIG. 8 is a sectional view of the display substrate along a line A1A2 in FIG. 3.

As shown in FIGS. 3 and 8, the present disclosure provides in some embodiments a display substrate, which includes a base 50 and a plurality of subpixels arranged on the base 50 in an array form. The subpixel includes: a data line pattern (e.g., DATA1 in FIG. 3) extending in a first direction; an initialization signal line pattern (e.g., VINT1 in FIG. 3) including a portion extending in a second direction intersecting the first direction, and configured to transmit an initialization signal at a fixed potential; and a subpixel driving circuitry. The subpixel driving circuitry includes a driving transistor (e.g., T3 in FIG. 3), a first transistor T1 coupled to a gate electrode of the driving transistor, and a first shielding member 404 coupled to the initialization signal line pattern. An orthogonal projection of the first shielding member 404 onto the base 50 may be located between an orthogonal projection of the first transistor T1 onto the base 50 and an orthogonal projection of a target data line pattern (e.g., DATA2 in FIG. 3) onto the base 50. A next subpixel adjacent to the subpixel in the second direction includes the target data line pattern.

To be specific, usually the display substrate may include the plurality of subpixels arranged in an array form, and each subpixel may include the data line pattern (e.g., DATA1 in FIG. 3) extending in the first direction, and the initialization signal line pattern (e.g., VINT1 in FIG. 3), at least a portion of which extends in the second direction. The data line pattern is configured to transmit a data signal, and the initialization signal line pattern is configured to transmit an initialization signal at a fixed potential. For example, the first direction may include the direction Y, and the second direction may include the direction X.

The target data line pattern may be a data line pattern of a next subpixel adjacent to a current subpixel in the second direction.

Each subpixel may further include subpixel driving circuitries and light-emitting elements corresponding to the subpixel driving circuitries respectively. The light-emitting element may include an anode, an organic light-emitting material layer and a cathode laminated one on another. The anode of the light-emitting element may be coupled to the corresponding subpixel driving circuitry, and the light-emitting element may emit light under the control of a driving signal from the subpixel driving circuitry.

More specifically, as shown in FIGS. 1, 3 and 4, when the subpixel driving circuitry includes a 7T1C-based subpixel driving circuitry, the gate electrode 203g of the third transistor T3 (i.e., the driving transistor) may be coupled to the drain electrode D1 of the first transistor T1 through a connection line 401, and the drain electrode D3 of the third transistor T3 may be coupled to the source electrode S1 of the first transistor T1. In the direction X, a minimum straight-line distance between an orthogonal projection of the first channel region 101pg of the first transistor T1 onto the base 50 and an orthogonal projection of the target data line pattern (e.g., DATA2 in FIG. 3) onto the base 50 may be smaller than a minimum straight-line distance between an orthogonal projection of the third channel region 103pg of the third transistor T3 onto the base 50 and the orthogonal projection of the target data line pattern onto the base 50. It should be appreciated that, the minimum straight-line distance between the orthogonal projection of the channel region (e.g., the first channel region 101pg and the third channel region 103pg) onto the base 50 and the orthogonal projection of the target data line pattern (e.g., DATA2 in FIG. 3) onto the base 50 may refer to a minimum distance between an edge of the orthogonal projection of the channel region onto the base 50 closest to the target data line pattern and the orthogonal projection of the target data line pattern (e.g., DATA2 in FIG. 3) onto the base 50.

In the subpixel driving circuitry with the above structure, when a data signal transmitted through the target data line pattern changes, the performance of the first transistor T1 may be affected. Because the first transistor T1 is coupled to the third transistor T3 through the connection line 401, the operating performance of the third transistor T3 may be affected too.

According to the embodiments of the present disclosure, the subpixel driving circuitry is provided with the first shielding member 404 coupled to the initialization signal line pattern (e.g., VINT1 in FIG. 3), so as to provide the first shielding member 404 with a same fixed potential as the initialization signal. In addition, the orthogonal projection of the first shielding member 404 onto the base 50 may be located between the orthogonal projection of the first transistor T1 onto the base 50 and the orthogonal projection of the target data line pattern (e.g., DATA2 in FIG. 3) onto the base 50, so it is able to reduce, through the first shielding member 404, the influence caused by the change in the signal transmitted through the target data line pattern on the performance of the first transistor T1, thereby to reduce an effect of the coupling between the gate electrode (i.e., 203g) of the driving transistor and the target data line pattern and reduce the vertical crosstalk, and improve a display effect of the display substrate during the display.

In addition, when the first shielding member 404 is coupled to the initialization signal line pattern, it is able to, apart from providing the first shielding member 404 with the fixed potential, increase a voltage across the initialization signal line pattern and provide a more stable voltage for the initialization signal transmitted on the initialization signal line pattern, thereby to improve the operating performance of the subpixel driving circuitry.

It should be appreciated that, apart from being coupled to the initialization signal line pattern, the first shielding member 404 may also be coupled to the power source signal line pattern VDD of the subpixel, so as to enable the first shielding member 404 to be at a same fixed potential as the power source signal transmitted through the power source signal line pattern VDD.

Figure 27:
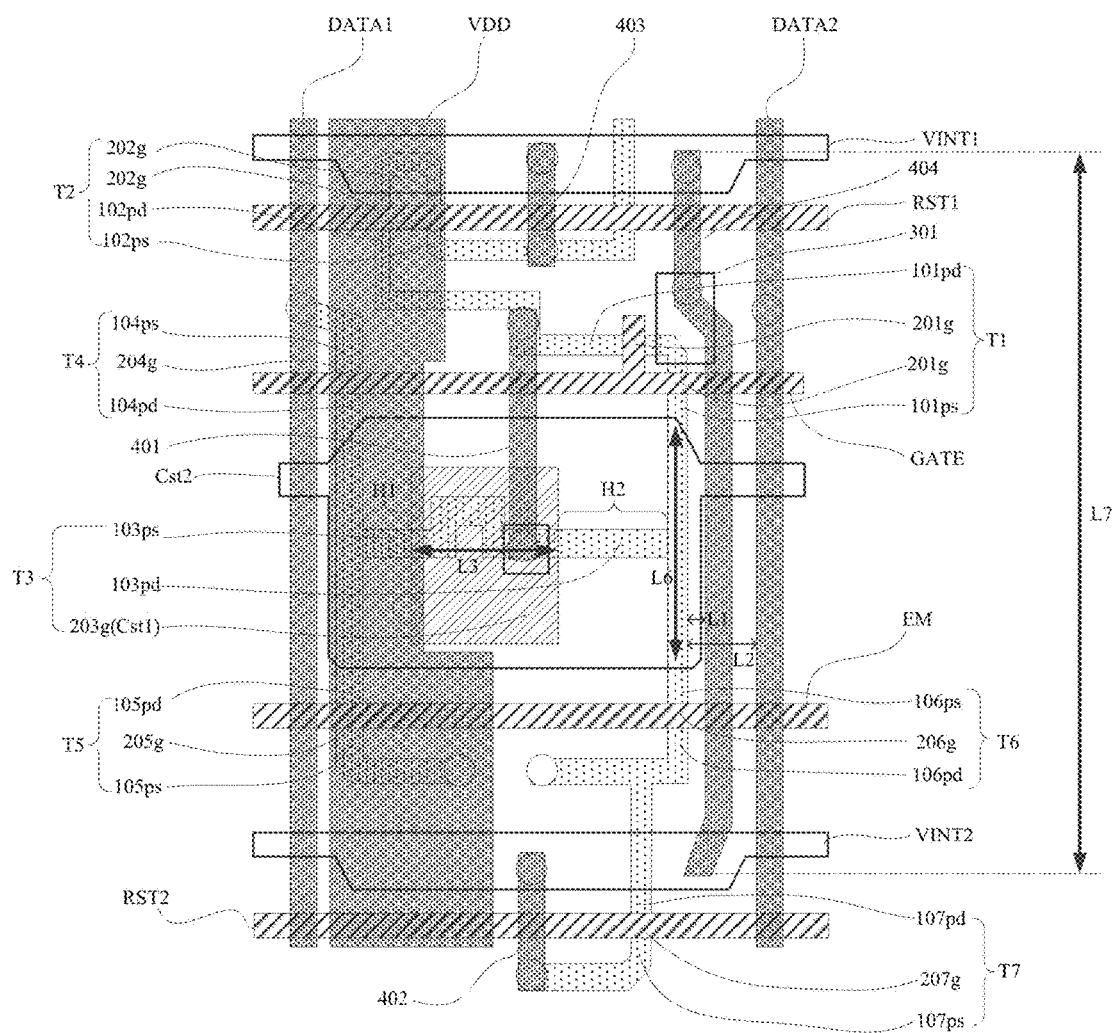
FIG. 27 is a schematic view showing a twelfth layout of the subpixel driving circuitry in the display substrate according to an embodiment of the present disclosure.

As shown in FIG. 27, a minimum straight-line distance between the orthogonal projection of the second electrode of the driving transistor (i.e., the drain electrode D3 of the third transistor T3) onto the base and the orthogonal projection of the first shielding member 404 onto the base may be L1, a minimum straight-line distance between the orthogonal projection of the second electrode of the driving transistor onto the base and an orthogonal projection of the data line pattern DATA2 of an adjacent subpixel onto the base may be L2.

A length of a channel (i.e., the third channel region 103pg) of the driving transistor in the second direction may be L3, and L1≤L2≤L3.

Figure 28:
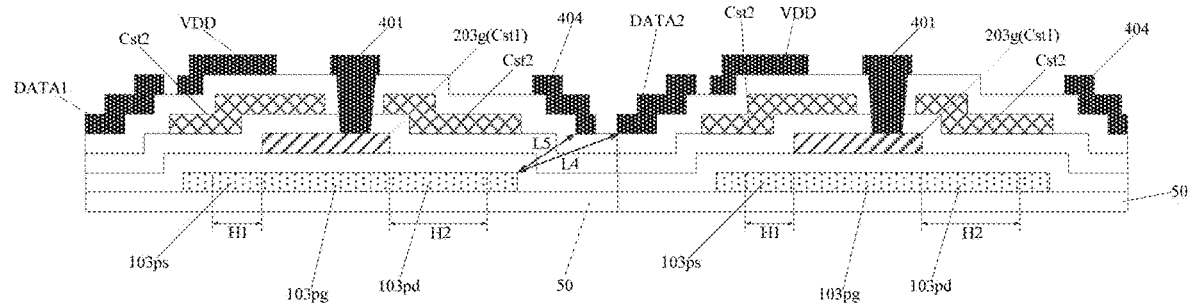
FIG. 28 is a sectional view of two adjacent subpixel driving circuitry along a line D1D2 in FIG. 21.

As shown in FIG. 28, a minimum straight-line distance between the second electrode of the driving transistor and the data line pattern (e.g., DATA2) of the adjacent subpixel may be L4, a minimum straight-line distance between the second electrode of the driving transistor and the first shielding member may be L5, and L5<L4.

As shown in FIG. 27, a length of a portion of the second electrode of the driving transistor not overlapping the first shielding member 404 in the first direction may be L6, a length of the first shielding member 404 in the first direction may be L7, and L6≤L7.

As shown in FIG. 27, an active layer of the first transistor T1 may be arranged at a same layer as, and formed integrally with, an active layer of the driving transistor (i.e., the third transistor T3), so the active layers may be formed through a single patterning process.

The second electrode of the driving transistor may be arranged at a same layer as, and formed integrally with, the sixth conductor pattern, and a second shielding member 301 may be arranged between the active layer of the first transistor T1 and the first shielding member 404, so a minimum straight-line distance between the first shielding member 404 and the second electrode of the driving transistor may be greater than a minimum straight-line distance between the second shielding member 301 and the sixth conductor pattern.

The first shielding member 404 may be arranged at a same layer as the data line pattern (e.g., DATA2) of the adjacent subpixel, so they may be formed through a single patterning process. A minimum straight-line distance between a portion of the first shielding member 404 extending in the first direction and the second shielding member 301 may be smaller than a minimum straight-line distance between the data line pattern of the adjacent subpixel and the second shielding member 301.

When the first shielding member 404 is coupled to the power source signal line pattern VDD, although the first shielding member 404 is maintained at the fixed potential, a parasitic capacitance generated by the power source signal line pattern VDD may increase. At this time, an RC loading of the power source signal line pattern VDD may increase, and thereby it is adverse to the alleviation of the vertical crosstalk.

As shown in FIG. 3, in some embodiments of the present disclosure, the gate electrode 201g of the first transistor T1 may be formed integrally with the gate line pattern GATE, and the gate electrode 201g of the first transistor T1 may be a portion of a resultant integral structure capable of forming an overlapping region with the active film layer in a direction perpendicular to the base.

As shown in FIG. 3, in some embodiments of the present disclosure, the plurality of subpixels may be arranged in a plurality of rows, and each row of subpixels may include a plurality of subpixels arranged in the second direction. The initialization signal line patterns of the subpixels in a same row may be coupled sequentially to each other, to form an initialization signal line corresponding to the subpixels in the row. The first shielding member 404 may extend in the first direction, and may be coupled to at least one initialization signal line.

To be specific, the plurality of subpixels may be arranged in rows and columns, each row of subpixels may include a plurality of subpixels arranged in the second direction, and each column of subpixels may include a plurality of subpixels arranged in the first direction intersecting the second direction. The initialization signal line patterns of the subpixels in a same row may be coupled sequentially to each other, to form an initialization signal line corresponding to the subpixels in the row.

When the first shielding member 404 extends in the first direction and is coupled to at least one initialization signal line, it is able for the first shielding member 404 to alleviate the performance of the first transistor T1 from being adversely affected by the change in the signal transmitted through the target data line pattern, thereby to reduce the effect of the coupling between the gate electrode (i.e., 203g) of the driving transistor and the target data line pattern and reduce the vertical crosstalk, and improve the display effect of the display substrate during the display. In addition, it is able to increase the voltage across the initialization signal line, and provide a more stable voltage for the initialization signal transmitted through the initialization signal line, thereby to improve the operating performance of the subpixel driving circuitry.

Figure 9:
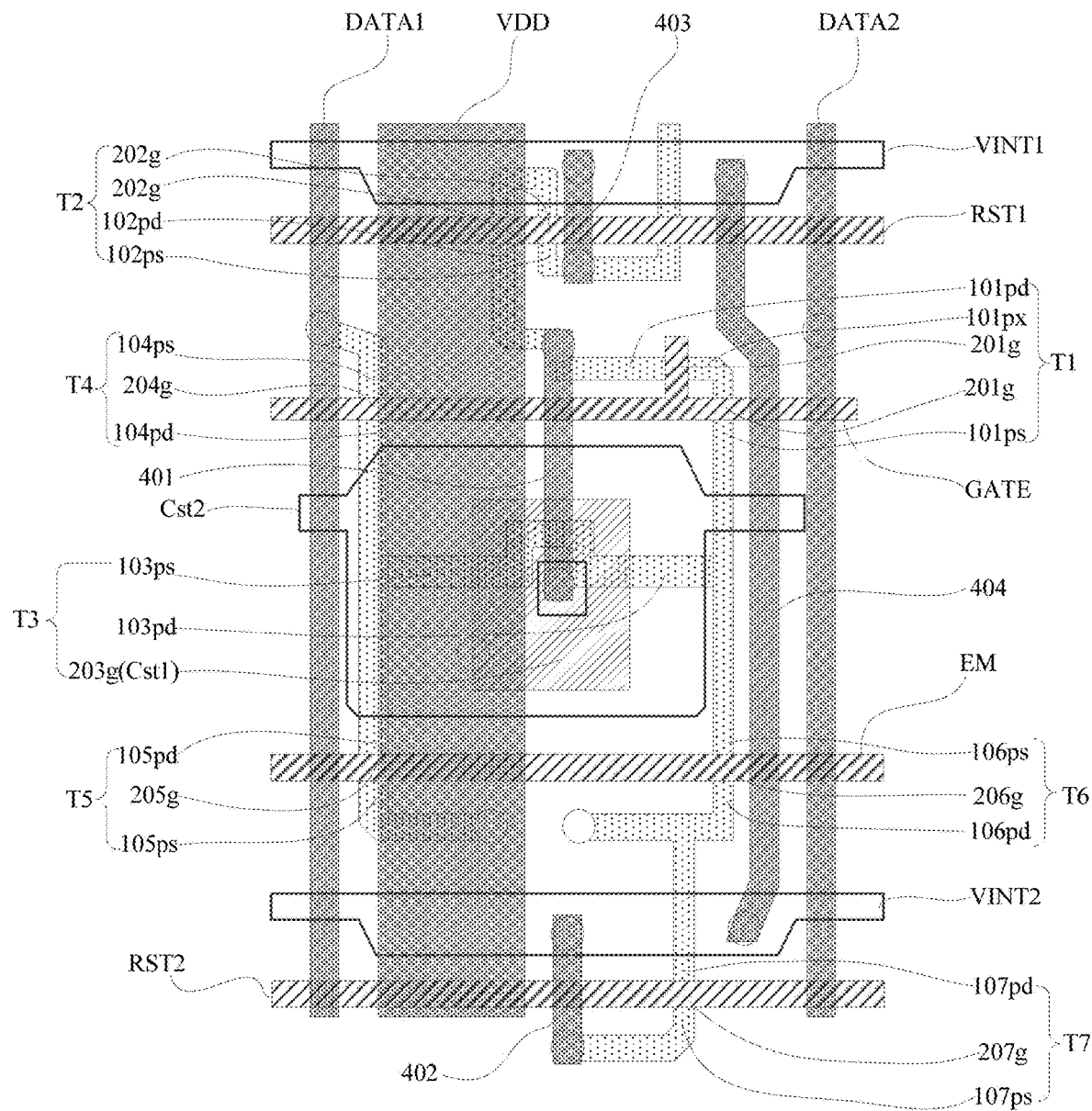
FIG. 9 is a schematic view showing a second layout of the subpixel driving circuitry in the display substrate according to an embodiment of the present disclosure.

As shown in FIG. 9, in some embodiments of the present disclosure, the first shielding member 404 may be coupled to two initialization signal lines adjacent thereto.

To be specific, when the first shielding member 404 is coupled to the initialization signal lines, the first shielding member 404 may be coupled to the initialization signal lines in various modes, and the first shielding member 404 may be of various structures and arranged in various modes. For example, as shown in FIG. 3, the first shielding member 404 may be coupled to two initialization signal lines adjacent thereto. In this arrangement mode, the orthogonal projection of the first shielding member 404 onto the base 50 may be not only arranged between the orthogonal projection of the first transistor T1 onto the base 50 and the orthogonal projection of the target data line pattern onto the base 50, but also between an orthogonal projection of the connection line 401 onto the base 50 and the orthogonal projection of the target data line pattern onto the base 50, and between an orthogonal projection of the driving transistor (i.e., the third transistor T3) onto the base 50 and the orthogonal projection of the target data line pattern onto the base 50.

Through the above arrangement mode, it is able to reduce, in a better manner, first crosstalk generated between the target signal line pattern and the first transistor T1 and second crosstalk generated between the target signal line pattern and the connection line 401, thereby to reduce the indirect crosstalk for the driving transistor caused by the first crosstalk and the second crosstalk. In addition, through the above arrangement mode, it is able to further reduce the direct crosstalk between the target signal line pattern and the driving transistor, thereby to ensure the operating performance of the display substrate in a better manner.

Referring to FIG. 3 again, in some embodiments of the present disclosure, the first shielding pattern 404 may be arranged at a layer different from the initialization signal line pattern (e.g., VINT1 in FIG. 3), and the orthogonal projection of the first shielding member 404 onto the base 50 may overlap the orthogonal projection of the initialization signal line pattern onto the base at a first overlapping region, the first shielding member 404 is coupled to the initialization signal line pattern through a first via-hole arranged in the first overlapping region.

To be specific, the first shielding member 404 may be arranged at a same layer as, or at a layer different from, the initialization signal line pattern. When the first shielding member 404 is arranged at a layer different from the initialization signal line pattern, the orthogonal projection of the first shielding member 404 onto the base 50 may overlap the orthogonal projection of the initialization signal line pattern onto the base 50 at the first overlapping region. In this way, the first shielding member 404 may be coupled to the initialization signal line through the first via-hole in the first overlapping region.

It should be appreciated that, when the first shielding member 404 is arranged at a same layer as the initialization signal line pattern, there may exist at least one of the following conditions: the first shielding member 404 and the initialization signal line pattern are located at a same horizontal plane, the first shielding member 404 and the initialization signal line pattern are located at a same film layer, the first shielding member 404 and the initialization signal line pattern are located at a surface of a same insulation layer distal to the base, and the first shielding member 404 and the initialization signal line pattern are formed through a single patterning process.

When the first shielding member 404 is arranged at a layer different from the initialization signal line pattern, there may exist at least one of the following conditions: the first shielding member 404 and the initialization signal line pattern are not located at a same film layer, and the first shielding member 404 and the initialization signal line pattern are incapable of being formed through a single patterning process.

In some embodiments of the present disclosure, the first shielding member 404 may be made of a same material as the data line pattern (e.g., DATA1 in FIG. 3).

In some embodiments of the present disclosure, the display substrate may include a first interlayer insulation layer, and the first shielding member 404 and the data line pattern (e.g., DATA1 in FIG. 3) may be arranged at a surface of the first interlayer insulation layer distal to the base.

To be specific, when the first shielding member 404 is arranged as mentioned hereinabove, it is able to simultaneously form the first shielding member 404 and the data line pattern through a single patterning process on the surface of the first interlayer insulation layer distal to the base, and omit an additional patterning process for forming the first shielding member 404, thereby to simplify the manufacture process of the display substrate in a better manner, and reduce the manufacture cost.

As shown in FIG. 3, in some embodiments of the present disclosure, the subpixel driving circuitry may further include a second transistor T2 coupled to the gate electrode of the driving transistor. The second transistor T2 may include: a first semiconductor pattern, a second semiconductor pattern, and a third conductor pattern coupled to the first semiconductor pattern and the second semiconductor pattern, electric conductivity of the third conductor pattern being superior to electric conductivity of the first semiconductor pattern and electric conductivity of the second semiconductor pattern; and a first gate electrode pattern and a second gate electrode pattern coupled to each other, an orthogonal projection of the first gate electrode pattern onto the base 50 partially overlapping an orthogonal projection of the first semiconductor pattern onto the base 50, an orthogonal projection of the second gate electrode pattern onto the base 50 partially overlapping an orthogonal projection of the second semiconductor pattern onto the base 50. An orthogonal projection of the third conductor pattern onto the base 50 may not overlap the orthogonal projection of the first gate electrode pattern onto the base 50 and the orthogonal projection of the second gate electrode pattern onto the base 50. The orthogonal projection of the third conductor pattern onto the base 50 may at least partially overlap the orthogonal projection of the initialization signal line pattern (e.g., VINT1 in FIG. 3) onto the base 50.

To be specific, as shown in FIG. 7, the second transistor T2 may be of a double-gate structure. The first semiconductor pattern and the second semiconductor pattern of the second transistor may form a channel region (corresponding to a location of the sign 102*pg* in FIG. 7) of the second transistor T2, and the third conductor pattern 102*px* of the second transistor may have the electric conductivity superior to the first semiconductor pattern and the second semiconductor pattern due to doping of the third conductor pattern 102*px*. The first gate electrode pattern and the second gate electrode pattern of the second transistor T2 may cover the first semiconductor pattern and the second semiconductor pattern respectively, and together serve as the gate electrode 202*g* of the second transistor T2.

In the second transistor T2 with the above structure, because the third conductor pattern 102*px* has excellent electric conductivity and is not covered by the gate electrode pattern, it may be easily coupled to the other neighboring conductive patterns, and thereby the crosstalk may occur. According to the embodiments of the present disclosure, when the orthogonal projection of the third conductor pattern onto the base 50 at least partially overlaps the orthogonal projection of the initialization signal line pattern (e.g., VINT1 in FIG. 3) onto the base 50, it is able for the initialization signal line pattern to shield the third conductor pattern 102*px*. Because the initialization signal at a fixed potential is transmitted on the initialization signal line pattern, it is able to reduce an effect of the coupling between the third conductor pattern 102*px* and the other neighboring conductive patterns in a better manner, thereby to provide the display substrate with stable operating performance.

As shown in FIG. 4, in some embodiments of the present disclosure, the subpixel driving circuitry may further include a first extension member extending from the first semiconductor pattern and having electric conductivity superior to the first semiconductor pattern. The first extension member may include a first portion 61, a second portion 62 and a third portion 63. The first portion 61 and the third portion 63 may each extend in the first direction, and the second portion 62 may extend in the second direction. An end of the second portion 62 may be coupled to the first portion 61, the other end of the second portion 62 may be coupled to the third portion 63, and an end of the third portion 63 distal to the second portion 62 may be coupled to the first transistor T1.

To be specific, the first extension member and the first semiconductor pattern may be formed through a single patterning process, and after the formation of the first semiconductor pattern, the first extension member may be doped so that the electric conductivity of the first extension member is superior to that of the first semiconductor pattern.

After the addition of the first shielding member 404, through the first extension member with the above-mentioned structure, it is able to further reduce the influence on the performance of the first transistor T1 and the performance of the second transistor T2 caused by the change in the signal transmitted through the target data line pattern when the second transistor T2 is coupled to the first transistor T1 and the gate electrode of the driving transistor through the first extension member, thereby to alleviate an effect of the coupling between the gate electrode (i.e., 203*g*) of the driving transistor and the target data line pattern and reduce the vertical crosstalk, and improve the display effect of the display substrate during the display.

As shown in FIGS. 3 and 4, in some embodiments of the present disclosure, the first transistor T1 may include: a fourth semiconductor pattern, a fifth semiconductor pattern, and a sixth conductor pattern coupled to the fourth semiconductor pattern and the fifth semiconductor pattern, electric conductivity of the sixth conductor pattern being superior to electric conductivity of the fourth semiconductor pattern and electric conductivity of the fifth semiconductor pattern; and a third gate electrode pattern and a fourth gate electrode pattern coupled to each other. An orthogonal projection of the third gate electrode pattern onto the base 50 may partially overlap an orthogonal projection of the fourth semiconductor pattern onto the base 50, an orthogonal projection of the fourth gate electrode pattern onto the base 50 may partially overlap an orthogonal projection of the fifth semiconductor pattern onto the base 50, and an orthogonal projection of the sixth conductor pattern onto the base 50 may not overlap the orthogonal projection of the third gate electrode pattern onto the base 50 and the orthogonal projection of the fourth gate electrode pattern onto the base 50.

To be specific, as shown in FIG. 4, the first transistor may be of a double-gate structure. The fourth semiconductor pattern and the fifth semiconductor pattern of the first transistor may form a channel region (corresponding to the sign 101*pg* in FIG. 4) of the first transistor, and the sixth conductor pattern 101*px* of the first transistor may have the electric conductivity superior to the fourth semiconductor pattern and the fifth semiconductor pattern due to doping of the sixth conductor pattern 101*px*. The third electrode pattern and the fourth gate electrode pattern of the first transistor may cover the fourth semiconductor pattern and the fifth semiconductor pattern respectively, and together serve as the gate electrode 201g of the first transistor T1.

Figure 10:
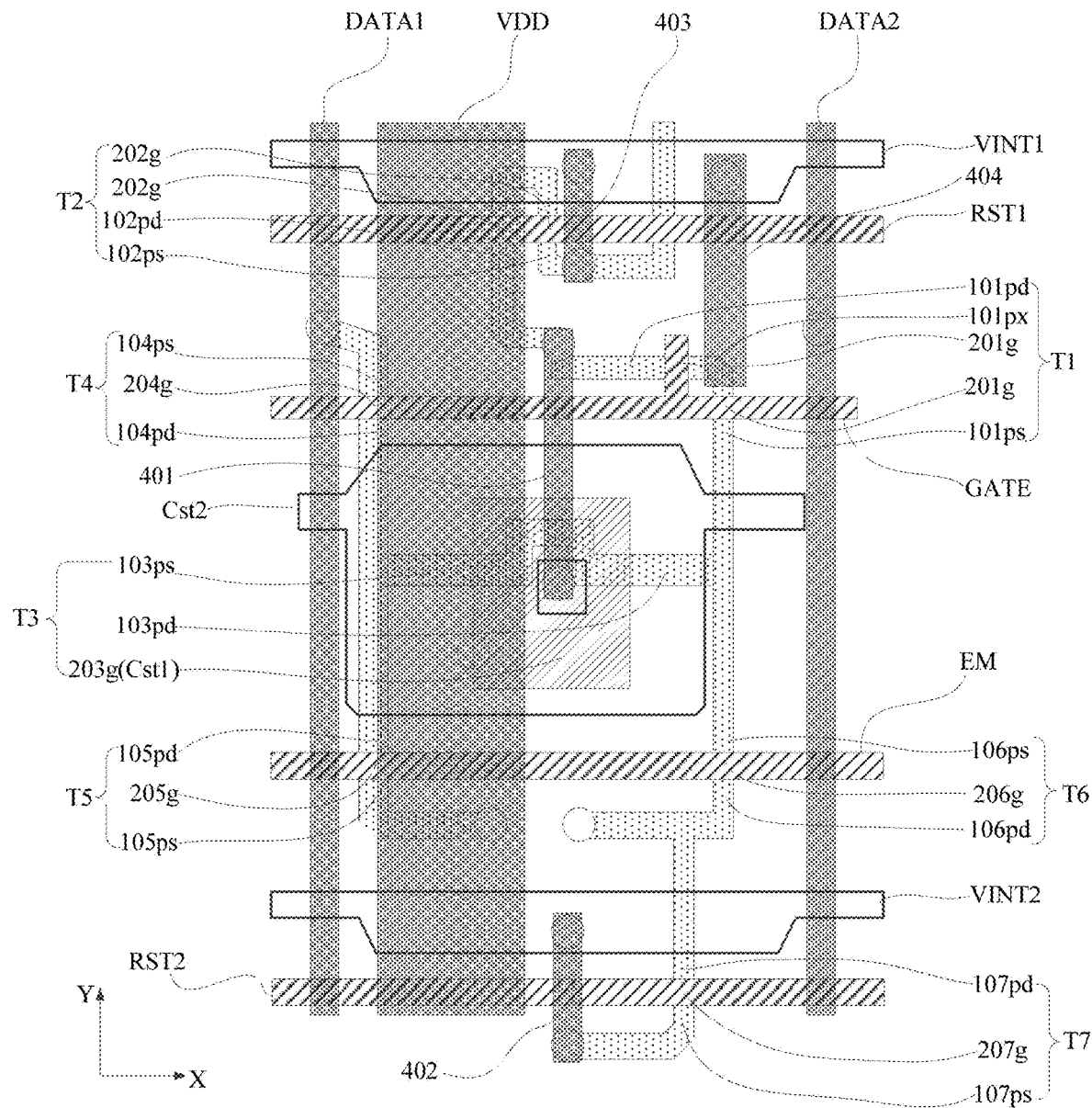
FIG. 10 is a schematic view showing a third layout of the subpixel driving circuitry in the display substrate according to an embodiment of the present disclosure.

As shown in FIG. 10, in some embodiments of the present disclosure, the orthogonal projection of the first shielding member 404 onto the base 50 may at least partially overlap the orthogonal projection of the sixth conductor pattern 101px onto the base 50.

To be specific, in the first transistor T1 with the above structure, because the sixth conductor pattern 101px has excellent electric conductivity and is not covered by the gate electrode pattern, it may be easily coupled to the other neighboring conductive patterns, and thereby the crosstalk may occur. According to the embodiments of the present disclosure, when the orthogonal projection of the first shielding member 404 onto the base 50 at least partially overlaps the orthogonal projection of the sixth conductor pattern 101px onto the base 50, it is able for the first shielding member 404 to shield the sixth conductor pattern 101px. In addition, because the first shielding member 404 has a fixed potential, it is able to reduce an effect of the coupling between the sixth conductor pattern 101px and the other conductive patterns adjacent to the sixth conductor pattern 101px in a better manner, thereby to provide the display substrate with more stable operating performance.

Figure 11:
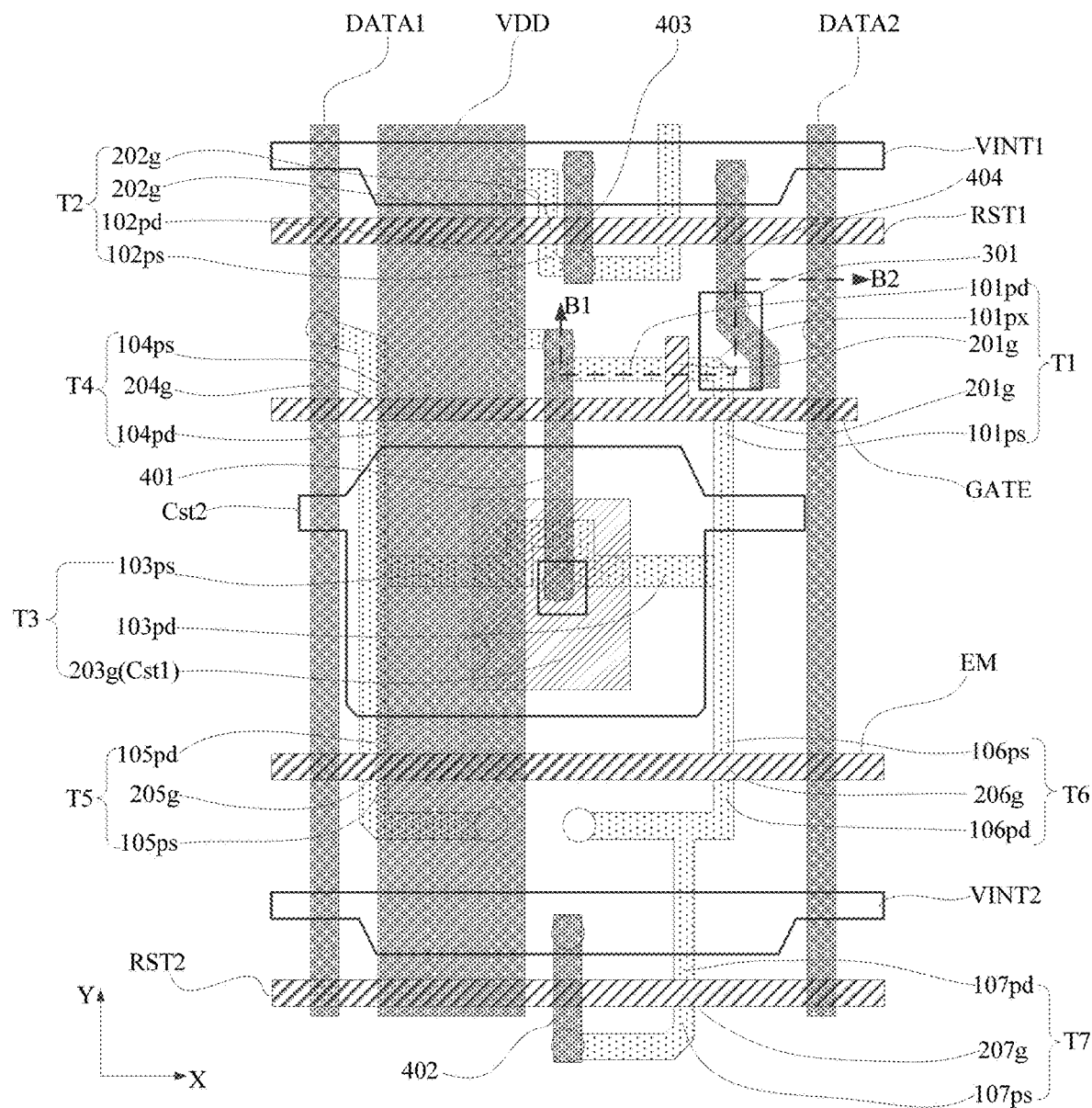
FIG. 11 is a schematic view showing a fourth layout of the subpixel driving circuitry in the display substrate according to an embodiment of the present disclosure.
Figure 12:
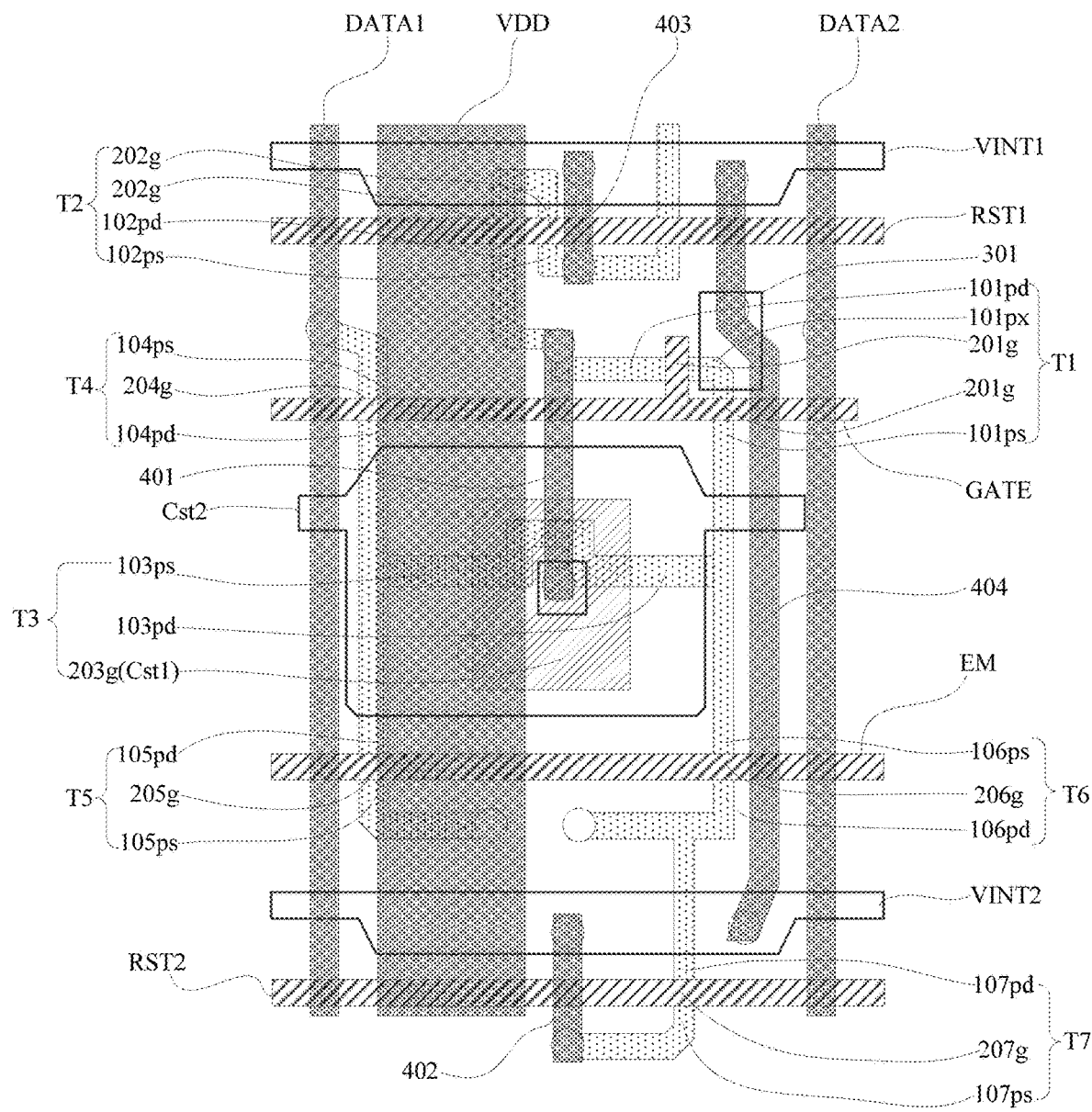
FIG. 12 is a schematic view showing a fifth layout of the subpixel driving circuitry in the display substrate according to an embodiment of the present disclosure.
Figure 13:
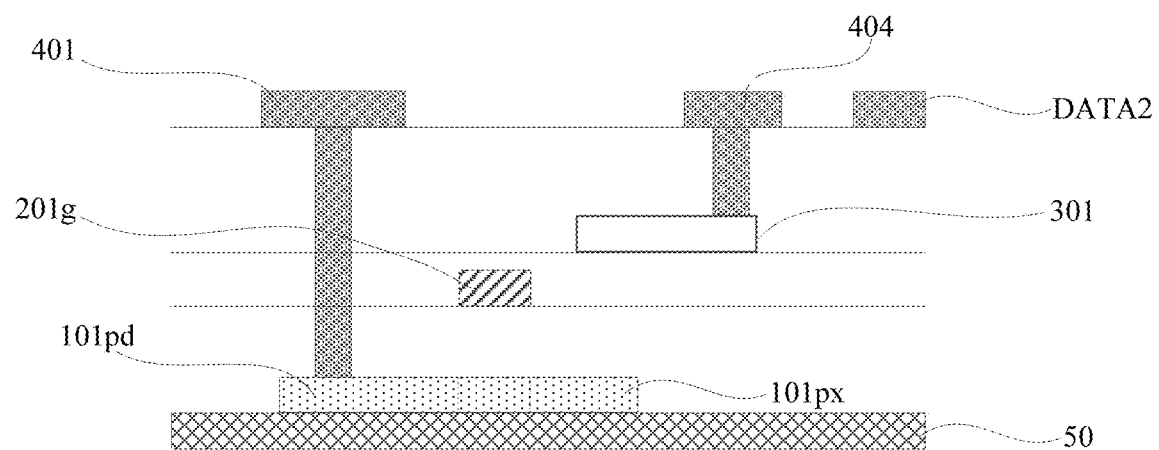
FIG. 13 is a sectional view along a line B1B2 in FIG. 11.

As shown in FIGS. 11, 12 and 13, in some embodiments of the present disclosure, the subpixel driving circuitry may further include a second shielding member 301 coupled to the first shielding member 404, and an orthogonal projection of the second shielding member 301 onto the base 50 may at least partially overlap the orthogonal projection of the sixth conductor pattern 101px onto the base 50.

To be specific, when the orthogonal projection of the second shielding member 301 onto the base 50 at least partially overlaps the orthogonal projection of the sixth conductor pattern 101px onto the base 50, the second shielding member 301 may shield the sixth conductor pattern 101px. In addition, because the second shielding member 301 is coupled to the first shielding member 404, the second shielding member 301 may have a fixed potential, so it is able to reduce the effect of the coupling between the sixth conductor pattern 101px and the other conductive patterns adjacent to the sixth conductor pattern 101px in a better manner, thereby to provide the display substrate with stable operating performance.

In the display substrate according to the embodiments of the present disclosure, because the first shielding member 404 and the second shielding member 303 each have a fixed potential, it is able to prevent or reduce the parasitic capacitance between the first transistor T1 and the target data line pattern (e.g., DATA2) in a better manner, thereby to effectively prevent or reduce the vertical crosstalk.

Further, the orthogonal projection of the second shielding member 301 onto the base 50 may cover the entire orthogonal projection of the sixth conductor pattern onto the base 50.

To be specific, when the orthogonal projection of the second shielding member 301 onto the base 50 covers the entire orthogonal projection of the sixth conductor pattern 101px onto the base 50, the second shielding pattern 301 may completely shield the sixth conductor pattern 101px, so it is able to reduce the effect of the coupling between the sixth conductor pattern 101px and the other conductive patterns adjacent to the sixth conductor pattern 101px to the greatest degree, thereby to improve the operation stability of the display substrate in a better manner.

In some embodiments of the present disclosure, the second shielding member 301 and the first shielding member 404 may be arranged at different layers, and the orthogonal projection of the second shielding member 301 onto the base 50 may overlap the orthogonal projection of the first shielding member 404 onto the base 50 at a second overlapping region, the second shielding member 301 is coupled to the first shielding member 404 through a second via-hole arranged in the second overlapping region.

To be specific, the second shielding member 301 may be arranged at a same layer as, or at a layer different from, the first shielding member 404. When the second shielding member 301 is arranged at a layer different from the first shielding member 404, the orthogonal projection of the second shielding member 301 onto the base 50 may overlap the orthogonal projection of the first shielding member 404 onto the base 50 at the second overlapping region. In this way, the second shielding member 301 may be coupled to the first shielding member 404 through the second via-hole in the second overlapping region.

In some embodiments of the present disclosure, the second shielding member 301 may be made of a same material as the initialization signal line pattern.

In some embodiments of the present disclosure, the display substrate may further include a second interlayer insulation layer, and the second shielding member 301 and the initialization signal line pattern (e.g., VINT1 in FIG. 3) may be arranged at a surface of the second interlayer insulation layer distal to the base.

To be specific, when the second shielding member 301 and the initialization signal line pattern are made of a same material, and the second shielding member 301 and the initialization signal line pattern (e.g., VINT1 in FIG. 3) are arranged at the surface of the second interlayer insulation layer distal to the base, it is able to simultaneously form the second shielding member 301 and the initialization signal line pattern through a single patterning process, and omit an additional patterning process for forming the second shielding member 301, thereby to simplify the manufacture process of the display substrate in a better manner, and reduce the manufacture cost.

As shown in FIG. 3, in some embodiments of the present disclosure, the subpixel may further include a power source signal line pattern VDD which includes a portion extending in the first direction. The subpixel driving circuitry may further include a storage capacitor Cst, a first electrode plate Cst1 of which is reused as the gate electrode of the driving transistor, and a second electrode plate Cst2 of which is coupled to the power source signal line pattern VDD and located at the surface of the second interlay insulation layer distal to the base.

To be specific, the storage capacitor Cst of the subpixel driving circuitry may include the first electrode plate Cst1 and the second electrode plate Cst2 arranged opposite to each other. The first electrode plate Cst1 may be coupled to the gate electrode of the driving transistor, and the second electrode plate Cst2 may be coupled to the power source signal line pattern VDD. During the arrangement of the storage capacitor Cst, the first electrode plate Cst1 may be directly reused as the gate electrode of the driving transistor. In this way, it is able to not only ensure the storage capacitor Cst to be coupled to the gate electrode of the driving transistor, but also reduce a space occupied by the subpixel driving circuitry, thereby to further improve the resolution of the display substrate. In addition, when the second electrode plate Cst2 of the storage capacitor Cst is arranged at the surface of the second interlayer insulation layer distal to the base, the second electrode plate Cst2 of the storage capacitor Cst may be formed simultaneously through a single patterning with the second shielding member 301 and the initialization signal line pattern, so it is able to simplify the manufacture process of the display substrate in a better manner, and reduce the manufacture cost.

Figure 14:
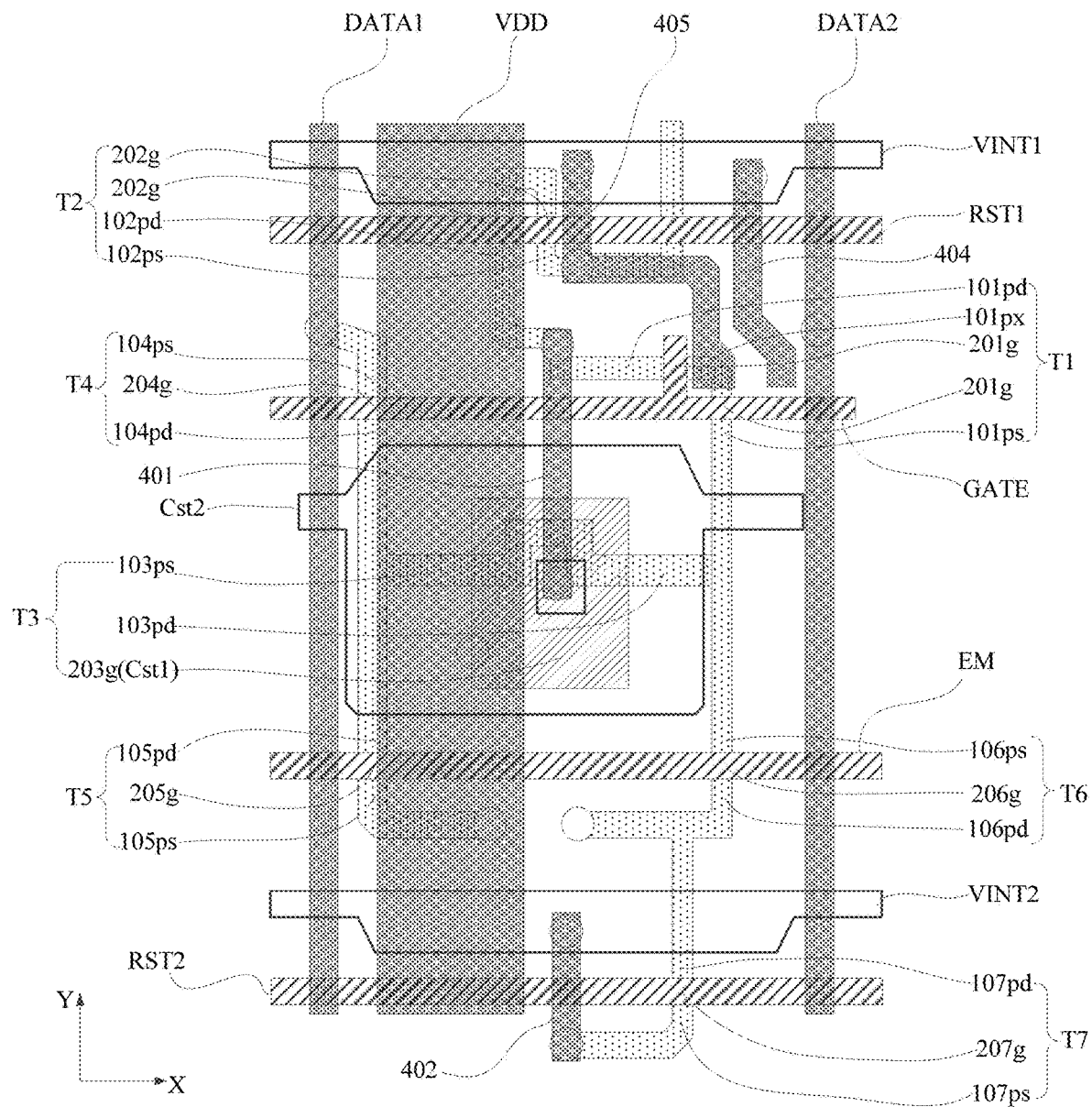
FIG. 14 is a schematic view showing a sixth layout of the subpixel driving circuitry in the display substrate according to an embodiment of the present disclosure.

As shown in FIG. 14, in some embodiments of the present disclosure, the subpixel may further include a resetting signal line pattern (e.g., RST1 in FIG. 3) extending in the second direction intersecting the first direction. The subpixel driving circuitry may further include: a first conductive connection member 405, an orthogonal projection of which onto the base 50 at least partially overlaps the orthogonal projection of the sixth conductor pattern 101*px* onto the base 50; and a second transistor T2, a first electrode (e.g., a source electrode S2) of which is coupled to the initialization signal line pattern (e.g., VINT1) through the first conductive connection member 405, a second electrode (e.g., a drain electrode D2) of which is coupled to the gate electrode of the driving transistor, and a gate electrode 202*g* of which is coupled to the resetting signal line pattern (e.g., RST1).

To be specific, the first conductive connection member 405 may be made of a metal material, and formed through a single patterning process with the data line pattern.

When the orthogonal projection of the first conductive connection member 405 onto the base 50 at least partially overlap the orthogonal projection of the sixth conductor pattern 101*px* onto the base 50, the first conductive connection member 405 may shield the sixth conductor pattern 101*px*. In addition, because the first conductive connection member 405 is coupled to the initialization signal line pattern, the first conductive connection member 405 may have a fixed potential, so it is able to reduce the effect of the coupling between the sixth conductor pattern 101*px* and the other conductive patterns adjacent to the sixth conductor pattern 101*px* in a better manner, thereby to provide the display substrate with more stable operating performance.

As shown in FIG. 3, in some embodiments of the present disclosure, the subpixel may further include a gate line pattern GATE, a light-emission control signal line pattern EM, a resetting signal line pattern (e.g., RST1 in FIG. 3) and a power source signal line pattern VDD. The gate line pattern GATE, the light-emission control signal line pattern EM and the resetting signal line pattern may extend in the second direction, and the power source signal line pattern VDD may include a portion extending in the first direction.

The subpixel driving circuitry may further include a second transistor T2, a fourth transistor T4, a fifth transistor T5, a sixth transistor T6 and a seventh transistor T7. A gate electrode of the driving transistor (e.g., the gate electrode 203*g* of the third transistor T3) may be coupled to the second electrode of the first transistor T1, a first electrode of the driving transistor may be coupled to a second electrode of the fifth transistor T5, and a second electrode of the driving transistor may be coupled to the first electrode of the first transistor T1. The gate electrode 201*g* of the first transistor T1 may be coupled to the gate line pattern GATE. A gate electrode 202*g* of the second transistor T2 may be coupled to the resetting signal line pattern, a first electrode of the second transistor T2 may be coupled to the initialization signal line pattern, and a second electrode of the second transistor T2 may be coupled to the gate electrode of the driving transistor. A gate electrode 204*g* of the fourth transistor T4 may be coupled to the gate line pattern GATE, a first electrode of the fourth transistor T4 may be coupled to the data line pattern (e.g., DATA1 in FIG. 3), and a second electrode of the fourth transistor T4 may be coupled to the first electrode of the driving transistor. A gate electrode 205*g* of the fifth transistor T5 may be coupled to the light-emission control signal line pattern EM, and a first electrode of the fifth transistor T5 may be coupled to the power source signal line pattern VDD. A gate electrode 206*g* of the sixth transistor T6 may be coupled to the light-emission control signal line pattern EM, a first electrode of the sixth transistor T6 may be coupled to the second electrode of the driving transistor, and a second electrode of the sixth transistor T6 may be coupled to a light-emitting element of the subpixel. A gate electrode 207*g* of the seventh transistor T7 may be coupled to a resetting signal line pattern (e.g., RST2) of a next adjacent subpixel in the first direction, a first electrode of the seventh transistor T7 may be coupled to an initialization signal line pattern (e.g., VINT2) of the next adjacent subpixel, and a second electrode of the seventh transistor T7 may be coupled to the light-emitting element of the subpixel.

To be specific, in the above display substrate, the plurality of subpixels may be arranged in an array form, i.e., in rows and columns. Each row of subpixels may include a plurality of subpixels arranged in the second direction, and each column of subpixels may include a plurality of subpixels arranged in the first direction intersecting the second direction.

It should be appreciated that, the next adjacent subpixel in the first direction may be just a next subpixel adjacent to the seventh transistor in a same column.

When the subpixel and the subpixel driving circuitry thereof have the above-mentioned structures, it is able to effectively reduce the layout space occupied by the subpixel driving circuitry in the case of ensuring the operating performance of the subpixel driving circuitry, and increase the resolution of the display substrate.

It should be appreciated that, the gate electrode of each transistor in the subpixel driving circuitry may be formed integrally with a functional pattern coupled thereto. For example, the gate electrode of the first transistor and the gate electrode of the fourth transistor may be formed integrally with the corresponding gate line pattern coupled thereof, the gate electrode of the fifth transistor and the gate electrode of the sixth transistor may be formed integrally with the corresponding light-emission control signal line pattern coupled thereof, and the gate electrode of the second transistor and the gate electrode of the seventh transistor may be formed integrally with the corresponding resetting signal line pattern coupled thereto.

In addition, the first transistor T1 is configured to perform threshold compensation on the driving transistor (e.g., the third transistor T3), the second transistor T2 is configured to reset the gate electrode of the driving transistor, the fourth transistor T4 is configured to write a data signal from the data line pattern, the fifth transistor T5 is configured to write a power source signal from the power source signal line pattern into the first electrode of the driving transistor, the sixth transistor T6 is configured to control the corresponding light-emitting element to emit light or not, and the seventh transistor T7 is configured to reset the anode of the light-emitting element.

In some embodiments of the present disclosure, the subpixel may further include a gate line pattern GATE, a light-emission control signal line pattern EM, a resetting signal line pattern RST and a power source signal line pattern VDD. Each of the gate line pattern GATE, the light-emission control signal line pattern EM and the resetting signal line pattern RST may extend in the second direction, the power source signal line pattern VDD may include a portion extending in the first direction, and the orthogonal projection of the first shielding member 404 onto the base 50 may partially overlap an orthogonal projection of the gate line pattern GATE onto the base 50 and an orthogonal projection of the light-emission control signal line pattern EM onto the base 50.

To be specific, when the first shielding member 404 is arranged as mentioned hereinabove, the first shielding member 404 may be used to separate the first transistor T1 and the driving transistor from the target data line pattern (e.g., DATA2), so as to further reduce the crosstalk for the first transistor T1 and the driving transistor caused by the change in the data signal on the target data line pattern.

In some embodiments of the present disclosure, the second electrode of the seventh transistor T7 may be coupled to the light-emitting element of the subpixel in various modes. For example, an orthogonal projection of the anode of the light-emitting element onto the base may overlap an orthogonal projection of the second electrode of the seventh transistor T7 onto the base at an overlapping region, and the anode of the light-emitting element is coupled to the second electrode of the seventh transistor T7 through a via-hole arranged in the overlapping region. Alternatively, the orthogonal projection of the anode of the light-emitting element onto the base may not overlap the orthogonal projection of the second electrode of the seventh transistor T7 onto the base. The subpixel driving circuitry may further include a second conductive connection member 406 and a third conductive connection member 407. The orthogonal projection of the anode of the light-emitting element onto the base may overlap an orthogonal projection of a first end of the third conductive connection member 407 onto the base at an overlapping region, the anode of the light-emitting element is coupled to the first end of the third conductive connection member 407 through a via-hole arranged in the overlapping region. A second end of the third conductive connection member 407 may overlap a first end of the second conductive connection member 406. A second end of the third conductive connection member 407 may be coupled to a first end of the second conductive connection member 406 through the via-hole in the overlapping region. The orthogonal projection of the second electrode of the seventh transistor T7 onto the base may overlap an orthogonal projection of a second end of the second conductive connection member 406 onto the base at an overlapping region, the second electrode of the seventh transistor T7 is coupled to the second end of the second conductive connection member 406 through a via-hole arranged in the overlapping region. In this way, the anode of the light-emitting element may be coupled to the second electrode of the seventh transistor T7 through the second conductive connection member 406 and the third conductive connection member 407.

When the anode of the light-emitting element is coupled to the second electrode of the seventh transistor T7 through the second conductive connection member 406 and the third conductive connection member 407, the second conductive connection member 406 may include a portion extending in the first direction. The anode of the light-emitting element may be arranged at an upper side of the light-emission control signal line pattern of the subpixel corresponding to the light-emitting element, and the second electrode of the seventh transistor T7 may be arranged at a lower side of the light-emission control signal line pattern of the corresponding subpixel.

Figure 15:
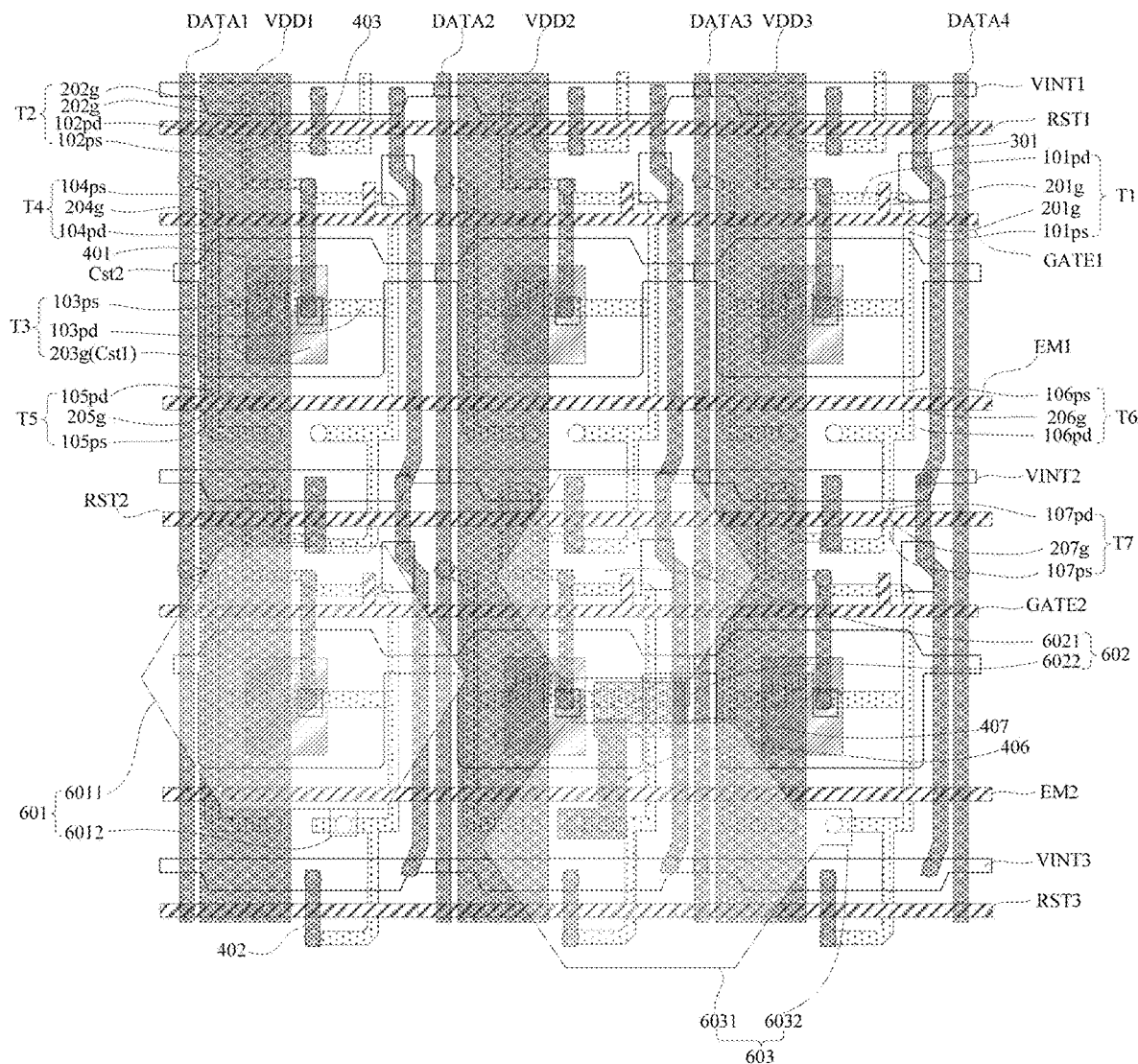
FIG. 15 is a schematic view showing a first layout of a plurality of subpixels in the display substrate according to an embodiment of the present disclosure.
Figure 24:
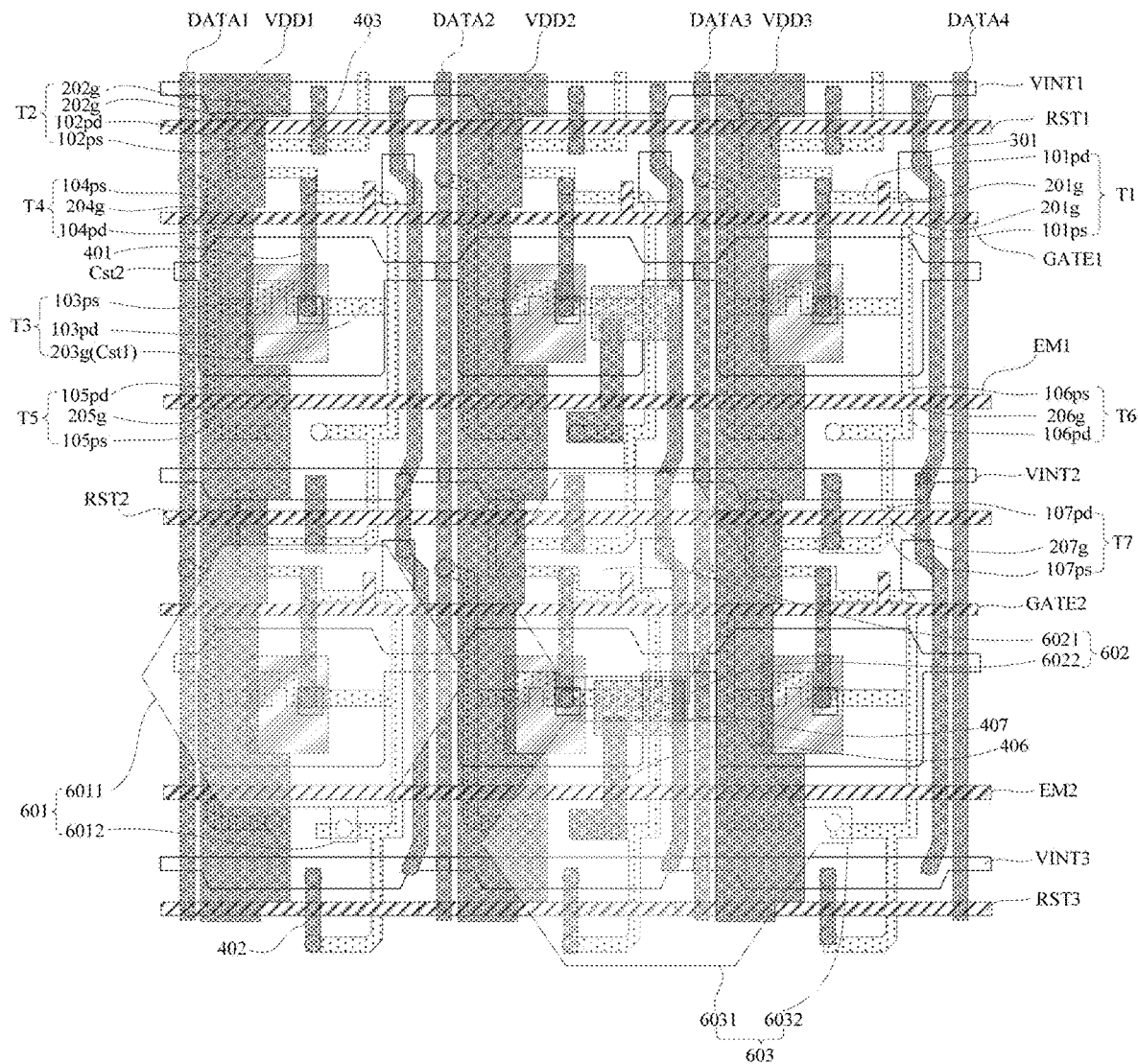
FIG. 24 is a schematic view showing a second layout of the plurality of subpixels in the display substrate according to an embodiment of the present disclosure.

As shown in FIGS. 15 and 24, the structures of the subpixels in three colors will be described hereinafter.

The light-emitting element of a subpixel in a first color may include a first anode 601, a first organic light-emitting material layer and a first cathode laminated one on another in the direction away from the base. An orthogonal projection of the first anode 601 onto the base may partially overlap the orthogonal projection of the second electrode of the corresponding seventh transistor T7 onto the base at an overlapping region, the first anode 601 is coupled to the second electrode of the corresponding seventh transistor T7 through a via-hole arranged in the overlapping region.

The light-emitting element of a subpixel in a second color may include a second anode 602, a second organic light-emitting material layer and a second cathode laminated one on another in that order in the direction away from the base. An orthogonal projection of the second anode 602 onto the base may not overlap the orthogonal projection of the second electrode of the corresponding seventh transistor T7 onto the base. The subpixel driving circuitry of the subpixel in the second color may further include a second conductive connection member 406 and a third conductive connection member 407, and the second anode 602 may be coupled to the second electrode of the corresponding seventh transistor T7 through the second conductive connection member 406 and the third conductive connection member 407.

The light-emitting element of a subpixel in a third color may include a third anode 603, a third organic light-emitting material layer and a third cathode laminated one on another in that order in the direction away from the base. An orthogonal projection of the third anode 603 onto the base may partially overlap the orthogonal projection of the second electrode of the corresponding seventh transistor T7 onto the base at an overlapping region, the third anode 603 is coupled to the second electrode of the corresponding seventh transistor T7 through a via-hole arranged in the overlapping region.

For example, as shown in FIG. 15, the anode of the organic light-emitting element of the subpixel in each color may include a body electrode and a connection electrode, and the body electrode may be of a hexagonal shape.

As shown in FIG. 15, the first anode 601 of the subpixel in the first color may include a first body electrode 6011 and a first connection electrode 6012 which are formed integrally. The first connection electrode 6012 may be coupled to the second electrode of the seventh transistor T7 of the subpixel in the first color through a connection hole. The second anode 602 of the subpixel in the second color may include a second body electrode 6021 and a second connection electrode 6022 which are formed integrally. The second connection electrode 6022 may be coupled to the second electrode of the seventh transistor T7 of the subpixel in the second color through the second conductive connection member 406 and the third conductive connection member 407. The third anode 603 of the subpixel in the third color may include a third body electrode 6031 and a third connection electrode 6032 which are formed integrally. The third connection electrode 6032 may be connected to the second electrode of the seventh transistor T7 of the subpixel in the third color through a connection hole.

For example, the first connection electrode 6012 of the subpixel in the first color may be arranged at a side of a center of the first body electrode 6011 distal to the data line pattern of the subpixel driving circuitry in the direction X, and at a side a center of the first body electrode 6011 distal to the light-emission control signal line of the subpixel driving circuitry in the direction Y. For example, the first connection electrode 6012 and the first body electrode 6011 of the subpixel in the first color may be arranged in the direction Y, and the first connection electrode 6012 may be located at a lower right corner of the first body electrode 6011. For example, the second connection electrode 6022 of the subpixel in the second color may be arranged at a side of a center of the second body electrode 6021 distal to the data line of the subpixel driving circuitry in the direction X, and at a side of a center of the second body electrode 6021 close to the light-emission control signal line of the subpixel driving circuitry in the direction Y. For example, the second connection electrode 6022 and the second body electrode 6021 of the subpixel in the second color may be arranged in the direction Y, and the second connection electrode 6022 may be located at a lower right corner of the first body electrode 1231. For example, the third connection electrode 6032 and the third body electrode 6031 of the subpixel in the third color may be arranged in the direction X, and the third connection electrode 6032 may be arranged at a right side of the third body electrode 6031, i.e., at a side of the subpixel driving circuitry close to the shielding line.

As shown in FIG. 15, the first body electrode 6011 of the first anode 601 of the subpixel in the first color may cover the driving transistor of the subpixel in the first color, the second body electrode 6021 of the second anode 602 of the subpixel in the second color may substantially not overlap, or may partially overlap, the driving transistor of the subpixel in the second color, and the third body electrode 6031 of the third anode 603 of the subpixel in the third color may not overlap the driving transistor of the subpixel in the third color.

As shown in FIG. 15, the first body electrode 6011 of the subpixel 601 in the first color (e.g., a blue subpixel) may overlap the gate line pattern and the light-emission control signal line pattern, the second body electrode 6021 of the subpixel in the second color (e.g., a red subpixel) may overlap the gate line pattern and the resetting signal line pattern, and the third body electrode 6031 of the subpixel in the third color (e.g., a green subpixel) may overlap the light-emission control signal line pattern, the resetting signal line pattern of the subpixel driving circuitry in a next row, and the initialization signal line pattern of the subpixel driving circuitry in the next row. For example, the third body electrode 6031 of the subpixel in the third color (e.g., the green subpixel) may overlap a pixel driving circuitry region of a subpixel in the first color (e.g., a blue subpixel) being adjacent to the subpixel in the third color and in a next row.

For example, the first body electrode 6011 of the subpixel 601 in the first color may partially overlap the driving transistor of an adjacent subpixel in the third color, and overlap the data line pattern of the subpixel driving circuitry of the subpixel 601, the first shielding member 404, and the data line pattern in the subpixel driving circuitry of an adjacent subpixel in the second color. The second body electrode 6021 of the subpixel in the second color may not overlap the data line pattern of the subpixel driving circuitry of the subpixel in the second color, but overlap the power source signal line pattern of the subpixel driving circuitry of the subpixel in the second color, and the power source signal line pattern and the data line pattern of the subpixel driving circuitry of an adjacent subpixel in the third color. The third body electrode 6031 of the subpixel in the third color may overlap the data line pattern and the power source signal line pattern of the subpixel driving circuitry of the subpixel in the third color, and overlap the power source signal line pattern of the subpixel driving circuitry of the adjacent subpixel in the second color.

For example, as shown in FIG. 15, the first connection electrode 6012 coupled to the first body electrode 6011 of the subpixel 601 in the first color may be arranged at a side of the first body electrode 6011 close to the resetting signal line pattern in a next row, the second connection electrode 6022 coupled to the second body electrode 6021 of the subpixel in the second color may be arranged at a side of the second body electrode 6021 close to the resetting signal line pattern in a next row, and the third connection electrode 6032 connected to the third body electrode 6031 of the subpixel in the third color may be arranged at a side of the third body electrode 6031 close to the seventh transistor T7 thereof.

For example, as shown in FIG. 15, the first connection electrode 6012 of the subpixel 601 in the first color may overlap the second electrode of the seventh transistor T7 of the subpixel driving circuitry of the subpixel 601 in the first color. The second connection electrode 6022 of the subpixel in the second color may not overlap the second electrode of the seventh transistor T7 of the subpixel driving circuitry of the subpixel in the second color, but the second electrode of the seventh transistor T7 of the subpixel in the second color may overlap the third body electrode 6031 of the subpixel in the third color. The third connection electrode 6032 of the subpixel in the third color may overlap the second electrode of the seventh transistor T7 of the subpixel driving circuitry of the subpixel in the third color.

Figure 26:
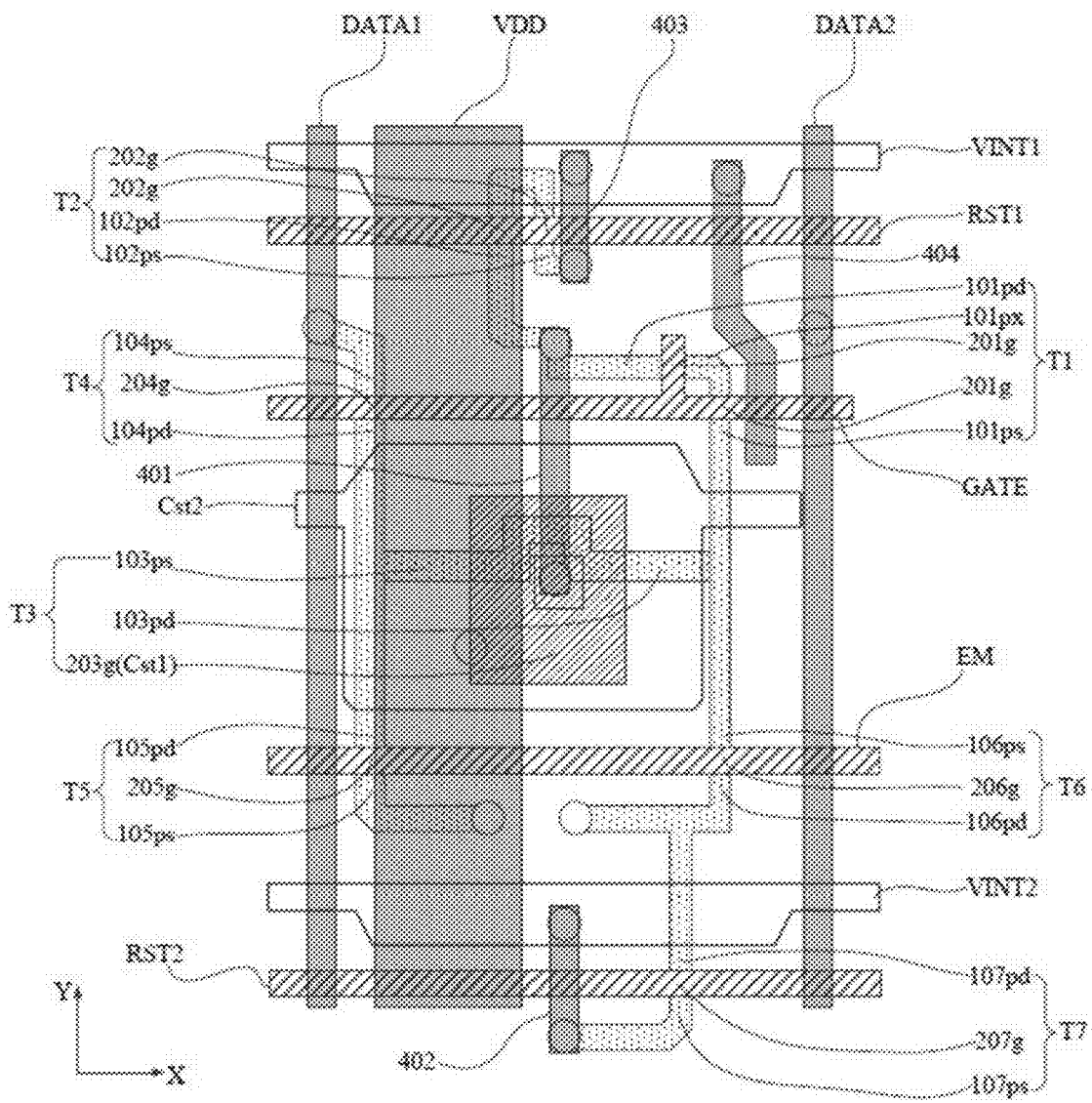
FIG. 26 is a schematic view showing an eleventh layout of the subpixel driving circuitry in the display substrate according to an embodiment of the present disclosure.

As shown in FIG. 26, the present disclosure further provides in some embodiments a display substrate, which includes a base 60 and a plurality of subpixels arranged on the base 50 in an array form. The subpixel includes: a data line pattern (e.g., DATA1) extending in a first direction; an initialization signal line pattern (e.g., VINT1) including a portion extending in a second direction intersecting the first direction, the initialization signal line pattern being configured to transmit an initialization signal at a fixed potential; and a subpixel driving circuitry including a driving transistor (e.g., a third transistor T3), a first transistor T1 coupled to a gate electrode of the driving transistor, and a first shielding member 404 coupled to the initialization signal line pattern and configured to form a coupling capacitor with a first electrode (i.e., a source electrode S1) of the first transistor T1. An orthogonal projection of the first shielding member 404 onto the base 50 does not overlap an orthogonal projection of a target data line pattern (e.g., DATA2) onto the base 50, and the target data line pattern is included in a next subpixel adjacent to the subpixel in the second direction.

To be specific, usually the display substrate may include the plurality of subpixels arranged in an array form, and each subpixel may include the data line pattern (e.g., DATA1 in FIG. 3) extending in the first direction, and the initialization signal line pattern (e.g., VINT1 in FIG. 3), at least a portion of which extends in the second direction. The data line pattern is configured to transmit a data signal, and the initialization signal line pattern is configured to transmit an initialization signal at a fixed potential. For example, the first direction may include the direction Y, and the second direction may include the direction X.

The target data line pattern may be a data line pattern of a next subpixel adjacent to a current subpixel in the second direction.

Each subpixel may further include subpixel driving circuitries and light-emitting elements corresponding to the subpixel driving circuitries respectively. The light-emitting element may include an anode, an organic light-emitting material layer and a cathode laminated one on another. The anode of the light-emitting element may be coupled to the corresponding subpixel driving circuitry, and the light-emitting element may emit light under the control of a driving signal from the subpixel driving circuitry.

More specifically, as shown in FIGS. 1, 3 and 4, when the subpixel driving circuitry includes a 7T1C-based subpixel driving circuitry, the gate electrode 203g of the third transistor T3 (i.e., the driving transistor) may be coupled to the drain electrode D1 of the first transistor T1 through a connection line 401, and the drain electrode D3 of the third transistor T3 may be coupled to the source electrode S1 of the first transistor T1. In the direction X, a minimum distance between an orthogonal projection of the first channel region 101pg of the first transistor T1 onto the base 50 and an orthogonal projection of the target data line pattern (e.g., DATA2 in FIG. 3) onto the base 50 may be smaller than a minimum distance between an orthogonal projection of the third channel region 103pg of the third transistor T3 onto the base 50 and the orthogonal projection of the target data line pattern onto the base 50. It should be appreciated that, the minimum distance between the orthogonal projection of the channel region (e.g., the first channel region 101pg and the third channel region 103pg) onto the base 50 and the orthogonal projection of the target data line pattern (e.g., DATA2 in FIG. 3) onto the base 50 may refer to a minimum distance between an edge of the orthogonal projection of the channel region onto the base 50 closest to the target data line pattern and the orthogonal projection of the target data line pattern (e.g., DATA2 in FIG. 3) onto the base 50.

In the subpixel driving circuitry with the above structure, when a data signal transmitted through the target data line pattern changes, the performance of the first transistor T1 may be affected. Because the first transistor T1 is coupled to the third transistor T3 through the connection line 401, the operating performance of the third transistor T3 may be affected too.

According to the embodiments of the present disclosure, the subpixel driving circuitry is provided with the first shielding member 404 coupled to the initialization signal line pattern (e.g., VINT1 in FIG. 3), so as to provide the first shielding member 404 with a same fixed potential as the initialization signal. In addition, the first shielding member 404 may form the coupling capacitor with the first electrode (i.e., the source electrode S1) of the first transistor T1, so it is able to reduce, through the first shielding member 404, the influence caused by the change in the signal transmitted through the target data line pattern on the performance of the first transistor T1, thereby to reduce an effect of the coupling between the gate electrode (i.e., 203g) of the driving transistor and the target data line pattern and reduce the vertical crosstalk, and improve a display effect of the display substrate during the display.

In addition, when the first shielding member 404 is coupled to the initialization signal line pattern, it is able to, apart from providing the first shielding member 404 with the fixed potential, increase a voltage across the initialization signal line pattern and provide a more stable voltage for the initialization signal transmitted on the initialization signal line pattern, thereby to improve the operating performance of the subpixel driving circuitry.

It should be appreciated that, apart from being coupled to the initialization signal line pattern, the first shielding member 404 may also be coupled to the power source signal line pattern VDD of the subpixel, so as to enable the first shielding member 404 to be at a same fixed potential as the power source signal transmitted through the power source signal line pattern VDD.

When the first shielding member 404 is coupled to the power source signal line pattern VDD, although the first shielding member 404 is maintained at the fixed potential, a parasitic capacitance generated by the power source signal line pattern VDD may increase. At this time, an RC loading of the power source signal line pattern may increase, and thereby it is adverse to the alleviation of the vertical crosstalk.

As shown in FIG. 3, in some embodiments of the present disclosure, the gate electrode 201g of the first transistor T1 may be formed integrally with the gate line pattern GATE, and the gate electrode 201g of the first transistor T1 may be a portion of a resultant integral structure capable of forming an overlapping region with the active film layer in a direction perpendicular to the base.

As shown in FIG. 3, in some embodiments of the present disclosure, the plurality of subpixels may be arranged in a plurality of rows, and each row of subpixels may include a plurality of subpixels arranged in the second direction. The initialization signal line patterns of the subpixels in a same row may be coupled sequentially to each other, to form an initialization signal line corresponding to the subpixels in the row. The first shielding member 404 may extend in the first direction, and may be coupled to at least one initialization signal line.

To be specific, the plurality of subpixels may be arranged in rows and columns, each row of subpixels may include a plurality of subpixels arranged in the second direction, and each column of subpixels may include a plurality of subpixels arranged in the first direction intersecting the second direction. The initialization signal line patterns of the subpixels in a same row may be coupled sequentially to each other, to form an initialization signal line corresponding to the subpixels in the row.

When the first shielding member 404 extends in the first direction and is coupled to at least one initialization signal line, it is able for the first shielding member 404 to alleviate the performance of the first transistor T1 from being adversely affected by the change in the signal transmitted through the target data line pattern, thereby to reduce the effect of the coupling between the gate electrode (i.e., 203g) of the driving transistor and the target data line pattern and reduce the vertical crosstalk, and improve the display effect of the display substrate during the display. In addition, it is able to increase the voltage across the initialization signal line, and provide a more stable voltage for the initialization signal transmitted through the initialization signal line, thereby to improve the operating performance of the subpixel driving circuitry.

As shown in FIG. 9, in some embodiments of the present disclosure, the first shielding member 404 may be coupled to two initialization signal lines adjacent thereto.

To be specific, when the first shielding member 404 is coupled to the initialization signal lines, the first shielding member 404 may be coupled to the initialization signal lines in various modes, and the first shielding member 404 may be of various structures and arranged in various modes. For example, as shown in FIG. 3, the first shielding member 404 may be coupled to two initialization signal lines adjacent thereto. In this arrangement mode, the orthogonal projection of the first shielding member 404 onto the base 50 may be not only arranged between the orthogonal projection of the first transistor T1 onto the base 50 and the orthogonal projection of the target data line pattern onto the base 50, but also between an orthogonal projection of the connection line 401 onto the base 50 and the orthogonal projection of the target data line pattern onto the base 50, and between an orthogonal projection of the driving transistor (i.e., the third transistor T3) onto the base 50 and the orthogonal projection of the target data line pattern onto the base 50.

Through the above arrangement mode, it is able to reduce, in a better manner, first crosstalk generated between the target signal line pattern and the first transistor T1 and second crosstalk generated between the target signal line pattern and the connection line 401, thereby to reduce the indirect crosstalk for the driving transistor caused by the first crosstalk and the second crosstalk. In addition, through the above arrangement mode, it is able to further reduce the direct crosstalk between the target signal line pattern and the driving transistor, thereby to ensure the operating performance of the display substrate in a better manner.

Referring to FIG. 3 again, in some embodiments of the present disclosure, the first shielding pattern 404 may be arranged at a layer different from the initialization signal line pattern (e.g., VINT1 in FIG. 3), and the orthogonal projection of the first shielding member 404 onto the base 50 may overlap the orthogonal projection of the initialization signal line pattern onto the base at a first overlapping region, the first shielding member 404 is coupled to the initialization signal line pattern through a first via-hole arranged in the first overlapping region.

To be specific, the first shielding member 404 may be arranged at a same layer as, or at a layer different from, the initialization signal line pattern. When the first shielding member 404 is arranged at a layer different from the initialization signal line pattern, the orthogonal projection of the first shielding member 404 onto the base 50 may overlap the orthogonal projection of the initialization signal line pattern onto the base 50 at the first overlapping region. In this way, the first shielding member 404 may be coupled to the initialization signal line through the first via-hole in the first overlapping region.

It should be appreciated that, when the first shielding member 404 is arranged at a same layer as the initialization signal line pattern, there may exist at least one of the following conditions: the first shielding member 404 and the initialization signal line pattern are located at a same horizontal plane, the first shielding member 404 and the initialization signal line pattern are located at a same film layer, the first shielding member 404 and the initialization signal line pattern are located at a surface of a same insulation layer distal to the base, and the first shielding member 404 and the initialization signal line pattern are formed through a single patterning process.

When the first shielding member 404 is arranged at a layer different from the initialization signal line pattern, there may exist at least one of the following conditions: the first shielding member 404 and the initialization signal line pattern are not located at a same film layer, and the first shielding member 404 and the initialization signal line pattern are incapable of being formed through a single patterning process.

In some embodiments of the present disclosure, the first shielding member 404 may be made of a same material as the data line pattern (e.g., DATA1 in FIG. 3).

In some embodiments of the present disclosure, the display substrate may include a first interlayer insulation layer, and the first shielding member 404 and the data line pattern (e.g., DATA1 in FIG. 3) may be arranged at a surface of the first interlayer insulation layer distal to the base.

To be specific, when the first shielding member 404 is arranged as mentioned hereinabove, it is able to simultaneously form the first shielding member 404 and the data line pattern through a single patterning process on the surface of the first interlayer insulation layer distal to the base, and omit an additional patterning process for forming the first shielding member 404, thereby to simplify the manufacture process of the display substrate in a better manner, and reduce the manufacture cost.

As shown in FIG. 3, in some embodiments of the present disclosure, the subpixel driving circuitry may further include a second transistor T2 coupled to the gate electrode of the driving transistor. The second transistor T2 may include: a first semiconductor pattern, a second semiconductor pattern, and a third conductor pattern coupled to the first semiconductor pattern and the second semiconductor pattern, electric conductivity of the third conductor pattern being superior to electric conductivity of the first semiconductor pattern and electric conductivity of the second semiconductor pattern; and a first gate electrode pattern and a second gate electrode pattern coupled to each other, an orthogonal projection of the first gate electrode pattern onto the base 50 partially overlapping an orthogonal projection of the first semiconductor pattern onto the base 50, an orthogonal projection of the second gate electrode pattern onto the base 50 partially overlapping an orthogonal projection of the second semiconductor pattern onto the base 50. An orthogonal projection of the third conductor pattern onto the base 50 may not overlap the orthogonal projection of the first gate electrode pattern onto the base 50 and the orthogonal projection of the second gate electrode pattern onto the base 50. The orthogonal projection of the third conductor pattern onto the base 50 may at least partially overlap the orthogonal projection of the initialization signal line pattern (e.g., VINT1 in FIG. 3) onto the base 50.

To be specific, as shown in FIG. 7, the second transistor T2 may be of a double-gate structure. The first semiconductor pattern and the second semiconductor pattern of the second transistor may form a channel region (corresponding to a location of the sign 102pg in FIG. 7) of the second transistor T2, and the third conductor pattern 102px of the second transistor may have the electric conductivity superior to the first semiconductor pattern and the second semiconductor pattern due to doping. The first gate electrode pattern and the second gate electrode pattern of the second transistor T2 may cover the first semiconductor pattern and the second semiconductor pattern respectively, and together serve as the gate electrode 202g of the second transistor T2.

In the second transistor T2 with the above structure, because the third conductor pattern 102px has excellent electric conductivity and is not covered by the gate electrode pattern, it may be easily coupled to the other neighboring conductive patterns, and thereby the crosstalk may occur. According to the embodiments of the present disclosure, when the orthogonal projection of the third conductor pattern onto the base 50 at least partially overlaps the orthogonal projection of the initialization signal line pattern (e.g., VINT1 in FIG. 3) onto the base 50, it is able for the initialization signal line pattern to shield the third conductor pattern 102px. Because the initialization signal at a fixed potential is transmitted on the initialization signal line pattern, it is able to reduce an effect of the coupling between the third conductor pattern 102px and the other neighboring conductive patterns in a better manner, thereby to provide the display substrate with stable operating performance.

As shown in FIG. 4, in some embodiments of the present disclosure, the subpixel driving circuitry may further include a first extension member extending from the first semiconductor pattern and having electric conductivity superior to the first semiconductor pattern. The first extension member may include a first portion 61, a second portion 62 and a third portion 63. The first portion 61 and the third portion 63 may each extend in the first direction, and the second portion 62 may extend in the second direction. An end of the second portion 62 may be coupled to the first portion 61, the other end of the second portion 62 may be coupled to the third portion 63, and an end of the third portion 63 distal to the second portion 62 may be coupled to the first transistor T1.

To be specific, the first extension member and the first semiconductor pattern may be formed through a single patterning process, and after the formation of the first semiconductor pattern, the first extension member may be doped so that the electric conductivity of the first extension member is superior to the first semiconductor pattern.

After the addition of the first shielding member 404, through the first extension member with the above-mentioned structure, it is able to further reduce the influence on the performance of the first transistor T1 and the performance of the second transistor T2 caused by the change in the signal transmitted through the target data line pattern when the second transistor T2 is coupled to the first transistor T1 and the gate electrode of the driving transistor through the first extension member, thereby to alleviate an effect of the coupling between the gate electrode (i.e., 203g) of the driving transistor and the target data line pattern and reduce the vertical crosstalk, and improve the display effect of the display substrate during the display.

As shown in FIGS. 3 and 4, in some embodiments of the present disclosure, the first transistor T1 may include: a fourth semiconductor pattern, a fifth semiconductor pattern, and a sixth conductor pattern coupled to the fourth semiconductor pattern and the fifth semiconductor pattern, electric conductivity of the sixth conductor pattern being superior to electric conductivity of the fourth semiconductor pattern and electric conductivity of the fifth semiconductor pattern; and a third gate electrode pattern and a fourth gate electrode pattern coupled to each other. An orthogonal projection of the third gate electrode pattern onto the base 50 may partially overlap an orthogonal projection of the fourth semiconductor pattern onto the base 50, an orthogonal projection of the fourth gate electrode pattern onto the base 50 may partially overlap an orthogonal projection of the fifth semiconductor pattern onto the base 50, and an orthogonal projection of the sixth conductor pattern onto the base 50 may not overlap the orthogonal projection of the third gate electrode pattern onto the base 50 and the orthogonal projection of the fourth gate electrode pattern onto the base 50.

To be specific, as shown in FIG. 4, the first transistor may be of a double-gate structure. The fourth semiconductor pattern and the fifth semiconductor pattern of the first transistor may form a channel region (corresponding to the sign 101pg in FIG. 4) of the first transistor, and the sixth conductor pattern 101px of the first transistor may have the electric conductivity superior to the fourth semiconductor pattern and the fifth semiconductor pattern due to doping. The third electrode pattern and the fourth gate electrode pattern of the first transistor may cover the fourth semiconductor pattern and the fifth semiconductor pattern respectively, and together serve as the gate electrode 201g of the first transistor T1.

As shown in FIG. 10, in some embodiments of the present disclosure, the orthogonal projection of the first shielding member 404 onto the base 50 may at least partially overlap the orthogonal projection of the sixth conductor pattern 101px onto the base 50.

To be specific, in the first transistor T1 with the above structure, because the sixth conductor pattern 101px has excellent electric conductivity and is not covered by the gate electrode pattern, it may be easily coupled to the other neighboring conductive patterns, and thereby the crosstalk may occur. According to the embodiments of the present disclosure, when the orthogonal projection of the first shielding member 404 onto the base 50 at least partially overlaps the orthogonal projection of the sixth conductor pattern 101px onto the base 50, it is able for the first shielding member 404 to shield the sixth conductor pattern 101px. In addition, because the first shielding member 404 has a fixed potential, it is able to reduce an effect of the coupling between the sixth conductor pattern 101px and the other conductive patterns adjacent to the sixth conductor pattern 101px in a better manner, thereby to provide the display substrate with more stable operating performance.

As shown in FIGS. 11, 12 and 13, in some embodiments of the present disclosure, the subpixel driving circuitry may further include a second shielding member 301 coupled to the first shielding member 404, and an orthogonal projection of the second shielding member 301 onto the base 50 may at least partially overlap the orthogonal projection of the sixth conductor pattern 101px onto the base 50.

To be specific, when the orthogonal projection of the second shielding member 301 onto the base 50 at least partially overlaps the orthogonal projection of the sixth conductor pattern 101px onto the base 50, the second shielding member 301 may shield the sixth conductor pattern 101px. In addition, because the second shielding member 301 is coupled to the first shielding member 404, the second shielding member 301 may have a fixed potential, so it is able to reduce the effect of the coupling between the sixth conductor pattern 101px and the other conductive patterns adjacent to the sixth conductor pattern 101px in a better manner, thereby to provide the display substrate with stable operating performance.

In the display substrate according to the embodiments of the present disclosure, because the first shielding member 404 and the second shielding member 303 each have a fixed potential, it is able to prevent or reduce the parasitic capacitance between the first transistor T1 and the target data line pattern (e.g., DATA2) in a better manner, thereby to effectively prevent or reduce the vertical crosstalk.

Further, the orthogonal projection of the second shielding member 301 onto the base 50 may cover the entire orthogonal projection of the sixth conductor pattern onto the base 50.

To be specific, when the orthogonal projection of the second shielding member 301 onto the base 50 covers the entire orthogonal projection of the sixth conductor pattern 101px onto the base 50, the second shielding pattern 301 may completely shield the sixth conductor pattern 101px, so it is able to reduce the effect of the coupling between the sixth conductor pattern 101px and the other conductive patterns adjacent to the sixth conductor pattern 101px to the greatest degree, thereby to improve the operation stability of the display substrate in a better manner.

In some embodiments of the present disclosure, the second shielding member 301 and the first shielding member 404 may be arranged at different layers, and the orthogonal projection of the second shielding member 301 onto the base 50 may overlap the orthogonal projection of the first shielding member 404 onto the base 50 at a second overlapping region, the second shielding member 301 is coupled to the first shielding member 404 through a second via-hole arranged in the second overlapping region.

To be specific, the second shielding member 301 may be arranged at a same layer as, or at a layer different from, the first shielding member 404. When the second shielding member 301 is arranged at a layer different from the first shielding member 404, the orthogonal projection of the second shielding member 301 onto the base 50 may overlap the orthogonal projection of the first shielding member 404 onto the base 50 at the second overlapping region. In this way, the second shielding member 301 may be coupled to the first shielding member 404 through the second via-hole in the second overlapping region.

In some embodiments of the present disclosure, the second shielding member 301 may be made of a same material as the initialization signal line pattern.

In some embodiments of the present disclosure, the display substrate may further include a second interlayer insulation layer, and the second shielding member 301 and the initialization signal line pattern (e.g., VINT1 in FIG. 3) may be arranged at a surface of the second interlayer insulation layer distal to the base.

To be specific, when the second shielding member 301 and the initialization signal line pattern are made of a same material, and the second shielding member 301 and the initialization signal line pattern (e.g., VINT1 in FIG. 3) are arranged at the surface of the second interlayer insulation layer distal to the base, it is able to simultaneously form the second shielding member 301 and the initialization signal line pattern through a single patterning process, and omit an additional patterning process for forming the second shielding member 301, thereby to simplify the manufacture process of the display substrate in a better manner, and reduce the manufacture cost.

As shown in FIG. 3, in some embodiments of the present disclosure, the subpixel may further include a power source signal line pattern VDD which includes a portion extending in the first direction. The subpixel driving circuitry may further include a storage capacitor Cst, a first electrode plate Cst1 of which is reused as the gate electrode of the driving transistor, and a second electrode plate Cst2 of which is coupled to the power source signal line pattern VDD and located at the surface of the second interlay insulation layer distal to the base.

To be specific, the storage capacitor Cst of the subpixel driving circuitry may include the first electrode plate Cst1 and the second electrode plate Cst2 arranged opposite to each other. The first electrode plate Cst1 may be coupled to the gate electrode of the driving transistor, and the second electrode plate Cst2 may be coupled to the power source signal line pattern VDD. During the arrangement of the storage capacitor Cst, the first electrode plate Cst1 may be directly reused as the gate electrode of the driving transistor. In this way, it is able to not only ensure the storage capacitor Cst to be coupled to the gate electrode of the driving transistor, but also reduce a space occupied by the subpixel driving circuitry, thereby to further improve the resolution of the display substrate. In addition, when the second electrode plate Cst2 of the storage capacitor Cst is arranged at the surface of the second interlayer insulation layer distal to the base, the second electrode plate Cst2 of the storage capacitor Cst may be formed simultaneously through a single patterning with the second shielding member 301 and the initialization signal line pattern, so it is able to simplify the manufacture process of the display substrate in a better manner, and reduce the manufacture cost.

As shown in FIG. 14, in some embodiments of the present disclosure, the subpixel may further include a resetting signal line pattern (e.g., RST1 in FIG. 3) extending in the second direction intersecting the first direction. The subpixel driving circuitry may further include: a first conductive connection member 405, an orthogonal projection of which onto the base 50 at least partially overlaps the orthogonal projection of the sixth conductor pattern 101px onto the base 50; and a second transistor T2, a first electrode (e.g., a source electrode S2) of which is coupled to the initialization signal line pattern (e.g., VINT1) through the first conductive connection member 405, a second electrode (e.g., a drain electrode D2) of which is coupled to the gate electrode of the driving transistor, and a gate electrode 202g of which is coupled to the resetting signal line pattern (e.g., RST1).

To be specific, the first conductive connection member 405 may be made of a metal material, and formed through a single patterning process with the data line pattern.

When the orthogonal projection of the first conductive connection member 405 onto the base 50 at least partially overlap the orthogonal projection of the sixth conductor pattern 101px onto the base 50, the first conductive connection member 405 may shield the sixth conductor pattern 101px. In addition, because the first conductive connection member 405 is coupled to the initialization signal line pattern, the first conductive connection member 405 may have a fixed potential, so it is able to reduce the effect of the coupling between the sixth conductor pattern 101px and the other conductive patterns adjacent to the sixth conductor pattern 101px in a better manner, thereby to provide the display substrate with more stable operating performance.

As shown in FIG. 3, in some embodiments of the present disclosure, the subpixel may further include a gate line pattern GATE, a light-emission control signal line pattern EM, a resetting signal line pattern (e.g., RST1 in FIG. 3) and a power source signal line pattern VDD. The gate line pattern GATE, the light-emission control signal line pattern EM and the resetting signal line pattern may extend in the second direction, and the power source signal line pattern VDD may include a portion extending in the first direction.

The subpixel driving circuitry may further include a second transistor T2, a fourth transistor T4, a fifth transistor T5, a sixth transistor T6 and a seventh transistor T7. A gate electrode of the driving transistor (e.g., the gate electrode 203g of the third transistor T3) may be coupled to the second electrode of the first transistor T1, a first electrode of the driving transistor may be coupled to a second electrode of the fifth transistor T5, and a second electrode of the driving transistor may be coupled to the first electrode of the first transistor T1. The gate electrode 201g of the first transistor T1 may be coupled to the gate line pattern GATE. A gate electrode 202g of the second transistor T2 may be coupled to the resetting signal line pattern, a first electrode of the second transistor T2 may be coupled to the initialization signal line pattern, and a second electrode of the second transistor T2 may be coupled to the gate electrode of the driving transistor. A gate electrode 204g of the fourth transistor T4 may be coupled to the gate line pattern GATE, a first electrode of the fourth transistor T4 may be coupled to the data line pattern (e.g., DATA1 in FIG. 3), and a second electrode of the fourth transistor T4 may be coupled to the first electrode of the driving transistor. A gate electrode 205g of the fifth transistor T5 may be coupled to the light-emission control signal line pattern EM, and a first electrode of the fifth transistor T5 may be coupled to the power source signal line pattern VDD. A gate electrode 206g of the sixth transistor T6 may be coupled to the light-emission control signal line pattern EM, a first electrode of the sixth transistor T6 may be coupled to the second electrode of the driving transistor, and a second electrode of the sixth transistor T6 may be coupled to a light-emitting element of the subpixel. A gate electrode 207g of the seventh transistor T7 may be coupled to a resetting signal line pattern (e.g., RST2) of a next adjacent subpixel in the first direction, a first electrode of the seventh transistor T7 may be coupled to an initialization signal line pattern (e.g., VINT2) of the next adjacent subpixel, and a second electrode of the seventh transistor T7 may be coupled to the light-emitting element of the subpixel.

To be specific, in the above display substrate, the plurality of subpixels may be arranged in an array form, i.e., in rows and columns. Each row of subpixels may include a plurality of subpixels arranged in the second direction, and each column of subpixels may include a plurality of subpixels arranged in the first direction intersecting the second direction.

It should be appreciated that, the next adjacent subpixel in the first direction may be just a next subpixel adjacent to the seventh transistor in a same column.

When the subpixel and the subpixel driving circuitry thereof have the above-mentioned structures, it is able to effectively reduce the layout space occupied by the subpixel driving circuitry in the case of ensuring the operating performance of the subpixel driving circuitry, and increase the resolution of the display substrate.

It should be appreciated that, the gate electrode of each transistor in the subpixel driving circuitry may be formed integrally with a functional pattern coupled thereto. For example, the gate electrode of the first transistor and the gate electrode of the fourth transistor may be formed integrally with the corresponding gate line pattern coupled thereof, the gate electrode of the fifth transistor and the gate electrode of the sixth transistor may be formed integrally with the corresponding light-emission control signal line pattern coupled thereof, and the gate electrode of the second transistor and the gate electrode of the seventh transistor may be formed integrally with the corresponding resetting signal line pattern coupled thereto.

In addition, the first transistor T1 is configured to perform threshold compensation on the driving transistor (e.g., the third transistor T3), the second transistor T2 is configured to reset the gate electrode of the driving transistor, the fourth transistor T4 is configured to write a data signal from the data line pattern, the fifth transistor T5 is configured to write a power source signal from the power source signal line pattern into the first electrode of the driving transistor, the sixth transistor T6 is configured to control the corresponding light-emitting element to emit light or not, and the seventh transistor T7 is configured to reset the anode of the light-emitting element.

In some embodiments of the present disclosure, the subpixel may further include a gate line pattern GATE, a light-emission control signal line pattern EM, a resetting signal line pattern RST and a power source signal line pattern VDD. Each of the gate line pattern GATE, the light-emission control signal line pattern EM and the resetting signal line pattern RST may extend in the second direction, the power source signal line pattern VDD may include a portion extending in the first direction, and the orthogonal projection of the first shielding member 404 onto the base 50 may partially overlap an orthogonal projection of the gate line pattern GATE onto the base 50 and an orthogonal projection of the light-emission control signal line pattern EM onto the base 50.

To be specific, when the first shielding member 404 is arranged as mentioned hereinabove, the first shielding member 404 may be used to separate the first transistor T1 and the driving transistor from the target data line pattern (e.g., DATA2), so as to further reduce the crosstalk for the first transistor T1 and the driving transistor caused by the change in the data signal on the target data line pattern.

In some embodiments of the present disclosure, the second electrode of the seventh transistor T7 may be coupled to the light-emitting element of the subpixel in various modes. For example, an orthogonal projection of the anode of the light-emitting element onto the base may overlap an orthogonal projection of the second electrode of the seventh transistor T7 onto the base at an overlapping region, and the anode of the light-emitting element is coupled to the second electrode of the seventh transistor T7 through a via-hole arranged in the overlapping region. Alternatively, the orthogonal projection of the anode of the light-emitting element onto the base may not overlap the orthogonal projection of the second electrode of the seventh transistor T7 onto the base. The subpixel driving circuitry may further include a second conductive connection member 406 and a third conductive connection member 407. The orthogonal projection of the anode of the light-emitting element onto the base may overlap an orthogonal projection of a first end of the third conductive connection member 407 onto the base at an overlapping region, the anode of the light-emitting element is coupled to the first end of the third conductive connection member 407 through a via-hole arranged in the overlapping region. A second end of the third conductive connection member 407 may overlap a first end of the second conductive connection member 406. A second end of the third conductive connection member 407 may be coupled to a first end of the second conductive connection member 406 through the via-hole in the overlapping region. The orthogonal projection of the second electrode of the seventh transistor T7 onto the base may overlap an orthogonal projection of a second end of the second conductive connection member 406 onto the base at an overlapping region, the second electrode of the seventh transistor T7 is coupled to the second end of the second conductive connection member 406 through a via-hole arranged in the overlapping region. In this way, the anode of the light-emitting element may be coupled to the second electrode of the seventh transistor T7 through the second conductive connection member 406 and the third conductive connection member 407.

When the anode of the light-emitting element is coupled to the second electrode of the seventh transistor T7 through the second conductive connection member 406 and the third conductive connection member 407, the second conductive connection member 406 may include a portion extending in the first direction. The anode of the light-emitting element may be arranged at an upper side of the light-emission control signal line pattern of the subpixel corresponding to the light-emitting element, and the second electrode of the seventh transistor T7 may be arranged at a lower side of the light-emission control signal line pattern of the corresponding subpixel.

As shown in FIG. 15, the structures of the subpixels in three colors will be described hereinafter as an example.

The light-emitting element of a subpixel in a first color may include a first anode 601, a first organic light-emitting material layer and a first cathode laminated one on another in that order in the direction away from the base. An orthogonal projection of the first anode 601 onto the base may partially overlap the orthogonal projection of the second electrode of the corresponding seventh transistor T7 onto the base at an overlapping region, the first anode 601 is coupled to the second electrode of the corresponding seventh transistor T7 through a via-hole arranged in the overlapping region.

The light-emitting element of a subpixel in a second color may include a second anode 602, a second organic light-emitting material layer and a second cathode laminated one on another in that order in the direction away from the base. An orthogonal projection of the second anode 602 onto the base may not overlap the orthogonal projection of the second electrode of the corresponding seventh transistor T7 onto the base. The subpixel driving circuitry of the subpixel in the second color may further include a second conductive connection member 406 and a third conductive connection member 407, and the second anode 602 may be coupled to the second electrode of the corresponding seventh transistor T7 through the second conductive connection member 406 and the third conductive connection member 407.

The light-emitting element of a subpixel in a third color may include a third anode 603, a third organic light-emitting material layer and a third cathode laminated one on another in that order in the direction away from the base. An orthogonal projection of the third anode 603 onto the base may partially overlap the orthogonal projection of the second electrode of the corresponding seventh transistor T7 onto the base at an overlapping region, the third anode 603 is coupled to the second electrode of the corresponding seventh transistor T7 through a via-hole arranged in the overlapping region.

For example, as shown in FIG. 15, the anode of the organic light-emitting element of the subpixel in each color may include a body electrode and a connection electrode, and the body electrode may be of a hexagonal shape.

As shown in FIG. 15, the first anode 601 of the subpixel in the first color may include a first body electrode 6011 and a first connection electrode 6012 which are formed integrally. The first connection electrode 6012 may be coupled to the second electrode of the seventh transistor T7 of the subpixel in the first color through a connection hole. The second anode 602 of the subpixel in the second color may include a second body electrode 6021 and a second connection electrode 6022 which are formed integrally. The second connection electrode 6022 may be coupled to the second electrode of the seventh transistor T7 of the subpixel in the second color through the second conductive connection member 406 and the third conductive connection member 407. The third anode 603 of the subpixel in the third color may include a third body electrode 6031 and a third connection electrode 6032 which are formed integrally. The third connection electrode 6032 may be connected to the second electrode of the seventh transistor T7 of the subpixel in the third color through a connection hole.

For example, the first connection electrode 6012 of the subpixel in the first color may be arranged at a side of a center of the first body electrode 6011 distal to the data line pattern of the subpixel driving circuitry in the direction X, and at a side a center of the first body electrode 6011 distal to the light-emission control signal line of the subpixel driving circuitry in the direction Y. For example, the first connection electrode 6012 and the first body electrode 6011 of the subpixel in the first color may be arranged in the direction Y, and the first connection electrode 6012 may be located at a lower right corner of the first body electrode 6011. For example, the second connection electrode 6022 of the subpixel in the second color may be arranged at a side of a center of the second body electrode 6021 distal to the data line of the subpixel driving circuitry in the direction X, and at a side of a center of the second body electrode 6021 close to the light-emission control signal line of the subpixel driving circuitry in the direction Y. For example, the second connection electrode 6022 and the second body electrode 6021 of the subpixel in the second color may be arranged in the direction Y, and the second connection electrode 6022 may be located at a lower right corner of the first body electrode 1231. For example, the third connection electrode 6032 and the third body electrode 6031 of the subpixel in the third color may be arranged in the direction X, and the third connection electrode 6032 may be arranged at a right side of the third body electrode 6031, i.e., at a side of the subpixel driving circuitry close to the shielding line.

As shown in FIG. 15, the first body electrode 6011 of the first anode 601 of the subpixel in the first color may cover the driving transistor of the subpixel in the first color, the second body electrode 6021 of the second anode 602 of the subpixel in the second color may substantially not overlap, or may partially overlap, the driving transistor of the subpixel in the second color, and the third body electrode 6031 of the third anode 603 of the subpixel in the third color may not overlap the driving transistor of the subpixel in the third color.

As shown in FIG. 15, the first body electrode 6011 of the subpixel 601 in the first color (e.g., a blue subpixel) may overlap the gate line pattern and the light-emission control signal line pattern, the second body electrode 6021 of the subpixel in the second color (e.g., a red subpixel) may overlap the gate line pattern and the resetting signal line pattern, and the third body electrode 6031 of the subpixel in the third color (e.g., a green subpixel) may overlap the light-emission control signal line pattern, the resetting signal line pattern of the subpixel driving circuitry in a next row, and the initialization signal line pattern of the subpixel driving circuitry in the next row. For example, the third body electrode 6031 of the subpixel in the third color (e.g., the green subpixel) may overlap a pixel driving circuitry region of a subpixel in the first color (e.g., a blue subpixel) being adjacent to the subpixel in the third color and in a next row.

For example, the first body electrode 6011 of the subpixel 601 in the first color may partially overlap the driving transistor of an adjacent subpixel in the third color, and overlap the data line pattern of the subpixel driving circuitry of the subpixel 601, the first shielding member 404, and the data line pattern in the subpixel driving circuitry of an adjacent subpixel in the second color. The second body electrode 6021 of the subpixel in the second color may not overlap the data line pattern of the subpixel driving circuitry of the subpixel in the second color, but overlap the power source signal line pattern of the subpixel driving circuitry of the subpixel in the second color, and the power source signal line pattern and the data line pattern of the subpixel driving circuitry of an adjacent subpixel in the third color. The third body electrode 6031 of the subpixel in the third color may overlap the data line pattern and the power source signal line pattern of the subpixel driving circuitry of the subpixel in the third color, and overlap the power source signal line pattern of the subpixel driving circuitry of the adjacent subpixel in the second color.

For example, as shown in FIG. 15, the first connection electrode 6012 coupled to the first body electrode 6011 of the subpixel 601 in the first color may be arranged at a side of the first body electrode 6011 close to the resetting signal line pattern in a next row, the second connection electrode 6022 coupled to the second body electrode 6021 of the subpixel in the second color may be arranged at a side of the second body electrode 6021 close to the resetting signal line pattern in a next row, and the third connection electrode 6032 connected to the third body electrode 6031 of the subpixel in the third color may be arranged at a side of the third body electrode 6031 close to the seventh transistor T7 thereof.

For example, as shown in FIG. 15, the first connection electrode 6012 of the subpixel 601 in the first color may overlap the second electrode of the seventh transistor T7 of the subpixel driving circuitry of the subpixel 601 in the first color. The second connection electrode 6022 of the subpixel in the second color may not overlap the second electrode of the seventh transistor T7 of the subpixel driving circuitry of the subpixel in the second color, but the second electrode of the seventh transistor T7 of the subpixel in the second color may overlap the third body electrode 6031 of the subpixel in the third color. The third connection electrode 6032 of the subpixel in the third color may overlap the second electrode of the seventh transistor T7 of the subpixel driving circuitry of the subpixel in the third color.

The present disclosure further provides in some embodiments a display device including the above-mentioned display substrate.

According to the above-mentioned display substrate, through the first shielding member 404, it is able to reduce the influence caused by the change in the signal transmitted through the target data line pattern on the performance of the first transistor T1, thereby to reduce the influence of the coupling between the gate electrode (i.e., 203g) of the driving transistor and the target data line pattern and reduce the vertical crosstalk, and improve a display effect of the display substrate during the display. In addition, in the display panel according to the embodiments of the present disclosure, when the first shielding member 404 is coupled to the initialization signal line pattern, it is able to, apart from providing the first shielding member 404 with the fixed potential, increase a voltage across the initialization signal line pattern and provide a more stable voltage for the initialization signal transmitted on the initialization signal line pattern, thereby to improve the operating performance of the subpixel driving circuitry.

Hence, when the display device includes the above-mentioned display substrate, it may have the same beneficial effect, which will not be repeatedly described herein.

It should be appreciated that, the display device may be any product or member having a display function, e.g., television, display, digital photo frame, mobile phone or tablet computer.

The present disclosure further provides in some embodiments a method for manufacturing the above-mentioned display substrate, which includes forming a plurality of subpixels on the base 50 in an array form. The subpixel includes: a data line pattern (e.g., DATA1 in FIG. 3) extending in a first direction; an initialization signal line pattern (e.g., VINT1 in FIG. 3) including a portion extending in a second direction intersecting the first direction, and configured to transmit an initialization signal at a fixed potential; and a subpixel driving circuitry. The subpixel driving circuitry includes a driving transistor (e.g., T3 in FIG. 3), a first transistor T1 coupled to a gate electrode of the driving transistor, and a first shielding member 404 coupled to the initialization signal line pattern. An orthogonal projection of the first shielding member 404 onto the base 50 may be located between an orthogonal projection of the first transistor T1 onto the base 50 and an orthogonal projection of a target data line pattern (e.g., DATA2 in FIG. 3) onto the base 50. A next subpixel adjacent to the subpixel in the second direction includes the target data line pattern.

When the display substrate is manufactured using the above-mentioned method according to the embodiments of the present disclosure, the subpixel driving circuitry is provided with the first shielding member 404 coupled to the initialization signal line pattern (e.g., VINT1 in FIG. 3), so as to provide the first shielding member 404 with a same fixed potential as the initialization signal. In addition, the orthogonal projection of the first shielding member 404 onto the base 50 may be located between the orthogonal projection of the first transistor T1 onto the base 50 and the orthogonal projection of the target data line pattern (e.g., DATA2 in FIG. 3) onto the base 50, so it is able to reduce, through the first shielding member 404, the influence caused by the change in the signal transmitted through the target data line pattern on the performance of the first transistor T1, thereby to reduce an effect of the coupling between the gate electrode (i.e., 203g) of the driving transistor and the target data line pattern and reduce the vertical crosstalk, and improve a display effect of the display substrate during the display.

In addition, during the manufacture of the display substrate using the above-mentioned method according to the embodiments of the present disclosure, when the first shielding member 404 is coupled to the initialization signal line pattern, it is able to, apart from providing the first shielding member 404 with the fixed potential, increase a voltage across the initialization signal line pattern and provide a more stable voltage for the initialization signal transmitted on the initialization signal line pattern, thereby to improve the operating performance of the subpixel driving circuitry.

Figure 16:
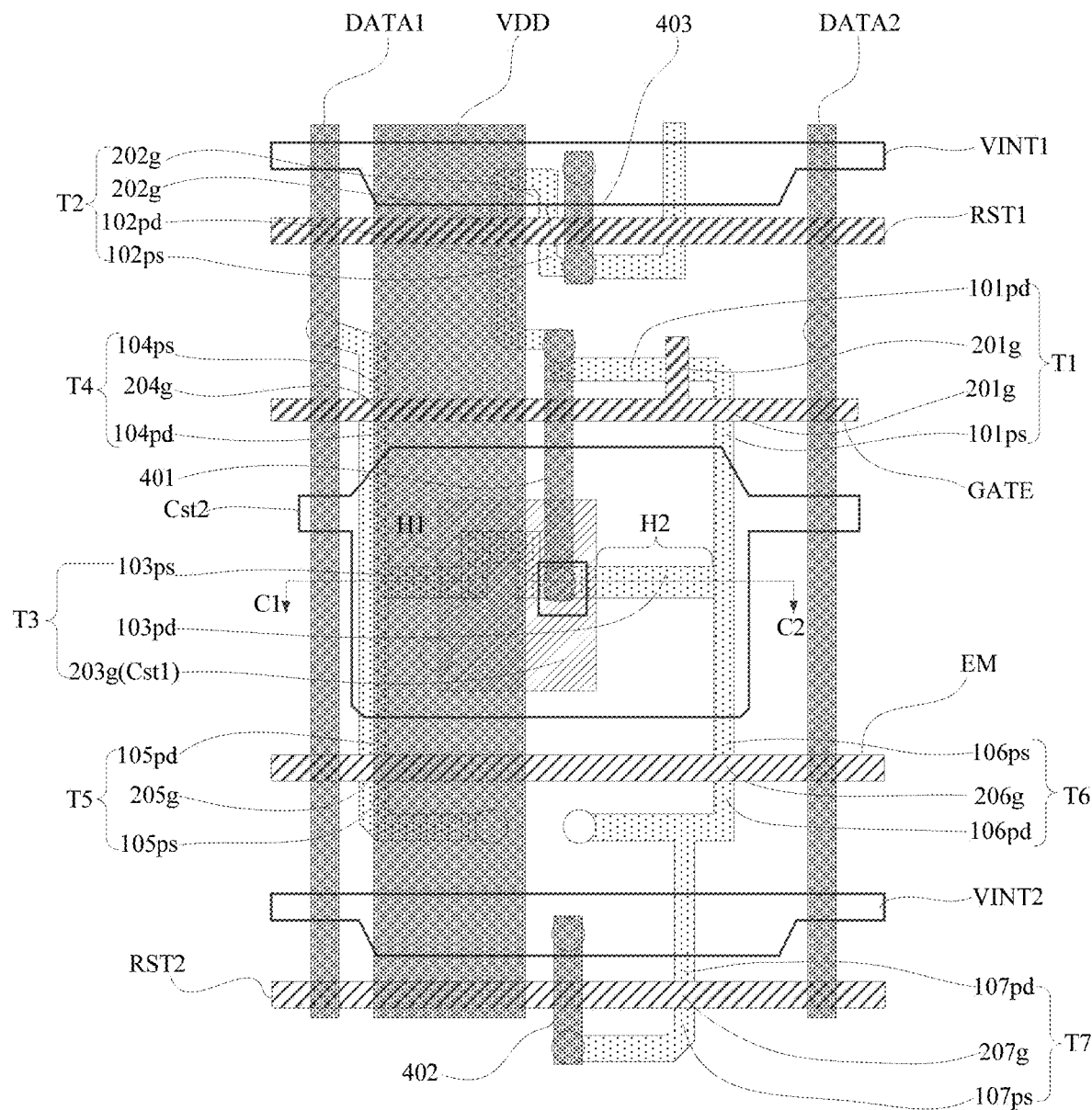
FIG. 16 is a schematic view showing a seventh layout of the subpixel driving circuitry in the display substrate according to an embodiment of the present disclosure.

As shown in FIG. 16, the present disclosure further provides in some embodiments a display substrate, which includes a base 60 and a plurality of subpixels arranged on the base in an array form. The subpixel includes: a data line pattern (e.g., DATA1) extending in a first direction; a power source signal line pattern VDD including a portion extending in the first direction; and a subpixel driving circuitry. The subpixel driving circuitry includes two switching transistors (e.g., a fourth transistor T4 and a fifth transistor T5), a driving transistor (e.g., a third transistor T3), and a storage capacitor Cst. A first electrode Cst1 of the storage capacitor Cst is coupled to a gate electrode of the driving transistor (e.g., a gate electrode 203g of the third transistor T3), and a second electrode plate Cst2 of the storage capacitor Cst is coupled to the power source signal line pattern VDD. Second electrodes of the two switching transistors (e.g., a drain electrode D4 of the fourth transistor T4 and a drain electrode D5 of the fifth transistor T5) are coupled to a first electrode of the driving transistor (e.g., a source electrode S3 of the third transistor T3). An orthogonal projection of the second electrode of at least one of the two switching transistors onto the base 50 at least partially overlaps an orthogonal projection of the power source signal line pattern VDD onto the base 50 and at least partially overlaps an orthogonal projection of the second electrode plate Cst2 of the storage capacitor Cst onto the base 50.

To be specific, usually the display substrate may include the plurality of subpixels arranged in an array form, and each subpixel may include the data line pattern (e.g., DATA1) extending in the first direction, and the power source signal line pattern VDD, at least a portion of which extends in the first direction. For example, the first direction may include a direction Y, and a second direction may include a direction X.

It should be appreciated that, the power source signal line pattern VDD may be of various structures. For example, the power source signal line pattern VDD may be of a grid-like structure, and the grid-like power source signal line pattern VDD may include the portion extending in the first direction.

Each subpixel may further include the subpixel driving circuitries, and light-emitting elements corresponding to the subpixel driving circuitries respectively. The light-emitting element may include an anode, an organic light-emitting material layer and a cathode laminated one on another. The anode of the light-emitting element may be coupled to the corresponding subpixel driving circuitry, and the light-emitting element may emit light under the control of a driving signal from the subpixel driving circuitry.

More specifically, as shown in FIG. 16, when the subpixel driving circuitry includes the above-mentioned 7T1C-based subpixel driving circuitry, the gate electrode 203g of the third transistor T3 (i.e., the driving transistor) may be reused as the first electrode plate Cst1 of the storage capacitor Cst, and the second electrode plate Cst2 of the storage capacitor Cst may be arranged at a side of the first electrode plate Cst1 distal to the base. An orthogonal projection of the first electrode plate Cst1 onto the base may at least partially overlap the orthogonal projection of the second electrode plate Cst2 onto the base, and the orthogonal projection of the second electrode plate Cst2 onto the base may at least partially overlap the orthogonal projection of the second electrode of at least one of the fourth transistor T4 and the fifth transistor T5 onto the base 50 and the orthogonal projection of the power source signal line pattern VDD onto the base 50.

Based on the above specific structure of the display substrate, in the display substrate according to embodiments of the present disclosure, when the second electrode plate Cst2 of the storage capacitor Cst is coupled to the power source signal line pattern VDD, the second electrode plate Cst2 of the storage capacitor Cst may have a same fixed potential as a power source signal transmitted on the power source signal line pattern VDD. In addition, when the second electrodes of the two switching transistors are coupled to the first electrode of the driving transistor, and the orthogonal projection of the second electrode of the at least one of the two switching transistors onto the base 50 at least partially overlaps the orthogonal projection of the power source signal line pattern VDD onto the base 50, and at least partially overlaps the orthogonal projection of the second electrode plate Cst2 of the storage capacitor Cst onto the base 50, the second electrode plate Cst2 of the storage capacitor Cst and the power source signal line pattern VDD may shield the second electrode of the at least one of the two switching transistors, so as to reduce the crosstalk for the second electrode of the at least one of the two switching transistors due to a signal on the other conductive pattern (e.g., a signal line pattern) surrounding the at least one of the two switching transistors, thereby to reduce the crosstalk for the first electrode of the driving transistor.

As shown in FIG. 16, in some embodiments of the present disclosure, the second electrodes of the two switching transistors (e.g., the fourth transistor T4 and the fifth transistor T5) may be formed integrally with the first electrode of the driving transistor (e.g., the third transistor T3). A resultant integral structure may include a first conductive member 108 extending in the first direction, and an orthogonal projection of the first conductive member 108 onto the base may overlap the orthogonal projection of the power source signal line pattern VDD onto the base and the orthogonal projection of the second electrode plate Cst2 of the storage capacitor Cst onto the base 50 at a first overlapping region, which does not overlaps the orthogonal projection of the data line pattern (e.g., DATA1) onto the base 50.

To be specific, when the second electrodes of the two switching transistors are formed integrally with the first electrode of the driving transistor, it is able to form the second electrodes of the two switching transistors and the first electrode of the driving transistor through a single patterning process.

In the above-mentioned display substrate according to the embodiments of the present disclosure, the integral structure may include the first conductive member 108 extending in the first direction, the orthogonal projection of the data line pattern onto the base may be located at a side of the orthogonal projection of the first conductive member 108 onto the base distal to the orthogonal projection of the driving transistor onto the base, and the orthogonal projection of the first conductive member 108 onto the base may overlap the orthogonal projection of the power source signal line pattern VDD onto the base and the orthogonal projection of the second electrode plate Cst2 of the storage capacitor Cst onto the base 50 at the first overlapping region. In this way, the second electrode plate Cst2 of the storage capacitor Cst and the power source signal line pattern VDD may shield the first conductive member 108, so as to reduce the crosstalk for the first conductive member 108 due to a signal transmitted on the data line pattern, thereby to reduce the crosstalk for the first electrode of the driving transistor.

As shown in FIG. 16, in some embodiments of the present disclosure, the orthogonal projection of the first electrode of the driving transistor onto the base 50 may be located within the orthogonal projection of the second electrode plate Cst2 of the storage capacitor Cst onto the base.

In this arrangement mode, the second electrode plate Cst2 of the storage capacitor Cst may completely cover the first electrode of the driving transistor, so as to reduce the crosstalk for the first electrode of the driving transistor due to the signal transmitted on the data line pattern in a more effective manner.

Figure 17:
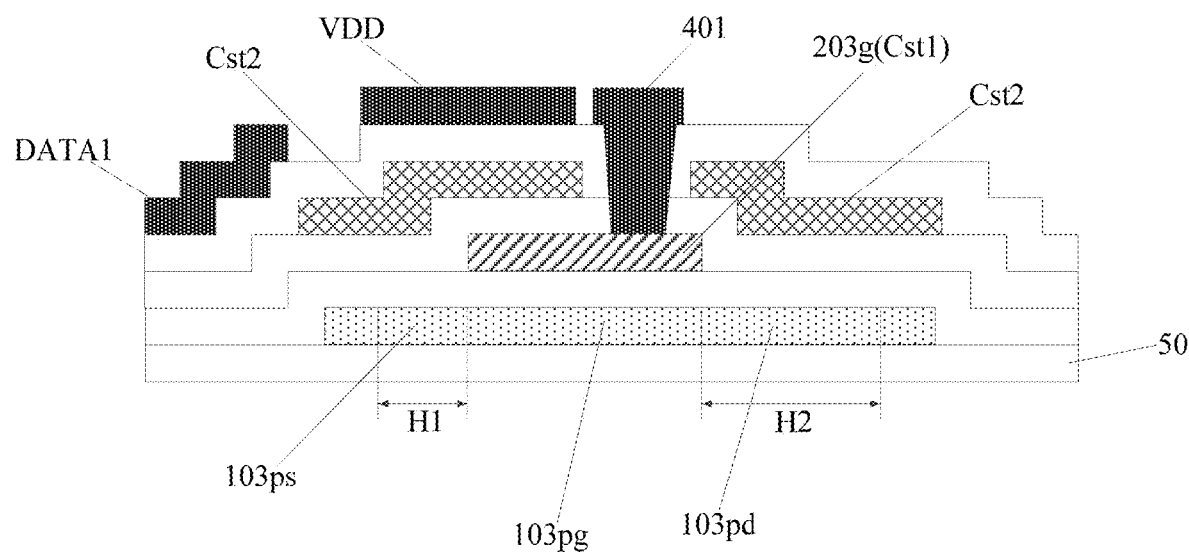
FIG. 17 is a sectional view along a line C1C2 in FIG. 16.

As shown in FIGS. 16 and 17, in some embodiments of the present disclosure, the subpixel may further include a gate line pattern GATE and a light-emission control signal line pattern EM each extending in a second direction intersecting the first direction. The subpixel driving circuitry may further include a first transistor T1 and a sixth transistor T6, and the two switching transistors may include a fourth transistor T4 and a fifth transistor T5.

A gate electrode 204g of the fourth transistor T4 may be coupled to the gate line pattern GATE, a first electrode of the fourth transistor T4 may be coupled to the data line pattern (e.g., DATA1), and a second electrode of the fourth transistor T4 may be coupled to a second electrode of the fifth transistor T5. A gate electrode 205g of the fifth transistor T5 may be coupled to the light-emission control signal line pattern EM, and a first electrode of the fifth transistor T5 may be coupled to the power source signal line pattern VDD.

A gate electrode 201g of the first transistor T1 may be coupled to the gate line pattern GATE, and a second electrode of the first transistor T1 may be coupled to the gate electrode of the driving transistor. A first electrode of the first transistor T1, a first electrode of the sixth transistor T6 and the second electrode of the driving transistor may be formed integrally, and a resultant integral structure may include a second conductive member 109 extending in the first direction. A gate electrode 206g of the sixth transistor T6 may be coupled to the light-emission control signal line pattern EM, and a second electrode of the sixth transistor T6 may be coupled to the light-emitting element of the subpixel.

An orthogonal projection of a channel region (e.g., 103*pg* in FIG. 18) of the driving transistor onto the base may be arranged between the orthogonal projection of the first conductive member 108 onto the base 50 and an orthogonal projection of the second conductive member 109 onto the base 50. In addition, in the second direction, a minimum distance between the orthogonal projection of the channel region of the driving transistor onto the base and the orthogonal projection of the first conductive member 108 onto the base may be smaller than a minimum distance between the orthogonal projection of the channel region onto the base 50 and the orthogonal projection of the second conductive member 109 onto the base.

To be specific, in the display substrate, the plurality of subpixels may be arranged in an array form, i.e., in rows and columns Each row of subpixels may include a plurality of subpixels arranged in the second direction, and each column of subpixels may include a plurality of subpixels arranged in the first direction intersecting the second direction. The subpixel driving circuitries of the subpixels in each column may be arranged between the data line patterns of the subpixels in the column and the data line patterns of the subpixels in a next column adjacent to the column.

It should be appreciated that, in the second direction, the minimum distance between the orthogonal projection of the channel region of the driving transistor onto the base and the orthogonal projection of the first conductive member 108 onto the base may refer to a distance in the second direction between an edge of the orthogonal projection of the channel region of the driving transistor onto the base closest to the orthogonal projection of the first conductive member 108 onto the base and the orthogonal projection of the first conductive member 108 onto the base. In the second direction, the minimum distance between the orthogonal projection of the channel region onto the base 50 and the orthogonal projection of the second conductive member 109 onto the base may refer to a distance in the second direction between an edge of the orthogonal projection of the channel region of the driving transistor onto the base closest to the orthogonal projection of the second conductive member 109 onto the base and the orthogonal projection of the second conductive member 109 onto the base.

Figure 25:
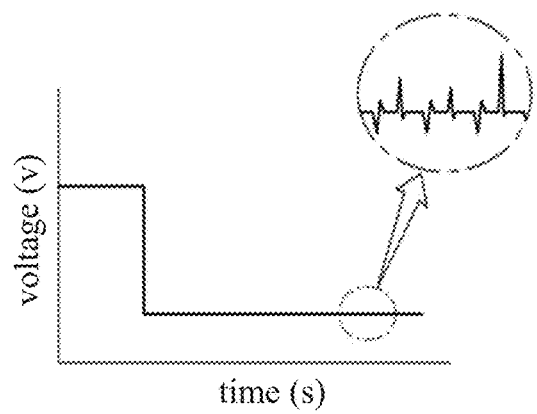
FIG. 25 is a schematic view showing a crosstalk phenomenon occurring for a gate electrode of a driving transistor in the related art.

More specifically, the subpixel driving circuitry of each subpixel may be arranged between two adjacent data line patterns (e.g., DATA1 and DATA2). Data transmitted on the two data line patterns may change, and when the data changes, crosstalk may easily occur for the gate electrode of the driving transistor of the subpixel driving circuitry, as shown in FIG. 25, and thereby the operation stability of the driving transmission may be adversely affected.

In the embodiments of the present disclosure, the fourth transistor T4, the fifth transistor T5, the first transistor T1 and the sixth transistor T6 may be arranged at a region surrounding the driving transistor, one of the two data line patterns (e.g., DATA1) may be arranged at a side of each of the fourth transistor T4 and the fifth transistor T5 distal to the driving transistor, and the other one of the two data line patterns (e.g., DATA2) may be arranged at a side of each of the first transistor T1 and the sixth transistor T6 distal to the driving transistor. In addition, the orthogonal projection of the channel region (e.g., 103*pg* in FIG. 18) of the driving transistor onto the base may be arranged between the orthogonal projection of the first conductive member 108 onto the base 50 and the orthogonal projection of the second conductive member 109 onto the base 50, and the minimum distance between the orthogonal projection of the channel region of the driving transistor onto the base and the orthogonal projection of the first conductive member 108 onto the base may be smaller than the minimum distance between the orthogonal projection of the channel region onto the base and the orthogonal projection of the second conductive member 109 onto the base. In this way, in the case that there is an appropriate distance between the channel region of the driving transistor and DATA1, it is able to increase a distance between the channel region of the driving transistor and DATA2 to the greatest extent, thereby to reduce the crosstalk for the driving transistor caused by DATA2 in a better manner.

Moreover, because a portion of the channel region of the driving transistor close to DATA1 is covered by the power source signal line pattern VDD, it is able to effectively reduce the crosstalk for the channel region of the driving transistor caused by DATA1. Hence, in the embodiments of the present disclosure, the crosstalk may be relatively small, even when the distance between the channel region of the driving transistor and DATA is relatively small.

In addition, when the second electrode plate Cst2 of the storage capacitor Cst has a same fixed potential as the power source signal transmitted on the power source signal line pattern VDD, and the orthogonal projection of the first conductive member 108 onto the base overlaps the orthogonal projection of the power source signal line pattern VDD onto the base and the orthogonal projection of the second electrode plate Cst2 of the storage capacitor Cst onto the base 50 at the first overlapping region, the second electrode plate Cst2 of the storage capacitor Cst and the power source signal line pattern VDD may shield the first conductive member 108, so as to reduce the crosstalk for the first conductive member 108 caused by the signal transmitted on DATA1, thereby to reduce the crosstalk for the first electrode and the channel region of the driving transistor.

As shown in FIG. 16, in some embodiments of the present disclosure, the subpixel may further include a gate line pattern GATE and a light-emission control signal line pattern EM extending in a second direction intersecting the first direction. The subpixel driving circuitry may further include a first transistor T1 and a sixth transistor T6, and the two switching transistors may include a fourth transistor T4 and a fifth transistor T5.

A gate electrode 204*g* of the fourth transistor T4 may be coupled to the gate line pattern GATE, a first electrode of the fourth transistor T4 may be coupled to the data line pattern (e.g., DATA1), and a second electrode of the fourth transistor T4 may be coupled to a second electrode of the fifth transistor T5. A gate electrode 205*g* of the fifth transistor T5 may be coupled to the light-emission control signal line pattern EM, and a first electrode of the fifth transistor T5 may be coupled to the power source signal line pattern VDD.

A gate electrode 201*g* of the first transistor T1 may be coupled to the gate line pattern GATE, and a second electrode of the first transistor T1 may be coupled to the gate electrode of the driving transistor. A first electrode of the first transistor T1, a first electrode of the sixth transistor T6 and the second electrode of the driving transistor may be formed integrally, and a resultant integral structure may include a second conductive member 109 extending in the first direction. A gate electrode 206*g* of the sixth transistor T6 may be coupled to the light-emission control signal line pattern EM, and a second electrode of the sixth transistor T6 may be coupled to the light-emitting element of the subpixel.

An orthogonal projection of a channel region (e.g., 103*pg* in FIG. 18) of the driving transistor onto the base may be arranged between the orthogonal projection of the first conductive member 108 onto the base and an orthogonal projection of the second conductive member 109 onto the base. The first electrode and the second electrode of the driving transistor may each include a first portion extending in the second direction, and a length of the first portion of the first electrode in the second direction may be different from a length of the first portion of the second electrode in the second direction.

To be specific, when the first electrode and the second electrode of the driving transistor each include the first portion extending in the second direction, and the length of the first portion of the first electrode in the second direction is different from the length of the first portion of the second electrode in the second direction, there may exist the following two circumstances.

In a first circumstance, the length H1 of the first portion of the first electrode in the second direction may be smaller than the length H2 of the first portion of the second electrode in the second direction. In this regard, the channel region (e.g., 103pg in FIG. 18) of the driving transistor may be arranged close to the data line pattern (e.g., DATA1) of the subpixel to which the driving transistor belongs and arranged distal to the data line pattern (e.g., DATA2) of a next subpixel adjacent to the subpixel to which the driving transistor belongs in the second direction, so as to increase the distance between the channel region of the driving transistor and DATA2 to the greatest extent in the case of ensuring an appropriate distance between the channel region of the driving transistor and DATA1, thereby to reduce the crosstalk for the driving transistor caused by DATA2 in a better manner. In addition, because the first conductive member 108 is shielded by the second electrode plate Cst2 of the storage capacitor Cst and the power source signal line pattern VDD, it is able to reduce the crosstalk for the first conductive member 108 due to the signal transmitted on DATA1, thereby to reduce the crosstalk for the first electrode and the channel region of the driving transistor.

In a second circumstance, the length of the first portion of the first electrode in the second direction may be greater than the length of the first portion of the second electrode in the second direction. In this regard, the channel region (e.g., 103pg in FIG. 18) of the driving transistor may be arranged distal to the data line pattern (e.g., DATA1) of the subpixel to which the driving transistor belongs and arranged close to the data line pattern (e.g., DATA2) of a next subpixel adjacent to the subpixel to which the driving transistor belongs in the second direction, so as to increase the distance between the channel region of the driving transistor and DATA1 to the greatest extent in the case of ensuring an appropriate distance between the channel region of the driving transistor and DATA2, thereby to reduce the crosstalk for the driving transistor caused by DATA1 in a better manner. In addition, when the display substrate includes a first shielding member for completely shielding DATA2 from the second conductive member 109, it is able to reduce the crosstalk for the second conductive member 109 due to the signal transmitted on DATA2, thereby to reduce the crosstalk for the second electrode and the channel region of the driving transistor.

As shown in FIG. 16, in some embodiments of the present disclosure, the subpixel may further include an initialization signal line pattern (e.g., VINT1) including a portion extending in a second direction intersecting the first direction, wherein the initialization signal line pattern is configured to transmit an initialization signal at a fixed potential.

The subpixel driving circuitry may further include a second transistor T2 coupled to the gate electrode of the driving transistor. The second transistor T2 may include: a first semiconductor pattern, a second semiconductor pattern, and a third conductor pattern coupled to the first semiconductor pattern and the second semiconductor pattern, electric conductivity of the third conductor pattern being superior to electric conductivity of the first semiconductor pattern and the second semiconductor pattern; and a first gate electrode pattern and a second gate electrode pattern coupled to each other. An orthogonal projection of the first gate electrode pattern onto the base may at least partially overlap an orthogonal projection of the first semiconductor pattern onto the base, and an orthogonal projection of the second gate electrode pattern onto the base may at least partially overlap an orthogonal projection of the second semiconductor pattern onto the base. An orthogonal projection of the third conductor pattern onto the base may not overlap the orthogonal projection of the first gate electrode pattern onto the base and the orthogonal projection of the second gate electrode pattern onto the base. The orthogonal projection of the third conductor pattern onto the base may at least partially overlap the orthogonal projection of the initialization signal line pattern onto the base.

To be specific, as shown in FIG. 16, the second transistor T2 may be of a double-gate structure. The first semiconductor pattern and the second semiconductor pattern of the second transistor may form a channel region (corresponding to a location of the sign 102pg in FIG. 18) of the second transistor T2, and the third conductor pattern 102px of the second transistor may have the electric conductivity superior to the first semiconductor pattern and the second semiconductor pattern due to doping of the third conductor pattern 102px. The first gate electrode pattern and the second gate electrode pattern of the second transistor T2 may cover the first semiconductor pattern and the second semiconductor pattern respectively, and together serve as the gate electrode 202g of the second transistor T2.

In the second transistor T2 with the above structure, because the third conductor pattern 102px has excellent electric conductivity and is not covered by the gate electrode pattern, it may be easily coupled to the other neighboring conductive patterns, and thereby the crosstalk may occur. According to the embodiments of the present disclosure, when the orthogonal projection of the third conductor pattern onto the base 50 at least partially overlaps the orthogonal projection of the initialization signal line pattern onto the base 50, it is able for the initialization signal line pattern to shield the third conductor pattern 102px. Because the initialization signal at a fixed potential is transmitted on the initialization signal line pattern, it is able to reduce an effect of the coupling between the third conductor pattern 102px and the other neighboring conductive patterns in a better manner, thereby to provide the display substrate with more stable operating performance.

Figure 18:
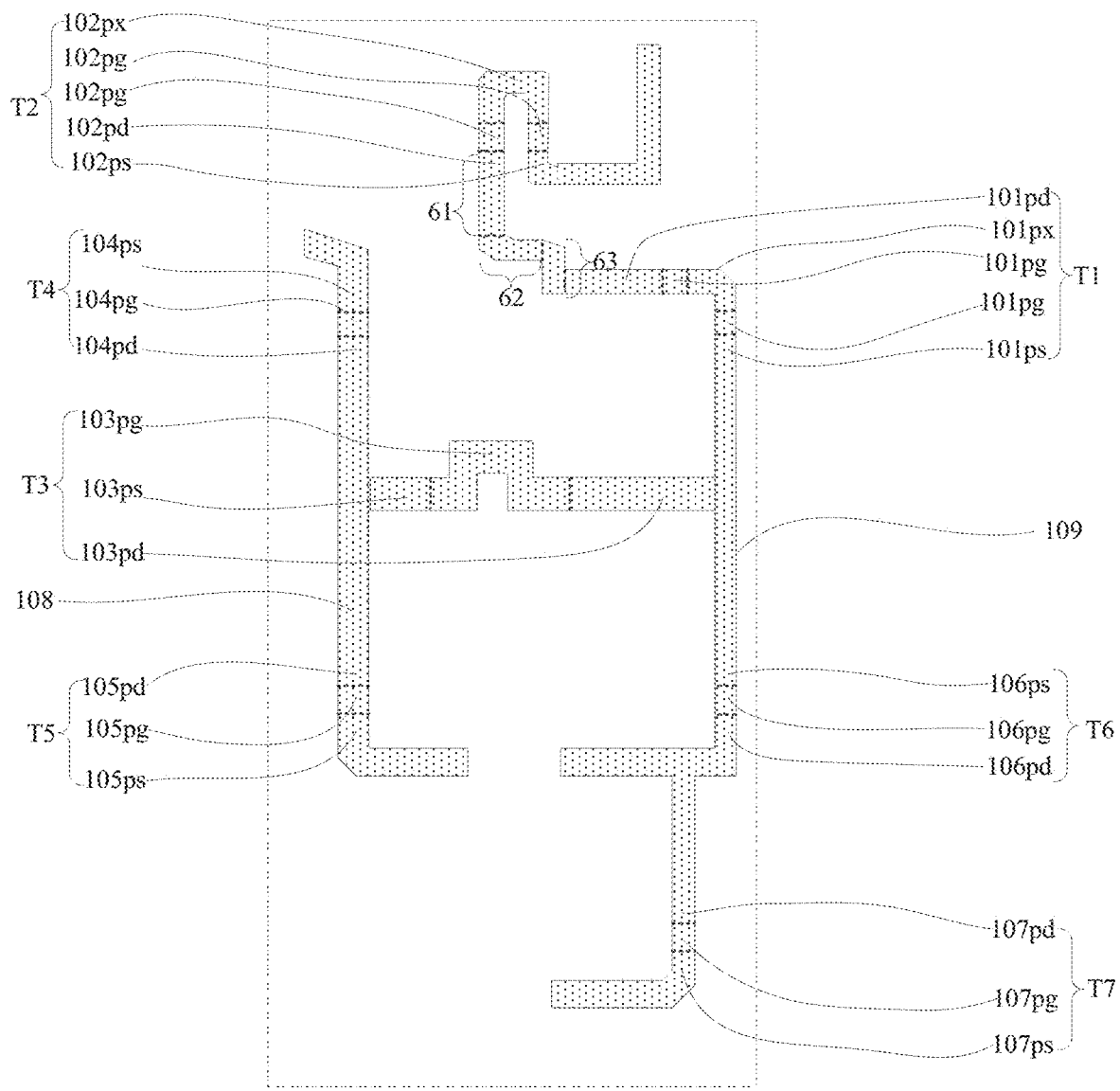
FIG. 18 is a schematic view showing a second layout of the active film layer according to an embodiment of the present disclosure.

As shown in FIGS. 16 and 18, in some embodiments of the present disclosure, the subpixel driving circuitry may further include a first extension member extending from the first semiconductor pattern and having electric conductivity superior to the first semiconductor pattern. The first extension member may include a first portion 61, a second portion 62 and a third portion 63. The first portion 61 and the third portion 63 may each extend in the first direction, and the second portion 62 may extend in the second direction. An end of the second portion 62 may be coupled to the first portion 61, the other end of the second portion 62 may be coupled to the third portion 63, and an end of the third portion 63 distal to the second portion 62 may be coupled to the first transistor T1.

To be specific, the first extension member and the first semiconductor pattern may be formed through a single patterning process, and after the formation of the first semiconductor pattern, the first extension member may be doped so that the electric conductivity of the first extension member is superior to the first semiconductor pattern.

After the addition of the first shielding member 404, through the first extension member with the above-mentioned structure, it is able to reduce the influence on the performance of the first transistor T1 and the second transistor T2 caused by the change in the signal transmitted through the target data line pattern when the second transistor T2 is coupled to the first transistor T1 and the gate electrode of the driving transistor through the first extension member, thereby to alleviate the effect of the coupling between the gate electrode (i.e., 203g) of the driving transistor and the target data line pattern and reduce the vertical crosstalk, and improve the display effect of the display substrate during the display.

In some embodiments of the present disclosure, the first transistor may include: a fourth semiconductor pattern, a fifth semiconductor pattern, and a sixth conductor pattern coupled to the fourth semiconductor pattern and the fifth semiconductor pattern, electric conductivity of the sixth conductor pattern being superior to electric conductivity of the fourth semiconductor pattern and the fifth semiconductor pattern; and a third gate electrode pattern and a fourth gate electrode pattern coupled to each other. An orthogonal projection of the third gate electrode pattern onto the base may partially overlap an orthogonal projection of the fourth semiconductor pattern onto the base, an orthogonal projection of the fourth gate electrode pattern onto the base may partially overlap an orthogonal projection of the fifth semiconductor pattern onto the base, and an orthogonal projection of the sixth conductor pattern onto the base may not overlap the orthogonal projection of the third gate electrode pattern onto the base and the orthogonal projection of the fourth gate electrode pattern onto the base.

To be specific, as shown in FIG. 16, the first transistor may be of a double-gate structure. The fourth semiconductor pattern and the fifth semiconductor pattern of the first transistor may form a channel region (corresponding to the sign 101pg in FIG. 18) of the first transistor T1, and the sixth conductor pattern 101px of the first transistor may have the electric conductivity superior to the fourth semiconductor pattern and the fifth semiconductor pattern due to doping of the sixth conductor pattern 101px. The first third electrode pattern and the fourth gate electrode pattern of the first transistor may cover the fourth semiconductor pattern and the fifth semiconductor pattern respectively, and together form the gate electrode 201g of the first transistor T1.

Figure 19:
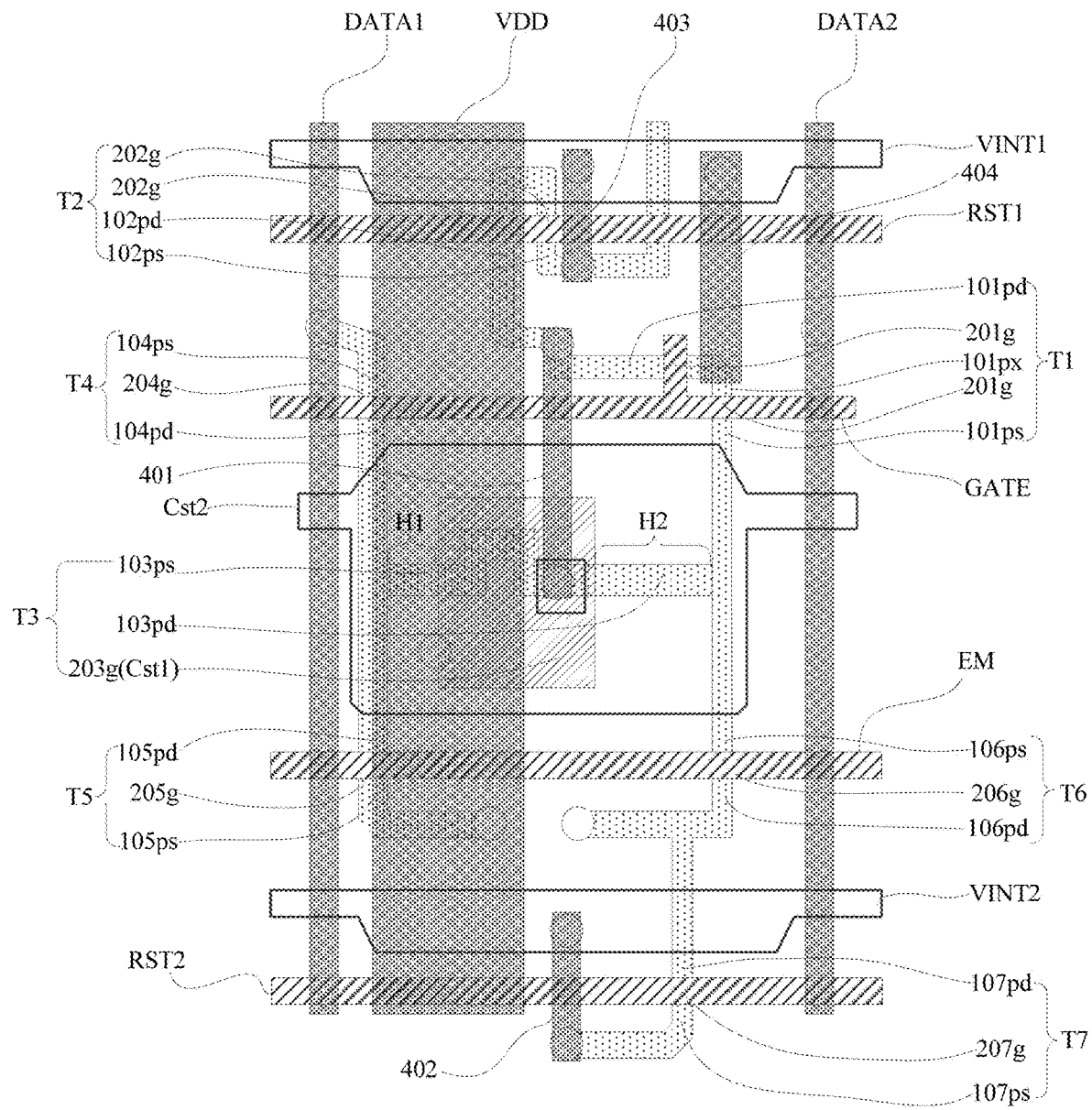
FIG. 19 is a schematic view showing an eighth layout of the subpixel driving circuitry in the display substrate according to an embodiment of the present disclosure.

As shown in FIG. 19, in some embodiments of the present disclosure, the subpixel may further include an initialization signal line pattern (e.g., VINT1). The initialization signal line may include a portion extending in a second direction intersecting the first direction, and is configured to transmit an initialization signal at a fixed potential. The subpixel driving circuitry may further include a first shielding member 404 coupled to the initialization signal line pattern, and an orthogonal projection of the first shielding member 404 onto the base 50 may at least partially overlap the orthogonal projection of the sixth conductor pattern 101px onto the base 50.

In the embodiments of the present disclosure, when the orthogonal projection of the first shielding member 404 onto the base 50 at least partially overlaps the orthogonal projection of the sixth conductor pattern 101px onto the base 50, the sixth conductor pattern 101px may be shielded by the first shielding member 404. In addition, because the first shielding member 404 has a fixed potential, so it is able to reduce an effect of the coupling between the sixth conductor pattern 101px and the other conductive patterns adjacent to the sixth conductor pattern 101px in a better manner, thereby to provide the display substrate with more stable operating performance.

Figure 20:
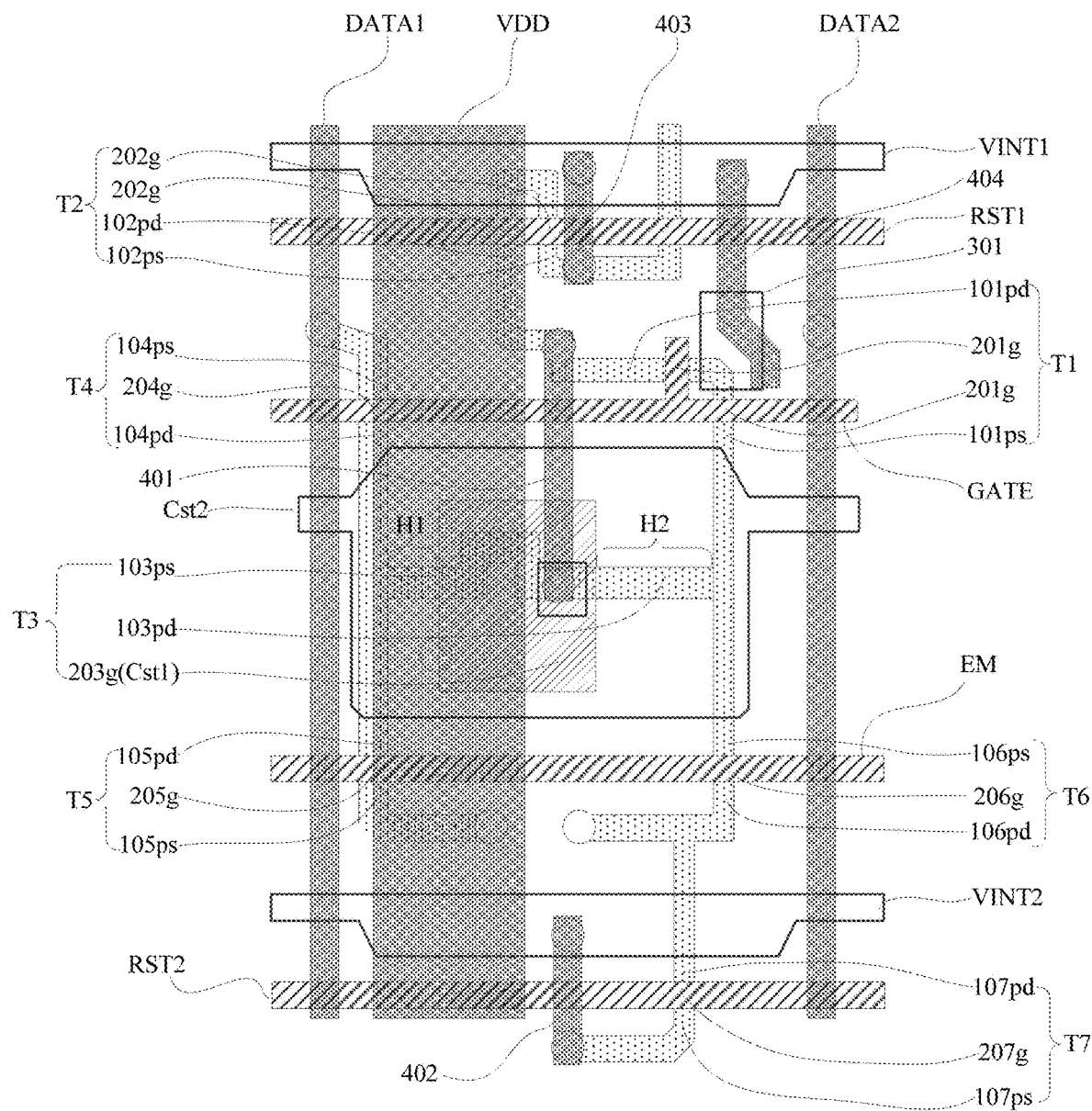
FIG. 20 is a schematic view showing a ninth layout of the subpixel driving circuitry in the display substrate according to an embodiment of the present disclosure.

As shown in FIG. 20, in some embodiments of the present disclosure, the subpixel may further include an initialization signal line pattern (e.g., VINT1). The initialization signal line pattern may include a portion extending in a second direction intersecting the first direction, and the initialization signal line pattern is configured to transmit an initialization signal at a fixed potential.

The subpixel driving circuitry may further include a first shielding member 404 coupled to the initialization signal line pattern, and a second shielding member 301 coupled to the first shielding member 404. An orthogonal projection of the second shielding member 301 onto the base may at least partially overlap the orthogonal projection of the sixth conductor pattern onto the base.

To be specific, when the orthogonal projection of the second shielding member 301 onto the base 50 at least partially overlaps the orthogonal projection of the sixth conductor pattern 101px onto the base 50, the sixth conductor pattern 101px may be shielded by the second shielding member 301. In addition, because the second shielding member 301 is coupled to the first shielding member 404, the second shielding member 301 may have a fixed potential, so it is able to reduce an effect of the coupling between the sixth conductor pattern 101px and the other conductive patterns adjacent to the sixth conductor pattern 101px in a better manner, thereby to provide the display substrate with stable operating performance.

Hence, in the display substrate according to the embodiments of the present disclosure, because the first shielding member 404 and the second shielding member 301 have a fixed potential, so it is able to prevent or reduce a parasitic capacitance generated between the first transistor T1 and the target data line pattern (e.g., DATA2) in a better manner, thereby to prevent or reduce the vertical crosstalk.

Figure 21:
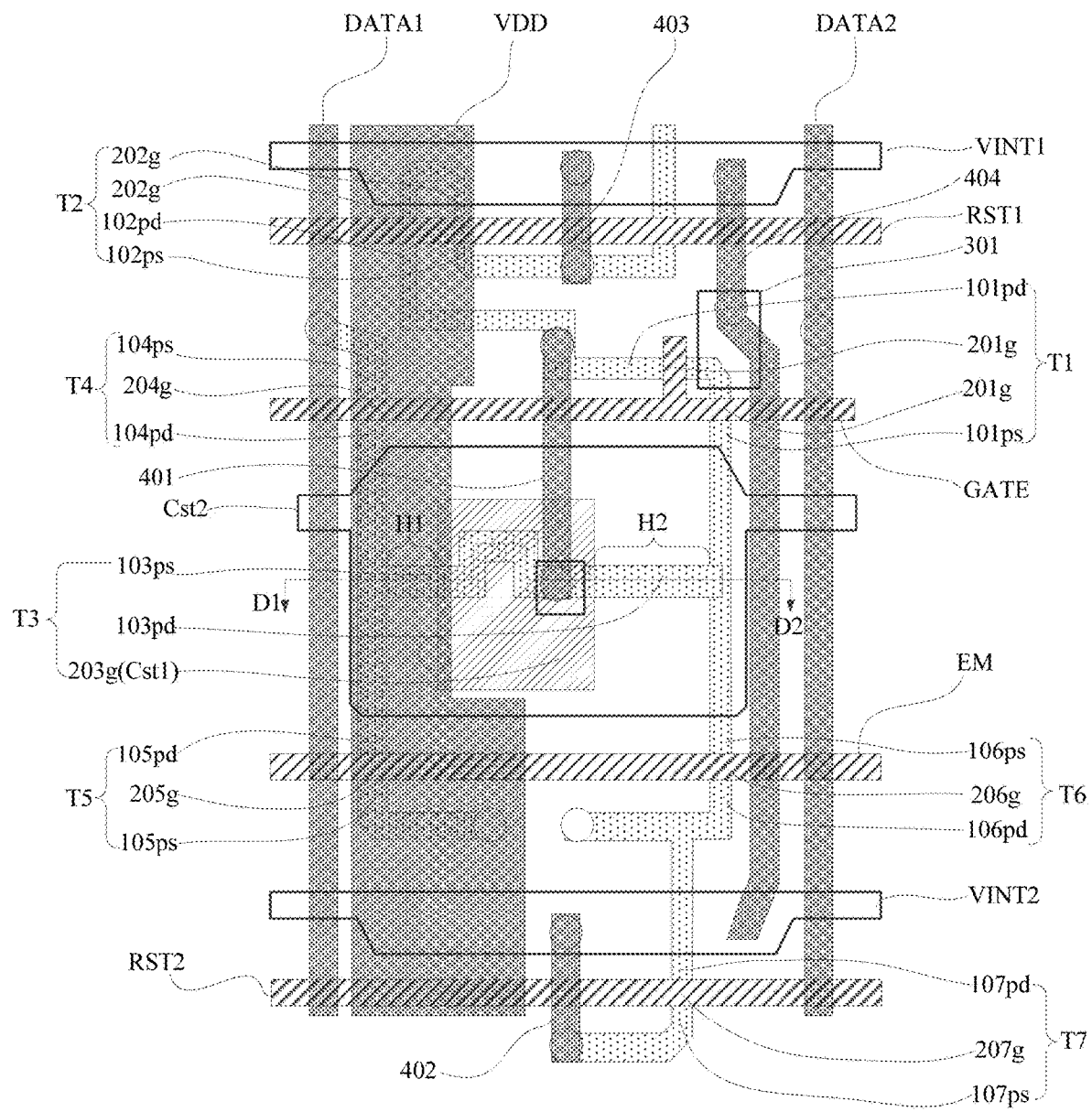
FIG. 21 is a schematic view showing a tenth layout of the subpixel driving circuitry in the display substrate according to an embodiment of the present disclosure.
Figure 22:
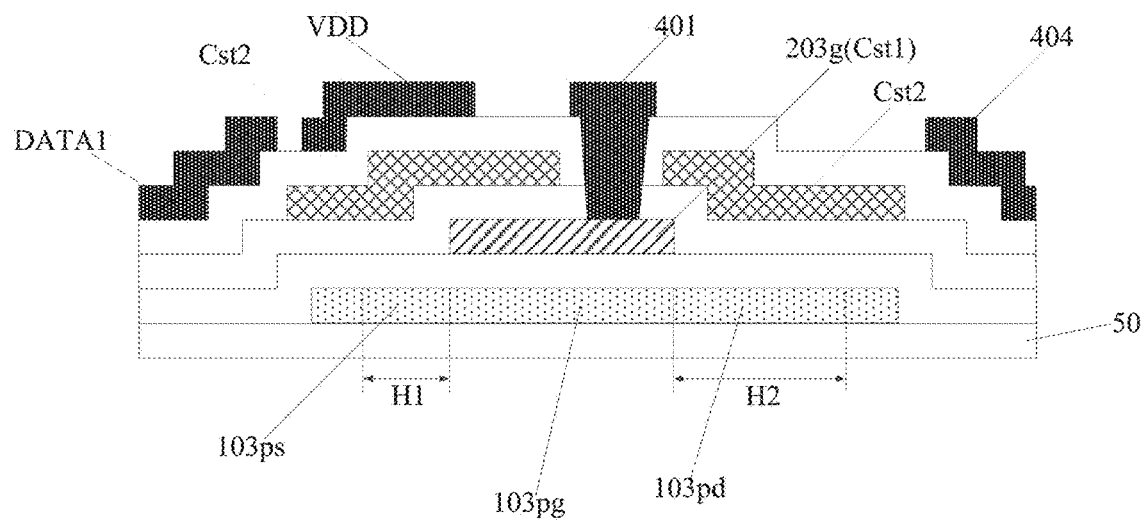
FIG. 22 is a sectional view along a line D1D2 in FIG. 21.

As shown in FIGS. 21 and 22, in some embodiments of the present disclosure, the plurality of subpixels may be arranged in a plurality of rows, and each row of subpixels may include a plurality of subpixels arranged in the second direction. The initialization signal line patterns of the subpixels in a same row may be coupled sequentially to each other to form an initialization signal line corresponding to the subpixels in the row. The first shielding member 404 may extend in the first direction, and may be coupled to two initialization signal lines adjacent to the first shielding member 404.

In some embodiments of the present disclosure, a shape of the power source signal line pattern may be set according to the practical need. For example, in the second direction, a width of a portion of the power source signal line pattern close to the channel region of the driving transistor may be smaller than a width of a portion of the power source signal line pattern distal to the channel region of the driving transistor, so as to reduce the influence of the power source signal line pattern on the gate electrode of the driving transistor at a position in proximity to the channel region of the driving transistor.

Figure 23:
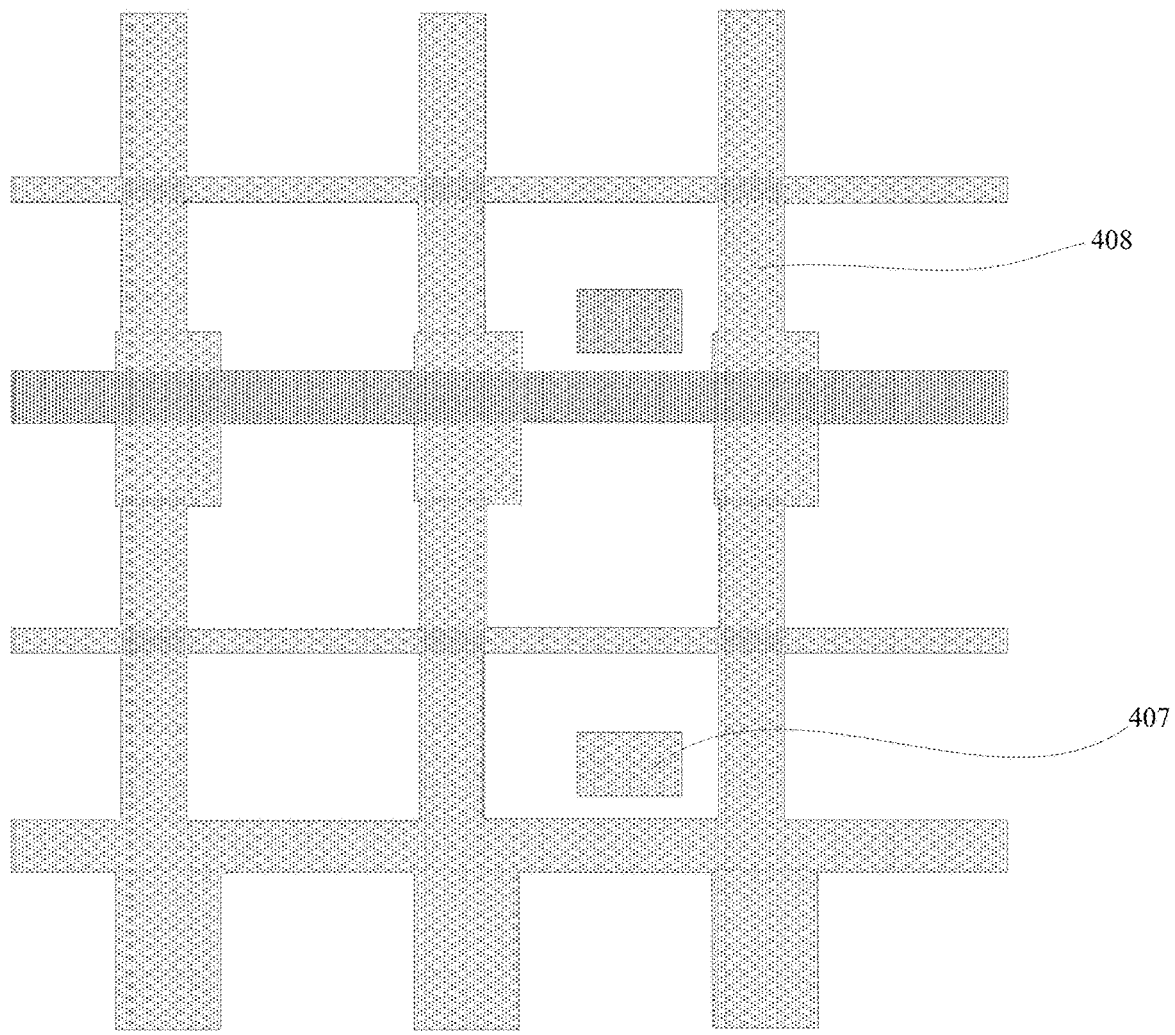
FIG. 23 is a schematic view showing the layout of a third metal layer.

In some embodiments of the present disclosure, as shown in FIG. 23, the display substrate may be provided with a compensation pattern 408 coupled in parallel to the power source signal line pattern, so as to improve the transmission performance of the power source signal line pattern. It should be appreciated that, the compensation pattern 408 may be arranged at a same layer, and made of a same material, as the third conductive connection member, so as to form the compensation pattern 408 and the third conductive connection member through a single patterning process.

In some embodiments of the present disclosure, in one subpixel, the orthogonal projection of the power source signal line pattern VDD onto the base may completely cover the orthogonal projection of the first conductive member 108 onto the base.

In some embodiments of the present disclosure, in one subpixel, the orthogonal projection of the power source signal line pattern VDD onto the base may cover the orthogonal projections of the first semiconductor pattern, the second semiconductor pattern and the third conductor pattern of the second transistor T2 onto the base, and cover at least a part of the orthogonal projection of the first electrode of the second transistor T2 onto the base, and cover at least a part of the orthogonal projection of the second electrode of the second transistor T2 onto the base.

In some embodiments of the present disclosure, the first shielding member 404 may be an extension structure extending from the initialization signal line pattern.

To be specific, when the first shielding member 404 is the extension structure extending from the initialization signal line pattern, it is able to form the first shielding member 404 and the initialization signal line pattern through a single patterning process, thereby to simplify the manufacture process of the display substrate in a better manner.

As shown in FIG. 20, in some embodiments of the present disclosure, the first shielding member 404 and the initialization signal line pattern may be arranged at different layers. The orthogonal projection of the first shielding member 404 onto the base 50 may overlap the orthogonal projection of the initialization signal line pattern onto the base 50 at a first overlapping region, the first shielding member is coupled to the initialization signal line pattern through a first via-hole arranged in the first overlapping region.

The second shielding member 301 and the first shielding member 404 may be arranged at different layers. The orthogonal projection of the second shielding member 301 onto the base 50 may overlap the orthogonal projection of the first shielding member 404 onto the base 50 at a second overlapping region, the second shielding member 301 is coupled to the first shielding member 404 through a second via-hole arranged in the second overlapping region.

To be specific, the first shielding member 404 and the initialization signal line pattern may be arranged at a same layer or at different layers. When the first shielding member 404 is arranged at a layer different from the initialization signal line pattern, the orthogonal projection of the first shielding member 404 onto the base 50 may overlap the orthogonal projection of the initialization signal line pattern onto the base 50 at the first overlapping region. In this way, the first shielding member 404 may be coupled to the initialization signal line through the first via-hole in the first overlapping region. Identically, the second shielding member 301 and the first shielding member 404 may be arranged at a same layer or at different layers. When the second shielding member 301 is arranged at a layer different from the first shielding member 404, the orthogonal projection of the second shielding member 301 onto the base 50 may overlap the orthogonal projection of the first shielding member 404 onto the base 50 at the second overlapping region. In this way, the second shielding member 301 may be coupled to the first shielding member 404 through the second via-hole in the second overlapping region.

In some embodiments of the present disclosure, the first shielding member 404 may be made of a same material as the data line pattern.

In some embodiments of the present disclosure, the display substrate may include a first interlayer insulation layer, and the first shielding member 404 and the data line pattern may be arranged at a surface of the first interlayer insulation layer distal to the base.

To be specific, when the first shielding member 404 is arranged as mentioned hereinabove, it is able to simultaneously form the first shielding member 404 and the data line pattern at the surface of the first interlayer insulation layer distal to the base through a single patterning process, and omit an additional patterning process for forming the first shielding member 404, thereby to simplify the manufacture process of the display substrate in a better manner and reduce the manufacture cost.

In some embodiments of the present disclosure, the second shielding member 301 may be made of a same material as the initialization signal line pattern.

In some embodiments of the present disclosure, the display substrate may further include a second interlayer insulation layer, and the second shielding member 301 and the initialization signal line pattern may be arranged at a surface of the second interlayer insulation layer distal to the base.

To be specific, when the second shielding member 301 and the initialization signal line pattern (e.g., VINT1 in FIG. 3) are made of a same material and arranged at the surface of the second interlayer insulation layer distal to the base, it is able to simultaneously form the second shielding member 301 and the initialization signal line pattern through a single patterning process, and omit an additional patterning process for forming the second shielding member 301, thereby to simplify the manufacture process of the display substrate in a better manner and reduce the manufacture cost.

In some embodiments of the present disclosure, the first electrode plate Cst1 of the storage capacitor Cst may be reused as the gate electrode of the driving transistor, the second electrode plate Cst2 of the storage capacitor Cst may be made of a same material as the second shielding member 301, and the second electrode plate Cst2 of the storage capacitor Cst may be arranged at the surface of the second interlayer insulation layer distal to the base 50.

To be specific, the storage capacitor Cst of the subpixel driving circuitry may include the first electrode plate Cst1 and the second electrode plate Cst2 arranged opposite to each other. The first electrode plate Cst1 may be coupled to the gate electrode of the driving transistor, and the second electrode plate Cst2 may be coupled to the power source signal line pattern VDD. During the arrangement of the storage capacitor Cst, the first electrode plate Cst1 may be directly reused as the gate electrode of the driving transistor. In this way, it is able to not only ensure the storage capacitor Cst to be coupled to the gate electrode of the driving transistor, but also reduce a space occupied by the subpixel driving circuitry, thereby to improve the resolution of the display substrate. In addition, when the second electrode plate Cst2 of the storage capacitor Cst is arranged at the surface of the second interlayer insulation layer distal to the base, the second electrode plate Cst2 of the storage capacitor Cst may be formed simultaneously through a single patterning with the second shielding member 301 and the initialization signal line pattern, so it is able to simplify the manufacture process of the display substrate in a better manner, and reduce the manufacture cost.

In some embodiments of the present disclosure, the subpixel may further include a resetting signal line pattern (e.g., RST1) extending in a second direction intersecting the first direction. The subpixel driving circuitry may further include: a first conductive connection member 405, an orthogonal projection of which onto the base 50 at least partially overlap the orthogonal projection of the sixth conductor pattern 101px onto the base 50; and a second transistor T2, a first electrode (e.g., a source electrode S2) of which is coupled to the initialization signal line pattern (e.g., VINT1) through the first conductive connection member 405, a second electrode (e.g., a drain electrode D2) of which is coupled to the gate electrode of the driving transistor, and a gate electrode 202g of which is coupled to the resetting signal line pattern (e.g. RST1).

To be specific, the first conductive connection member 405 may be made of a metal material, and may be formed through a single patterning process with the data line pattern.

When the orthogonal projection of the first conductive connection member 405 onto the base 50 at least partially overlap the orthogonal projection of the sixth conductor pattern 101px onto the base 50, such that the sixth conductor pattern 101px may be shielded by the first conductive connection member 405. In addition, because the first conductive connection member 405 is coupled to the initialization signal line pattern, such that the first conductive connection member 405 may have a fixed potential, so as to reduce an effect of the coupling between the sixth conductor pattern 101px and the other conductive patterns adjacent to the sixth conductor pattern 101px in a better manner, thereby to provide the display substrate with more stable operating performance.

As shown in FIG. 16, in some embodiments of the present disclosure, the subpixel may further include a gate line pattern GATE, a light-emission control signal line pattern EM, a resetting signal line pattern (e.g., RST1) and an initialization signal line pattern (e.g., VINT1). The gate line pattern GATE, the light-emission control signal line pattern EM, the resetting signal line pattern and the initialization signal line pattern may extend in a second direction intersecting the first direction. The two switching transistors may include a fourth transistor T4 and a fifth transistor T5.

The subpixel driving circuitry may further include a first transistor T1, a second transistor T2, a sixth transistor T6 and a seventh transistor T7. A gate electrode of the driving transistor (e.g., a gate electrode 203g of the third transistor T3) may be coupled to a second electrode of the first transistor T1, a first electrode of the driving transistor may be coupled to a second electrode of the fifth transistor T5, and a second electrode of the driving transistor may be coupled to a first electrode of the first transistor T1. A gate electrode 201g of the first transistor T1 may be coupled to the gate line pattern GATE. A gate electrode 202g of the second transistor T2 may be coupled to the resetting signal line pattern, a first electrode of the second transistor T2 may be coupled to the initialization signal line pattern, and a second electrode of the second transistor T2 may be coupled to the gate electrode of the driving transistor. A gate electrode 204g of the fourth transistor T4 may be coupled to the gate line pattern GATE, a first electrode of the fourth transistor T4 may be coupled to the data line pattern (e.g., DATA1 in the figure), and a second electrode of the fourth transistor T4 may be coupled to the first electrode of the driving transistor. A gate electrode 205g of the fifth transistor T5 may be coupled to the light-emission control signal line pattern EM, and a first electrode of the fifth transistor T5 may be coupled to the power source signal line pattern VDD. A gate electrode 206g of the sixth transistor T6 may be coupled to the light-emission control signal line pattern EM, a first electrode of the sixth transistor T6 may be coupled to the second electrode of the driving transistor, and a second electrode of the sixth transistor T6 may be coupled to the light-emitting element of the subpixel. A gate electrode 207g of the seventh transistor T7 may be coupled to the resetting signal line pattern (e.g., RST2) of a next adjacent subpixel in the first direction, a first electrode of the seventh transistor T7 may be coupled to the initialization signal line pattern (e.g., VINT2) of the next adjacent subpixel, and a second electrode of the seventh transistor T7 may be coupled to the light-emitting element of the subpixel.

To be specific, in the display substrate, the plurality of subpixels may be arranged in an array form, i.e., in rows and columns Each row of subpixels may include a plurality of subpixels arranged in the second direction, and each column of subpixels may include a plurality of subpixels arranged in the first direction interesting the second direction.

It should be appreciated that, the next adjacent subpixel in the first direction may be just a next subpixel adjacent to the seventh transistor T7 in the same column.

When the subpixel and the subpixel driving circuitry thereof have the above-mentioned structures, it is able to effectively reduce the layout space occupied by the subpixel driving circuitry in the case of ensuring the operating performance of the subpixel driving circuitry, and increase the resolution of the display substrate.

The present disclosure further provides in some embodiments a display device including the above-mentioned display substrate.

In the display substrate according to the embodiments of the present disclosure, when the second electrode plate Cst2 of the storage capacitor Cst is coupled to the power source signal line pattern VDD, the second electrode plate Cst2 of the storage capacitor Cst may have a same fixed potential as a power source signal transmitted on the power source signal line pattern VDD. In addition, when the second electrodes of the two switching transistors are coupled to the first electrode of the driving transistor and the orthogonal projection of the second electrode of the at least one of the two switching transistors onto the base 50 at least partially overlaps the orthogonal projection of the power source signal line pattern VDD onto the base 50, and at least partially overlaps the orthogonal projection of the second electrode plate Cst2 of the storage capacitor Cst onto the base 50, such that the second electrode plate Cst2 of the storage capacitor Cst and the power source signal line pattern VDD may shield the second electrode of the at least one of the two switching transistors, so as to reduce the crosstalk for the second electrode of the at least one of the two switching transistors due to a signal on the other conductive pattern (e.g., a signal line pattern) surrounding the at least one of the two switching transistors, thereby to reduce the crosstalk for the first electrode of the driving transistor.

Hence, when the display device includes the above-mentioned display substrate, it may have the same beneficial effect, which will not be repeatedly described herein.

The present disclosure further provides in some embodiments a method for manufacturing a display substrate, which includes forming a plurality of subpixels on a base in an array form. The subpixel includes: a data line pattern extending in a first direction; a power source signal line pattern including a portion extending in the first direction;

and a subpixel driving circuitry. The subpixel driving circuitry includes two switching transistors, a driving transistor, and a storage capacitor. A first electrode of the storage capacitor is coupled to a gate electrode of the driving transistor, and a second electrode plate of the storage capacitor is coupled to the power source signal line pattern. Second electrodes of the two switching transistors are coupled to a first electrode of the driving transistor. An orthogonal projection of the second electrode of at least one of the two switching transistors onto the base at least partially overlaps an orthogonal projection of the power source signal line pattern onto the base and at least partially overlaps an orthogonal projection of the second electrode plate of the storage capacitor onto the base.

In the display substrate manufactured using the above method according to the embodiments of the present disclosure, when the second electrode plate Cst2 of the storage capacitor Cst is coupled to the power source signal line pattern VDD, such that the second electrode plate Cst2 of the storage capacitor Cst may have a same fixed potential as a power source signal transmitted on the power source signal line pattern VDD. In addition, when the second electrodes of the two switching transistors are coupled to the first electrode of the driving transistor and the orthogonal projection of the second electrode of the at least one of the two switching transistors onto the base 50 at least partially overlaps the orthogonal projection of the power source signal line pattern VDD onto the base 50 and at least partially overlaps the orthogonal projection of the second electrode plate Cst2 of the storage capacitor Cst onto the base 50, such that the second electrode plate Cst2 of the storage capacitor Cst and the power source signal line pattern VDD may shield the second electrode of the at least one of the two switching transistors, so as to reduce the crosstalk for the second electrode of the at least one of the two switching transistors due to a signal on the other conductive pattern (e.g., a signal line pattern) surrounding the at least one of the two switching transistors, thereby to reduce the crosstalk for the first electrode of the driving transistor.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "comprise" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, the element may be directly arranged "on" or "under" the other element, or an intermediate element may be arranged therebetween.

In the above description, the features, structures, materials or characteristics may be combined in any one or more embodiments or examples in an appropriate manner.

The above are specific implementations of the present disclosure, but the protection scope of the present disclosure is not limited thereto. Any person skilled in the art may make further modifications and improvements without departing from the principle of the present disclosure, and these modifications and improvements shall also fall within the scope of the present disclosure. The protection scope of the present disclosure is defined by the claims.

The invention claimed is:

1. A display substrate, comprising a base and a plurality of subpixels arranged on the base in an array form, wherein at least one of the subpixels comprises:
a first data line pattern extending in a first direction;
a first shielding member, wherein at least a part of the first shielding member extends in the first direction; and
a driving transistor, a first transistor coupled to a gate electrode of the driving transistor, and a second shielding member coupled to the first shielding member,
wherein the first transistor is of a double-gate structure, the first transistor comprises a fourth semiconductor pattern, a fifth semiconductor pattern and a sixth conductor pattern, the sixth conductor pattern is coupled to the fourth semiconductor pattern and the fifth semiconductor pattern, and a second electrode of the driving transistor is coupled to the fourth semiconductor pattern or the fifth semiconductor pattern;
an orthogonal projection of the second shielding member onto the base at least partially overlaps an orthogonal projection of the sixth conductor pattern onto the base;
at least the part of the first shielding member is located between the second electrode of the driving transistor and a second data line pattern of an adjacent subpixel,
wherein the second shielding member is arranged closer to the base than the first shielding member.

2. The display substrate according to claim 1, wherein an overlapping area between an orthogonal projection of the first shielding member onto the base and an orthogonal projection of the second electrode of the driving transistor onto the base is E1, a portion of the orthogonal projection of the second electrode of the driving transistor onto the base does not overlap the orthogonal projection of the first shielding member onto the base, an area of the portion of the orthogonal projection of the second electrode of the driving transistor onto the base not overlapping the orthogonal projection of the first shielding member onto the base is E2, and E1<E2.

3. The display substrate according to claim 2, wherein a length of a portion of the second electrode of the driving transistor not overlapping the first shielding member in the first direction is L6, a length of the first shielding member in the first direction is L7, and L6≤L7.

4. The display substrate according to claim 1, wherein in a second direction, a minimum straight-line distance between an orthogonal projection of the second electrode of the driving transistor onto the base and an orthogonal projection of the first shielding member onto the base is L1, a minimum straight-line distance between the orthogonal projection of the second electrode of the driving transistor onto the base and an orthogonal projection of the second data line pattern of the adjacent subpixel onto the base is L2, and L1≤L2, wherein a length of a channel of the driving transistor is L3, and L1≤L2≤L3.

5. The display substrate according to claim 1, wherein a minimum straight-line distance between the second electrode of the driving transistor and the second data line pattern of the adjacent subpixel is L4, a minimum straight-line distance between the second electrode of the driving transistor and the first shielding member is L5, and L5<L4.

6. The display substrate according to claim 1, wherein the subpixel further comprises a connection line, the gate electrode of the driving transistor is coupled to a second electrode of the first transistor through the connection line;
the orthogonal projection of the second shielding member onto the base is located between an orthogonal projection of an end of the connection line coupled to the second electrode of the first transistor onto the base and an orthogonal projection of the second data line pattern of the adjacent subpixel onto the base,
wherein in the first direction, a length of the first shielding member is greater than a length of the connection line.

7. The display substrate according to claim 1, wherein a gap is provided between an orthogonal projection of the first shielding member onto the base and the orthogonal projection of the second electrode of the driving transistor onto the base.

8. The display substrate according to claim 1, wherein the subpixel further comprises a fourth transistor, a first electrode of the fourth transistor is coupled to the first data line pattern, and a second electrode of the fourth transistor is coupled to a first electrode of the driving transistor;
the orthogonal projection of the second shielding member onto the base does not overlap an orthogonal projection of a fourth transistor of the adjacent subpixel onto the base.

9. The display substrate according to claim 1, wherein the first shielding member and the second shielding member are configured to receive a first fixed-potential signal.

10. The display substrate according to claim 9, wherein the subpixel further comprises a storage capacitor, the storage capacitor comprises a first electrode plate and a second electrode plate, the first electrode plate is coupled to the gate electrode of the driving transistor, the second electrode plate is configured to receive a second fixed-potential signal;
a gap is provided between an orthogonal projection of the second electrode plate onto the base and an orthogonal projection of the first shielding member onto the base;
the orthogonal projection of the second electrode of the driving transistor onto the base comprises a portion within the gap.

11. The display substrate according to claim 1, wherein the second electrode of the driving transistor is arranged closer to the base than the first shielding member and the second shielding member.

12. The display substrate according to claim 1, wherein an active layer of the first transistor is arranged at a same layer as, and formed integrally with, an active layer of the driving transistor,
a minimum straight-line distance between the first shielding member and the second electrode of the driving transistor is greater than a minimum straight-line distance between the second shielding member and the sixth conductor pattern.

13. The display substrate according to claim 1, wherein the subpixel further comprises:
a resetting signal line pattern and an initialization signal line pattern, wherein each of the resetting signal line pattern and the initialization signal line pattern extends in a second direction intersecting the first direction;
a second transistor, wherein a gate electrode of the second transistor is coupled to the resetting signal line pattern, a first electrode of the second transistor is coupled to the initialization signal line pattern, and a second electrode of the second transistor is coupled to the gate electrode of the driving transistor.

14. The display substrate according to claim 13, wherein an orthogonal projection of a contact portion of the second shielding member in contact with the first shielding member onto the base does not overlap an orthogonal projection of an active layer of the second transistor onto the base;
a distance between the contact portion and the sixth conductor pattern is smaller than a distance between the contact portion and the second electrode of the driving transistor;
a distance between the orthogonal projection of the contact portion onto the base and the orthogonal projection of the sixth conductor pattern onto the base is smaller than a distance between the orthogonal projection of the contact portion onto the base and an orthogonal projection of the first data line pattern onto the base.

15. The display substrate according to claim 13, wherein the subpixel further comprises:
a light-emission control signal line pattern and a power source signal line pattern, wherein the light-emission control signal line pattern extends in the second direction, the power source signal line pattern comprises a portion extending in the first direction;
a fifth transistor, wherein a gate electrode of the fifth transistor is coupled to the light-emission control signal line pattern, a first electrode of the fifth transistor is coupled to the power source signal line pattern, and a second electrode of the fifth transistor is coupled to a first electrode of the driving transistor.

16. The display substrate according to claim 15, wherein the subpixel further comprises a light-emitting element and a sixth transistor, a gate electrode of the sixth transistor is coupled to the light-emission control signal line pattern, a first electrode of the sixth transistor is coupled to the second electrode of the driving transistor, and a second electrode of the sixth transistor is coupled to the light-emitting element.

17. A display device, comprising the display substrate according to claim 1.

18. A display substrate, comprising a base and a plurality of subpixels arranged on the base in an array form, wherein at least one of the subpixels comprises:
a first data line pattern extending in a first direction;
a first shielding member, wherein at least a part of the first shielding member extends in the first direction; and
a driving transistor, a first transistor coupled to a gate electrode of the driving transistor, and a second shielding member coupled to the first shielding member, wherein the first transistor is of a double-gate structure, the first transistor comprises a fourth semiconductor pattern, a fifth semiconductor pattern and a sixth conductor pattern, the sixth conductor pattern is coupled to the fourth semiconductor pattern and the fifth semiconductor pattern, and a second electrode of the driving transistor is coupled to the fourth semiconductor pattern or the fifth semiconductor pattern;
a straight-line distance between a contact portion of the second shielding member in contact with the first shielding member and the sixth conductor pattern is smaller than a straight-line distance between the contact portion and the second electrode of the driving transistor; and a distance between an orthogonal projection of the contact portion of the second shielding member in contact with the first shielding member onto the base and an orthogonal projection of the sixth conductor pattern onto the base is smaller than a distance between the orthogonal projection of the contact portion onto the base and an orthogonal projection of the first data line pattern onto the base, wherein the second shielding member is arranged closer to the base than the first shielding member.

19. The display substrate according to claim 18, wherein an overlapping area between an orthogonal projection of the first shielding member onto the base and an orthogonal projection of the second electrode of the driving transistor onto the base is E1, a portion of the orthogonal projection of the second electrode of the driving transistor onto the base does not overlap the orthogonal projection of the first shielding member onto the base, an area of the portion of the orthogonal projection of the second electrode of the driving transistor onto the base not overlapping the orthogonal projection of the first shielding member onto the base is E2, and E1<E2.

20. The display substrate according to claim 19, wherein a length of a portion of the second electrode of the driving transistor not overlapping the first shielding member in the first direction is L6, a length of the first shielding member in the first direction is L7, and L6≤L7.

21. The display substrate according to claim 18, wherein in a second direction, a minimum straight-line distance between an orthogonal projection of the second electrode of the driving transistor onto the base and an orthogonal projection of the first shielding member onto the base is L1, a minimum straight-line distance between the orthogonal projection of the second electrode of the driving transistor onto the base and an orthogonal projection of a second data line pattern of an adjacent subpixel onto the base is L2, and L1≤L2, wherein a length of a channel of the driving transistor in the second direction is L3, and L1≤L2≤L3.

22. The display substrate according to claim 18, wherein the subpixel further comprises a connection line, the gate electrode of the driving transistor is coupled to a second electrode of the first transistor through the connection line;

an orthogonal projection of the second shielding member onto the base is located between an orthogonal projection of an end of the connection line coupled to the second electrode of the first transistor onto the base and an orthogonal projection of a second data line pattern of an adjacent subpixel onto the base.

23. The display substrate according to claim 22, wherein in the first direction, a length of the first shielding member is greater than a length of the connection line.

24. The display substrate according to claim 18, wherein the second electrode of the driving transistor is arranged closer to the base than the first shielding member and the second shielding member.

25. The display substrate according to claim 18, wherein a minimum straight-line distance between the first shielding member and the second electrode of the driving transistor is greater than a minimum straight-line distance between the second shielding member and the sixth conductor pattern.

26. The display substrate according to claim 18, wherein the subpixel further comprises:

a resetting signal line pattern and an initialization signal line pattern, wherein each of the resetting signal line pattern and the initialization signal line pattern extends in a second direction intersecting the first direction;

a second transistor, wherein a gate electrode of the second transistor is coupled to the resetting signal line pattern, a first electrode of the second transistor is coupled to the initialization signal line pattern, and a second electrode of the second transistor is coupled to the gate electrode of the driving transistor.

27. The display substrate according to claim 26, wherein the orthogonal projection of the contact portion of the second shielding member in contact with the first shielding member onto the base does not overlap an orthogonal projection of an active layer of the second transistor onto the base;

a minimum straight-line distance between a portion of the first shielding member and the second shielding member is smaller than a minimum straight-line distance between a second data line pattern of an adjacent subpixel and the second shielding member, the portion of the first shielding member extends in the first direction.

* * * * *